(12) United States Patent
Yamazaki et al.

(10) Patent No.: US 12,610,553 B2
(45) Date of Patent: Apr. 21, 2026

(54) SEMICONDUCTOR DEVICE AND ELECTRONIC DEVICE

(71) Applicant: SEMICONDUCTOR ENERGY LABORATORY CO., LTD., Atsugi (JP)

(72) Inventors: Shunpei Yamazaki, Tokyo (JP); Hajime Kimura, Atsugi (JP); Takayuki Ikeda, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 426 days.

(21) Appl. No.: 18/031,421

(22) PCT Filed: Oct. 7, 2021

(86) PCT No.: PCT/IB2021/059187
§ 371 (c)(1),
(2) Date: Apr. 12, 2023

(87) PCT Pub. No.: WO2022/084782
PCT Pub. Date: Apr. 28, 2022

(65) Prior Publication Data
US 2023/0380175 A1 Nov. 23, 2023

(30) Foreign Application Priority Data

Oct. 20, 2020 (JP) ................................. 2020-176236
Mar. 5, 2021 (JP) ................................. 2021-034923

(51) Int. Cl.
*H10B 51/30* (2023.01)
*G11C 11/22* (2006.01)
*H10B 53/30* (2023.01)

(52) U.S. Cl.
CPC .............. *H10B 51/30* (2023.02); *G11C 11/22* (2013.01); *H10B 53/30* (2023.02)

(58) Field of Classification Search
CPC .......... H10B 51/30; H10B 53/30; G11C 11/22
See application file for complete search history.

(56) References Cited

U.S. PATENT DOCUMENTS 6,654,273 B2 11/2003 Miwa et al.
6,731,530 B2 5/2004 Miwa et al.
(Continued)

FOREIGN PATENT DOCUMENTS

JP 10-335489 A 12/1998
JP 2002-109875 A 4/2002
(Continued)

OTHER PUBLICATIONS

International Search Report (Application No. PCT/IB2021/059187) Dated Jan. 11, 2022.
(Continued)

*Primary Examiner* — Richard A Booth
(74) *Attorney, Agent, or Firm* — NIXON PEABODY LLP; Jeffrey L. Costellia

(57) ABSTRACT

A semiconductor device that has lower power consumption and is capable of non-destructive reading is provided. The semiconductor device includes first to fourth transistors and first and second FTJ elements. The first FTJ element and the second FTJ element each include an input terminal, a tunnel insulating film, a dielectric, and an output terminal. One of a source and a drain of the first transistor is electrically connected to one of a source and a drain of the third transistor, a gate of the fourth transistor, and the output terminal of the first FTJ element. One of a source and a drain of the second transistor is electrically connected to one of a source and a drain of the fourth transistor, a gate of the third (Continued)

transistor, and the output terminal of the second FTJ element.

2 Claims, 31 Drawing Sheets

(56) References Cited

U.S. PATENT DOCUMENTS

| | | | | |
|---|---|---|---|---|
| 7,839,697 | B2 | 11/2010 | Ishikura et al. | |
| 7,842,989 | B2 | 11/2010 | Kato | |
| 7,948,787 | B2 | 5/2011 | Ishikura et al. | |
| 8,077,530 | B2 | 12/2011 | Ishikura et al. | |
| 9,001,549 | B2 | 4/2015 | Onuki | |
| 9,779,797 | B2 | 10/2017 | Ino et al. | |
| 10,818,355 | B2 | 10/2020 | Fuchikami et al. | |
| 11,289,145 | B2* | 3/2022 | Ocker | H10D 1/682 |
| 2002/0159287 | A1 | 10/2002 | Miwa et al. | |
| 2003/0179634 | A1 | 9/2003 | Miwa et al. | |
| 2009/0173978 | A1 | 7/2009 | Kato | |
| 2013/0301332 | A1 | 11/2013 | Onuki | |
| 2016/0365133 | A1 | 12/2016 | Ino et al. | |
| 2019/0341109 | A1 | 11/2019 | Fuchikami et al. | |
| 2021/0091098 | A1 | 3/2021 | Tsukamoto | |
| 2022/0208259 | A1* | 6/2022 | Gong | H10B 53/30 |
| 2023/0215481 | A1* | 7/2023 | Ocker | G11C 11/223 |
| | | | | 365/203 |

| | | | |
|---|---|---|---|
| 2023/0326503 | A1 | 10/2023 | Yamazaki et al. |
| 2023/0335173 | A1 | 10/2023 | Yamazaki et al. |
| 2023/0397427 | A1 | 12/2023 | Yamazaki et al. |

FOREIGN PATENT DOCUMENTS

| | | |
|---|---|---|
| JP | 2003-178577 A | 6/2003 |
| JP | 2008-176910 A | 7/2008 |
| JP | 2009-164473 A | 7/2009 |
| JP | 2019-194931 A | 11/2019 |
| JP | 2019-201034 A | 11/2019 |
| WO | WO-2015/141625 | 9/2015 |
| WO | WO-2019/220796 | 11/2019 |

OTHER PUBLICATIONS

Written Opinion (Application No. PCT/IB2021/059187) Dated Jan. 11, 2022.

Kobayashi.M et al., "Ferroelectric HfO2 Tunnel Junction Memory With High TER and Multi-Level Operation Featuring Metal Replacement Process", IEEE Journal of the Electron Devices Society, Dec. 11, 2018, vol. 7, pp. 134-139.

Miwa.T et al., "A 512 Kbit low-voltage NV-SRAM with the size of a conventional SRAM", 2001 Symposium on VLSI Circuits Digest of Technical Papers, 2001, pp. 129-132.

* cited by examiner

560b } 560
560a
552

571a 541a 540a  554  550  540b 541b 571b
—581
—574
—576
—580
—544
—524
—522
—516
—514
—512

542a  503b 503a  530a 530b  542b
503    530

581
574
576
580
524
544
522
516
514
512

560
530
554
550
552
503

326
324
322
320

330
328

316  315 313  300

FIG. 27A
Intermediate state
New crystalline phase
| Amorphous | Crystalline | Crystal |
|---|---|---|
| •completely amorphous | •CAAC •nc •CAC excluding single crystal and poly crystal | •single crystal •poly crystal |
FIG. 27B
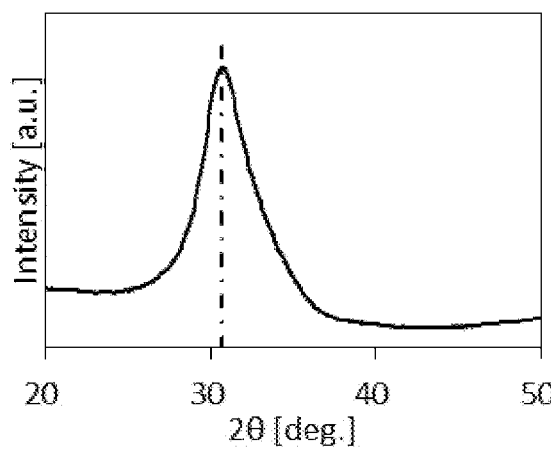
FIG. 27C
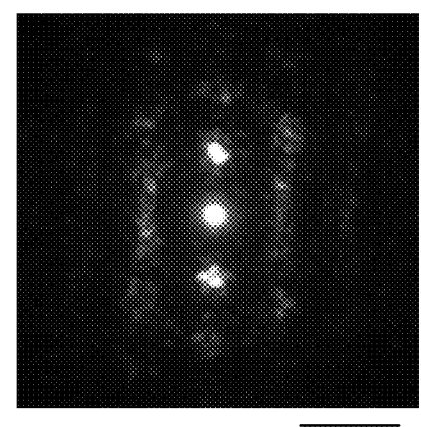
5nm⁻¹

SCL2

4800

SCL1

4802

4803

4801

4800a

4803a 4801a          4802

4700

4711

4800a

4802

4801a

4712

4714          4713

4704          4700          4702

4730

4710

4731

4710

4735

4710          4732

4710

4733

SEMICONDUCTOR DEVICE AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, semiconductor devices have been developed, and CPUs (Central Processing Units), memories, and the like are mainly used as LSI (Large Scale Integration) in the semiconductor devices. A CPU is an assembly of semiconductor elements each including a chip of a semiconductor integrated circuit (including at least a transistor and a memory) processed from a semiconductor wafer and an electrode serving as a connection terminal.

Furthermore, development of semiconductor devices has progressed in which the above-described semiconductor integrated circuit is provided with a ferroelectric capacitor, an FTJ (Ferroelectric Tunnel Junction or Ferroelectric Transportation Junction) element, an FeFET (Ferroelectric FET), or the like using a dielectric having ferroelectricity. For example, Patent Document 1 discloses a semiconductor memory cell including a transistor in which a ferroelectric film is provided as a gate insulating film on the back gate side. For another example, Patent Document 2 discloses a memory having a structure in which a ferroelectric capacitor is electrically connected to a gate of a transistor.

REFERENCES

Patent Documents

[Patent Document 1] Japanese Published Patent Application No. 2009-164473
[Patent Document 2] Japanese Published Patent Application No. 2003-178577

SUMMARY OF THE INVENTION

Problems to be Solved by the Invention

In recent years, the amount of data handled in electronic devices and the like tends to increase; thus, an attempt is made to scale down memory devices, especially memory cells, to increase memory capacity. In the case of reducing the capacitor size to scale down memory cells, it becomes difficult to retain data for a long time because of a lower electrostatic capacitance value. In addition, the number of times of refresh operations for retaining data increases, which may also increase power consumption. Accordingly, memory devices preferably include memory cells that can retain data for a long time.

Particularly in the case where memory devices have a DRAM (Dynamic Random Access Memory) structure, retained data are destroyed when read from memory cells (destructive reading is performed); thus, data rewriting is necessary. Hence, a DRAM sometimes requires a circuit for writing back data after reading. In addition, data rewriting sometimes increases power consumption.

An object of one embodiment of the present invention is to provide a semiconductor device that requires no data rewriting (a semiconductor device that performs non-destructive reading). Another object of one embodiment of the present invention is to provide a semiconductor device with reduced power consumption. Another object of one embodiment of the present invention is to provide a semiconductor device with reduced circuit area. Another object of one embodiment of the present invention is to provide a novel semiconductor device. Another object of one embodiment of the present invention is to provide an electronic device including any of the semiconductor devices.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)

One embodiment of the present invention is a semiconductor device including a first transistor, a second transistor, a third transistor, a fourth transistor, a first FTJ element, and a second FTJ element. The first FTJ element and the second FTJ element each preferably include an input terminal, a tunnel insulating film, a dielectric, and an output terminal. It is preferable that one of a source and a drain of the first transistor be electrically connected to one of a source and a drain of the third transistor, a gate of the fourth transistor, and the output terminal of the first FTJ element, and one of a source and a drain of the second transistor be electrically connected to one of a source and a drain of the fourth transistor, a gate of the third transistor, and the output terminal of the second FTJ element.

(2)

Another embodiment of the present invention may be a structure of the above (1), in which a gate of the first transistor is electrically connected to a gate of the second transistor.

(3)

Another embodiment of the present invention may be a structure of the above (1) or (2), in which the input terminal of the first FTJ element is connected to the input terminal of the second FTJ element.

(4)

Another embodiment of the present invention may be a structure of any one of the above (1) to (3), in which the tunnel insulating film contains silicon oxide or silicon nitride, and the dielectric contains an oxide containing one or both of hafnium and zirconium.

(5)

Another embodiment of the present invention is a semiconductor device including a first transistor, a second transistor, a third transistor, a fourth transistor, a first ferroelectric capacitor, and a second ferroelectric capacitor. It is preferable that one of a source and a drain of the first transistor be electrically connected to one of a source and a drain of the third transistor, a gate of the fourth transistor, and a first terminal of the first ferroelectric capacitor, and one of a source and a drain of the second transistor be electrically connected to one of a source and a drain of the fourth transistor, a gate of the third transistor, and a first terminal of the second ferroelectric capacitor.

(6)

Another embodiment of the present invention may be a structure of the above (5), in which a gate of the first transistor is electrically connected to a gate of the second transistor.

(7)

Another embodiment of the present invention may be a structure of the above (5) or (6), in which a second terminal of the first ferroelectric capacitor is connected to a second terminal of the second ferroelectric capacitor.

(8)

Another embodiment of the present invention may be a structure of any one of the above (5) to (7), in which the first ferroelectric capacitor and the second ferroelectric capacitor each include a dielectric, and the dielectric contains an oxide containing one or both of hafnium and zirconium.

(9)

Another embodiment of the present invention is an electronic device including the semiconductor device according to any one of the above (1) to (8) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip in a package are examples of the semiconductor device. Moreover, a memory device, a display device, a light-emitting device, a lighting device, and an electronic device themselves are semiconductor devices or include semiconductor devices in some cases.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, and a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, or a NOR circuit); a signal converter circuit (a digital-to-analog converter circuit, an analog-to-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, and a source (or a first terminal or the like) and a drain (or a second terminal or the like) of a transistor are electrically connected to each other, and X, the source (or the first terminal or the like) of the transistor, the drain (or the second terminal or the like) of the transistor, and Y are electrically connected in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both of the components that are a wiring and an electrode. Thus, electrical connection in this specification includes, in its category, such a case where one conductive film has functions of a plurality of components.

In this specification and the like, a "resistor" can be, for example, a circuit element having a resistance value higher than 0Ω or a wiring having a resistance value higher than 0Ω. Therefore, in this specification and the like, a "resistor" sometimes includes a wiring having a resistance value, a transistor in which current flows between its source and drain, a diode, and a coil. Thus, the term "resistor" can be sometimes replaced with the terms "resistance", "load", "region having a resistance value", and the like; conversely, the terms "resistance", "load", and "region having a resistance value" can be sometimes replaced with the term "resistor" and the like. The resistance value can be, for example, preferably higher than or equal to 1 mΩ and lower than or equal to 10Ω, further preferably higher than or equal to 5 mΩ and lower than or equal to 5Ω, still further preferably higher than or equal to 10 mΩ and lower than or equal to 1Ω. As another example, the resistance value may be higher than or equal to 1Ω and lower than or equal to $1 \times 10^9 \Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Thus, the terms "capacitor", "parasitic capacitance", "gate capacitance", and the like can be replaced with the term "capacitance" or the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Thus, the terms "source" and "drain" can be sometimes replaced with each other in this specification and the like. In this specification and the like, expressions "one of a source and a drain" (or a first electrode or a first terminal) and "the other of the source and the drain" (or a second electrode or a second terminal) are used in description of the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Thus, with the multi-gate structure, the amount of off-state current can be reduced, the withstand voltage of the transistor can be increased, and the reliability can be improved. Alternatively, with the multi-gate structure, drain-source current does not change very much even if drain-source voltage changes at the time of operation in a saturation region, so that a flat slope of voltage-current characteristics can be obtained. By utilizing the flat slope of the voltage-current characteristics, an ideal current source circuit or an active load having an extremely high resistance value can be obtained. Accordingly, a differential circuit, a current mirror circuit, and the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit structure and the device structure. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the terms do not limit the number of components. In addition, the terms do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction in which the components are described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the term "over" or "under" does not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a "wiring" in some cases, and vice versa. Furthermore, the term "electrode" or "wiring" can also mean, for example, the case where a plurality of "electrodes" and "wirings" are formed in an integrated manner. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration of lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, in the case where the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited or a state where current can be made to flow between the source electrode and the drain electrode. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

According to one embodiment of the present invention, a semiconductor device that requires no data rewriting (a semiconductor device that performs non-destructive reading) can be provided. According to another embodiment of the present invention, a semiconductor device with reduced power consumption can be provided. According to another embodiment of the present invention, a semiconductor device with reduced circuit area can be provided. According to another embodiment of the present invention, a novel semiconductor device can be provided. According to another embodiment of the present invention, an electronic device including any of the semiconductor devices can be provided.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted as appropriate from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 27A is a diagram showing classification of crystal structures of IGZO, FIG. 27B is a diagram showing an XRD spectrum of crystalline IGZO, and FIG. 27C is a diagram showing a nanobeam electron diffraction pattern of crystalline IGZO.

MODE FOR CARRYING OUT THE INVENTION

Figures 1A, 1B:
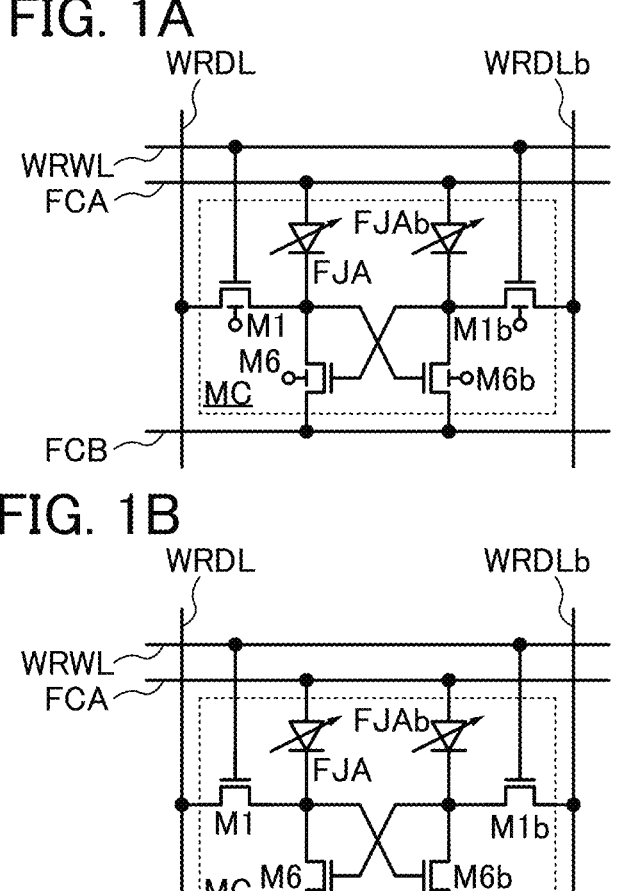
FIG. 1A and FIG. 1B are circuit diagrams illustrating structure examples of a memory cell of a semiconductor device.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be called a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be interpreted as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, they are not limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a semiconductor device of one embodiment of the present invention will be described.

Structure Example 1

FIG. 1A illustrates a circuit structure example of a memory cell MC included in a memory device, which is a semiconductor device of one embodiment of the present invention.

The memory cell MC includes a transistor M1, a transistor M1$b$, a transistor M6, a transistor M6$b$, an FTJ element FJA, and an FTJ element FJAb.

The FTJ element FJA and the FTJ element FJAb are tunnel junction elements each including a pair of electrodes, a material that can have ferroelectricity, and an insulator functioning as a tunnel insulating film. The FTJ elements each have a function of changing its resistance value in accordance with the direction, intensity, or the like of polarization in the material that can have ferroelectricity.

The insulator is provided to overlap with the material that can have ferroelectricity, and the insulator and the material that can have ferroelectricity are provided between the pair of electrodes. The insulator functioning as a tunnel insulating film is provided to overlap with the material that can have ferroelectricity; thus, the FTJ elements have rectifying properties. When the FTJ elements each have a structure in which one of the pair of electrodes, the insulator functioning as a tunnel insulating film, the material that can have ferroelectricity, and the other of the pair of electrodes are stacked in this order, for example, a forward direction of current flowing through the FTJ element is from the one of the pair of electrodes to the other of the pair of electrodes. Note that in this specification, the one of the pair of electrodes is referred to as an input terminal and the other of the pair of electrodes is referred to as an output terminal.

The FTJ element described in this specification and the like can be formed by, for example, stacking a first conductor, a tunnel insulating film, a material that can have ferroelectricity, and a second conductor in this order over a flat insulating film or conductive film. Note that the first conductor can be rephrased as a lower electrode, and the second conductor can be rephrased as an upper electrode. In that case, the first conductor and the second conductor correspond to the above-described pair of electrodes; the first conductor (lower electrode) functions as an input terminal and the second conductor (upper electrode) functions as an output terminal, for example. For another example, the FTJ element described in this specification and the like may be formed by stacking the first conductor (lower electrode), the material that can have ferroelectricity, the tunnel insulating film, and the second conductor (upper electrode) in this order over the flat insulating film or conductive film. In that case, the first conductor (lower electrode) functions as an output terminal and the second conductor (upper electrode) functions as an input terminal, for example.

As the tunnel insulating film, for example, silicon oxide, silicon nitride, a stack of silicon oxide and silicon nitride, or the like can be used.

As described above, the resistance value of the FTJ element changes in accordance with the direction or intensity of polarization in the material that can have ferroelectricity. For example, when the direction of polarization in the material that can have ferroelectricity between the input terminal and the output terminal of the FTJ element is from the output terminal to the input terminal (the direction of the polarization vector in this case is negative), the amount of current flowing from the input terminal to the output terminal of the FTJ element increases. Meanwhile, when the direction of polarization in the material that can have ferroelectricity between the input terminal and the output terminal of the FTJ element is from the input terminal to the output terminal (the direction of the polarization vector in this case is positive), the amount of current flowing from the input terminal to the output terminal of the FTJ element decreases. That is, in the case where the direction of polarization in the FTJ element is from the input terminal to the output terminal, the resistance value with respect to the current flowing from the input terminal to the output terminal of the FTJ element increases. Meanwhile, in the case where the direction of polarization in the FTJ element is from the output terminal to the input terminal, the resistance value with respect to the current flowing from the input terminal to the output terminal of the FTJ element decreases.

Note that as a method for causing polarization (changing the direction of polarization) in the material that can have ferroelectricity in the FTJ element, for example, application of a high voltage between the input terminal and the output terminal of the FTJ element can be employed. For example, when a high-level potential is supplied to the input terminal side of the FTJ element and a low-level potential is supplied to the output terminal side, polarization in the material that can have ferroelectricity in the FTJ element is in the direction from the input terminal to the output terminal (the positive direction), whereas when a low-level potential is supplied to the input terminal side of the FTJ element and a high-level potential is supplied to the output terminal side, polarization is in the direction from the output terminal to the input terminal (the negative direction). Note that the FTJ element has hysteresis characteristics in the polarization intensity; thus, causing polarization (changing the direction of polarization) requires application of voltage corresponding to the structure of the FTJ element, and voltage lower than such voltage does not cause polarization (change the direction of polarization) in the FTJ element.

Note that in drawings of this specification, the FTJ element is shown as an object in which an arrow is added to a circuit symbol of a diode. In addition, in drawings of this specification, a side of a triangle that corresponds to an anode of the circuit symbol of the diode connected to a wiring represents the input terminal of the FTJ element, and a vertex of the triangle and a line that correspond to a cathode of the circuit symbol of the diode connected to the wiring represent the output terminal of the FTJ element.

As the material that can have ferroelectricity, for example, hafnium oxide is preferably used. In the case where hafnium oxide is used as the material that can have ferroelectricity in the FTJ element, the thickness of the hafnium oxide (or the distance between the pair of electrodes of the FTJ element)

is preferably less than or equal to 10 nm, further preferably less than or equal to nm, still further preferably less than or equal to 2 nm.

Examples of the material that can have ferroelectricity include, besides hafnium oxide, metal oxides such as zirconium oxide and zirconium hafnium oxide (sometimes referred to as $HfZrO_X$ (X is a real number greater than 0) or HZO). Other examples of the material that can have ferroelectricity include a material in which an element J1 (the element J1 here is one or more selected from zirconium (Zr), silicon (Si), aluminum (Al), gadolinium (Gd), yttrium (Y), lanthanum (La), strontium (Sr), and the like) is added to hafnium oxide. Here, the atomic ratio of hafnium to the element J1 can be set as appropriate; the atomic ratio of hafnium to the element J1 is, for example, 1:1 or a composition in the neighborhood thereof. Note that a composition in the neighborhood includes the range of ±30% of an intended atomic ratio. Other examples of the material that can have ferroelectricity include a material in which an element J2 (the element J2 here is one or more selected from hafnium (Hf), silicon (Si), aluminum (Al), gadolinium (Gd), yttrium (Y), lanthanum (La), strontium (Sr), and the like) is added to zirconium oxide. The atomic ratio of zirconium to the element J2 can be set as appropriate; the atomic ratio of zirconium to the element J2 is, for example, 1:1 or the neighborhood thereof. As the material that can have ferroelectricity, a piezoelectric ceramic having a perovskite structure, such as lead titanate ($PbTiO_X$), barium strontium titanate (BST), strontium titanate, lead zirconate titanate (PZT), strontium bismuth tantalate (SBT), bismuth ferrite (BFO), or barium titanate, may be used.

Examples of the material that can have ferroelectricity also include scandium aluminum nitride ($Al_{1-a}Sc_aN_b$ (a is a real number greater than 0 and less than 0.5, and b is 1 or an approximate value thereof)), an Al—Ga—Sc nitride, and a Ga—Sc nitride. Examples of the material that can have ferroelectricity also include a metal nitride containing an element M1, an element M2, and nitrogen. Here, the element M1 is one or more selected from aluminum (Al), gallium (Ga), indium (In), and the like. The element M2 is one or more selected from boron (B), scandium (Sc), yttrium (Y), lanthanum (La), cerium (Ce), neodymium (Nd), europium (Eu), titanium (Ti), zirconium (Zr), hafnium (Hf), vanadium (V), niobium (Nb), tantalum (Ta), chromium (Cr), and the like. Note that the atomic ratio of the element M1 to the element M2 can be set as appropriate. A metal oxide containing the element M1 and nitrogen has ferroelectricity in some cases even though the metal oxide does not contain the element M2. Examples of the material that can have ferroelectricity also include a material in which an element M3 is added to the above metal nitride. Note that the element M3 is one or more selected from magnesium (Mg), calcium (Ca), strontium (Sr), zinc (Zn), cadmium (Cd), and the like. Here, the atomic ratio of the element M1 to the element M2 and the element M3 can be set as appropriate. Since the above metal nitride contains at least a Group 13 element and nitrogen, which is a Group 15 element, the metal nitride is referred to as a ferroelectric of Group III-V, a ferroelectric of a Group III nitride, or the like in some cases.

Examples of the material that can have ferroelectricity also include a perovskite-type oxynitride such as $SrTaO_2N$ or $BaTaO_2N$ and $GaFeO_3$ with a κ-alumina-type structure.

The material that can have ferroelectricity can be, for example, a mixture or a compound formed of a plurality of materials selected from the above-listed materials. Alternatively, the material that can have ferroelectricity can have a stacked-layer structure of a plurality of materials selected from the above-listed materials. Since the above-listed materials and the like may change their crystal structures and electrical characteristics according to a variety of processes and the like as well as deposition conditions, the above-described material is referred to not only as a ferroelectric but also as a material that can have ferroelectricity in this specification and the like. Furthermore, the ferroelectric includes not only a material that exhibits ferroelectricity but also a material that can have ferroelectricity.

A material containing hafnium oxide or a material containing hafnium oxide and zirconium oxide is especially preferable as the material that can have ferroelectricity because of being able to have ferroelectricity even when processed into a several-nanometer-thick thin film. Here, the thickness of the material that can have ferroelectricity can be less than or equal to 100 nm, preferably less than or equal to 50 nm, further preferably less than or equal to 20 nm, still further preferably less than or equal to 10 nm (typically, greater than or equal to 2 nm and less than or equal to 9 nm). For example, the thickness is preferably greater than or equal to 8 nm and less than or equal to 12 nm. When thinned, a ferroelectric layer can be interposed between a pair of electrodes of a capacitor, and the capacitor can be combined with a semiconductor element such as a scaled-down transistor to form a semiconductor device. Note that in this specification and the like, the material that can have ferroelectricity processed into a layered shape is referred to as a ferroelectric layer, a metal oxide film, or a metal nitride film in some cases. Furthermore, a device including such a ferroelectric layer, metal oxide film, or metal nitride film is referred to as a ferroelectric device in this specification and the like, in some cases.

In the case where $HfZrO_X$ is used as the material that can have ferroelectricity, an atomic layer deposition (ALD) method, particularly a thermal ALD method, is preferably used for deposition. In the case where the material that can have ferroelectricity is deposited by a thermal ALD method, it is preferable to use a material that does not contain hydrocarbon (also referred to as HC) as a precursor. One or both of hydrogen and carbon contained in the material that can have ferroelectricity may hinder crystallization of the material that can have ferroelectricity. For this reason, it is preferable to lower the concentration of one or both of hydrogen and carbon in the material that can have ferroelectricity by using the precursor that does not contain hydrocarbon, as described above. An example of the precursor that does not contain hydrocarbon includes a chlorine-based material. Note that in the case where a material containing hafnium oxide and zirconium oxide ($HfZrO_X$) is used as the material that can have ferroelectricity, $HfCl_4$ and/or $ZrCl_4$ can be used as the precursor.

Note that in the case where a film using the material that can have ferroelectricity is deposited, an impurity in the film, which is at least one or more of hydrogen, hydrocarbon, and carbon here, is thoroughly removed, so that a highly purified intrinsic film having ferroelectricity can be formed. Note that manufacturing processes of the highly purified intrinsic film having ferroelectricity and a highly purified intrinsic oxide semiconductor described in the following embodiment are highly compatible with each other. Accordingly, a method for fabricating a semiconductor device with high productivity can be provided.

In the case where $HfZrO_X$ is used as the material that can have ferroelectricity, it is preferable to deposit hafnium oxide and zirconium oxide alternately by a thermal ALD method such that the ratio of hafnium oxide to zirconium oxide is 1:1.

In the case where the material that can have ferroelectricity is deposited by a thermal ALD method, $H_2O$ or $O_3$ can be used as an oxidizer. Note that the oxidizer used in the thermal ALD method is not limited thereto. For example, as the oxidizer used in the thermal ALD method, any one or more selected from $O_2$, $O_3$, $N_2O$, $NO_2$, $H_2O$, and $H_2O_2$ may be contained.

The crystal structure of the material that can have ferroelectricity is not particularly limited. For example, the crystal structure of the material that can have ferroelectricity is any one crystal structure selected from a cubic crystal structure, a tetragonal crystal structure, an orthorhombic crystal structure, and a monoclinic crystal structure or a composite structure including two or more of these crystal structures. It is particularly preferable that the material that can have ferroelectricity have an orthorhombic crystal structure, in which case ferroelectricity is exhibited. Alternatively, the material that can have ferroelectricity may have a composite structure of an amorphous structure and a crystal structure.

As each of the transistor M1, the transistor M1b, the transistor M6, and the transistor M6b, an OS transistor can be used, for example. As a metal oxide included in a channel formation region of the OS transistor, an oxide containing at least one of indium, gallium, and zinc is further preferably included, for example. Alternatively, the metal oxide may be an oxide containing at least one of indium, an element M (as the element M, for example, one or more kinds selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc, for example. The transistor M1, the transistor M1b, the transistor M6, and the transistor M6b each preferably have a structure of a transistor described in Embodiment 5.

Other than the OS transistor, a transistor containing silicon in a channel formation region (hereinafter, referred to as a Si transistor) may be used as each of the transistor M1, the transistor M1b, the transistor M6, and the transistor M6b. The silicon may be amorphous silicon (sometimes referred to as hydrogenated amorphous silicon), microcrystalline silicon, polycrystalline silicon, single crystal silicon, or the like, for example.

Other than the OS transistor and the Si transistor, a transistor containing Ge or the like in a channel formation region, a transistor containing a compound semiconductor such as ZnSe, CdS, GaAs, InP, GaN, or SiGe in a channel formation region, a transistor containing a carbon nanotube in a channel formation region, a transistor containing an organic semiconductor in a channel formation region, or the like may be used as each of the transistor M1, the transistor M1b, the transistor M6, and the transistor M6b.

Note that the channel formation regions of the transistor M1, the transistor M1b, the transistor M6, and the transistor M6b may include the same material or different materials. For example, one or more of the transistor M1, the transistor M1b, the transistor M6, and the transistor M6b may be an OS transistor and the rest may be a Si transistor.

The transistor M1, the transistor M1b, the transistor M6, and the transistor M6b illustrated in FIG. 1A are each, for example, a transistor having a structure including gates over and under a channel; the transistor M1, the transistor M1b, the transistor M6, and the transistor M6b each include a first gate and a second gate. For convenience, the first gate is referred to as a gate (sometimes referred to as a front gate) and the second gate is referred to as a back gate so that they are distinguished from each other, for example; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The memory cell MC in the semiconductor device of one embodiment of the present invention does not depend on the connection structure of a back gate of a transistor. In each of the transistor M1, the transistor M1$b$, the transistor M6, and the transistor M6$b$ illustrated in FIG. 1A, the back gate is illustrated and the connection structure of the back gate is not illustrated; however, a portion to which the back gate is electrically connected can be determined at the design stage. For example, in a transistor including a back gate, a gate and the back gate may be electrically connected to each other to increase the on-state current of the transistor. That is, the gate and the back gate of the transistor M1 may be electrically connected to each other, for example. Alternatively, for example, in a transistor including a back gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor. Note that the same applies to a transistor described in other parts of the specification and a transistor illustrated in other drawings, not only to the transistors in FIG. 1A.

The memory cell MC in the semiconductor device of one embodiment of the present invention does not depend on the structure of a transistor included in the memory cell MC. For example, the transistor M1, the transistor M1$b$, the transistor M6, and the transistor M6$b$ illustrated in FIG. 1A may each be a transistor having a structure not including a back gate, that is, a single-gate structure as illustrated in FIG. 1B. It is also possible that some transistors have a structure including a back gate and the other transistors have a structure not including a back gate. Note that the same applies to a transistor described in other parts of the specification and a transistor illustrated in other drawings, not only to the transistors in FIG. 1A.

Although the transistor M1, the transistor M1$b$, the transistor M6, and the transistor M6$b$ are illustrated as n-channel transistors in FIG. 1A as an example, some or all of them may be p-channel transistors depending on conditions or circumstances. In the case where an n-channel transistor is replaced with a p-channel transistor, a potential or the like input to the memory cell MC or the like needs to be appropriately changed so that the memory cell MC normally operates. In addition, a result output from the memory cell MC may be changed. Note that the same applies to a transistor described in other parts of the specification and a transistor illustrated in other drawings, not only to the transistors in FIG. 1A. In this embodiment, the structure and operation of the memory cell MC are described on the assumption that the transistor M1, the transistor M1$b$, the transistor M6, and the transistor M6$b$ are n-channel transistors.

In the memory cell MC in FIG. 1A, a first terminal of the transistor M1 is electrically connected to a wiring WRDL, and the gate of the transistor M1 is electrically connected to a wiring WRWL. An input terminal of the FTJ element FJA is electrically connected to a wiring FCA. An output terminal of the FTJ element FJA is electrically connected to a second terminal of the transistor M1, a first terminal of the transistor M6, and the gate of the transistor M6$b$. A second terminal of the transistor M6 is electrically connected to a wiring FCB. A first terminal of the transistor M1$b$ is electrically connected to a wiring WRDLb, and the gate of the transistor M1$b$ is electrically connected to the wiring WRWL. An input terminal of the FTJ element FJAb is electrically connected to the wiring FCA. An output terminal of the FTJ element FJAb is electrically connected to a second terminal of the transistor M1$b$, a first terminal of the transistor M6$b$, and the gate of the transistor M6. A second terminal of the transistor M6$b$ is electrically connected to the wiring FCB.

The wiring WRDL functions as a wiring that transmits data written to the memory cell MC, for example. The wiring WRDL functions as a wiring that transmits data read from the memory cell MC. That is, the wiring WRDL may function as a write data line and a read data line. Similarly, the wiring WRDLb functions as a wiring that transmits data written to the memory cell MC, for example. The wiring WRDLb functions as a wiring that transmits data read from the memory cell MC. That is, the wiring WRDLb may also function as a write data line and a read data line.

The wiring WRWL functions as a wiring for selecting the memory cell MC to which data is written, for example. The wiring WRWL functions also as a wiring for selecting the memory cell MC from which data is read, for example. That is, the wiring WRWL may function as a write word line and a read word line.

The wiring FCA functions as a wiring that supplies a variable potential with which polarization occurs in the material (dielectric) that can have ferroelectricity in each of the FTJ element FJA and the FTJ element FJAb when data is written to the memory cell MC, for example. The wiring FCA functions also as a wiring that supplies a potential with which polarization in the material (dielectric) does not change when data is read from the memory cell MC, for example.

Although a detailed operation example will be described later, in the operation of the memory cell MC, voltage is applied to the wiring FCA so that the voltage is applied to the input terminals of the FTJ element FJA and the FTJ element FJAb. In that case, tunnel current sometimes flows through each of the FTJ element FJA and the FTJ element FJAb. To prevent leakage of the tunnel current through the transistor M1 at this time, the OS transistor is preferably used as the transistor M1 and/or the transistor M1$b$. Owing to an extremely low off-state current of the OS transistor, leakage of the tunnel current flowing through the FTJ element FJA and/or the FTJ element FJAb to the wiring WRDL side can sometimes be prevented.

Operation Example

Next, an operation example of data writing and an operation example of data reading in the memory cell MC in FIG. 1A will be described.

Operation Example of Data Writing

Figure 2:
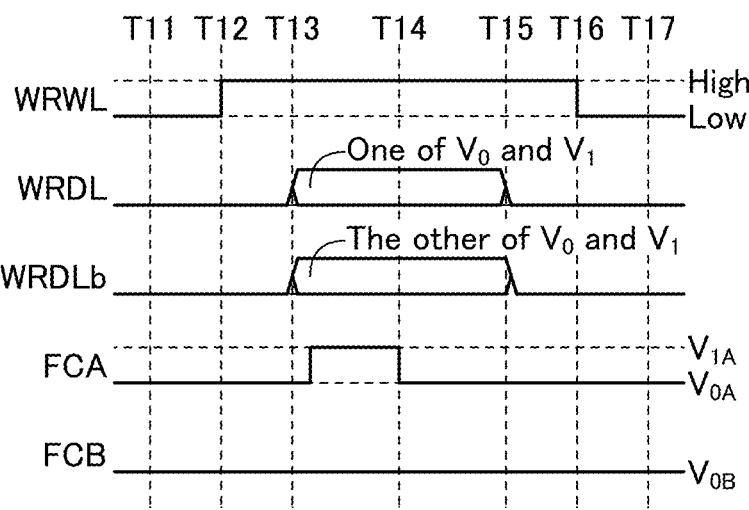
FIG. 2 is a timing chart showing an operation example of a memory cell of a semiconductor device.

FIG. 2 is a timing chart showing an example of a data writing operation in the memory cell MC in FIG. 1A. The timing chart in FIG. 2 shows changes in potentials of the wiring WRWL, the wiring WRDL, the wiring WRDLb, the wiring FCA, and the wiring FCB in a period from Time T11 to Time T17 and around the period.

[From Time T11 to Time T12]

In the period from Time T11 to Time T12, the potentials of the wiring WRWL and the wiring WRDL are low-level potentials (denoted as Low in FIG. 2). Thus, the low-level potentials are input to the gates of the transistor M1 and the transistor M1b. Accordingly, the transistor M1 and the transistor M1b are in the off state.

Data to be written to the memory cell MC have not been input to the wiring WRDL and the wiring WRDLb yet. Thus, in this operation example, the potentials of the wiring WRDL and the wiring WRDLb are each a ground potential (denoted as GND in FIG. 2) in the period from Time T11 to Time T12, for example. Note that a ground potential in this operation example is preferably 0 V.

Potentials supplied from the wiring FCA and the wiring FCB are $V_{0A}$ and $V_{0B}$, respectively. For example, $V_{0A}$ and $V_{0B}$ can be a reference potential or an approximate value of the reference potential. The reference potential $V_C$ is preferably 0 [V] or the ground potential, for example. Assuming that the reference potential is $V_C$, for example, the approximate value of the reference potential is preferably a potential higher than or equal to $V_C-0.1$ [V], higher than or equal to $V_C-0.05$ [V], or higher than or equal to $V_C-0.01$ [V] and lower than or equal to $V_C+0.01$ [V], lower than or equal to $V_C+0.05$ [V], or lower than or equal to $V_C+0.1$ [V]. Note that the above-described lower limits and upper limits can be combined with each other. In addition, it is further preferable that $V_{0A}$ and $V_{0B}$ be the same potential.

[From Time T12 to Time T13]

In the period from Time T12 to Time T13, the potential supplied from the wiring WRWL changes from the low-level potential to a high-level potential (denoted as High in FIG. 2). Thus, the high-level potential is input to the gates of the transistor M1 and the transistor M1b, so that the transistor M1 and the transistor M1b are turned on. That is, electrical continuity is established between the wiring WRDL and each of the gate of the transistor M6b and the first terminal of the transistor M6 (the output terminal of the FTJ element FJA), and electrical continuity is established between the wiring WRDLb and each of the gate of the transistor M6 and the first terminal of the transistor M6b (the output terminal of the FTJ element FJAb). Hence, the ground potential supplied from the wiring WRDL is supplied to the gate of the transistor M6b (the output terminal of the FTJ element FJA). Accordingly, the potential of the gate of the transistor M6 (the output terminal of the FTJ element FJA) becomes the ground potential. In addition, the ground potential supplied from the wiring WRDLb is supplied to the gate of the transistor M6 (the output terminal of the FTJ element FJAb). Accordingly, the potential of the gate of the transistor M6 (the output terminal of the FTJ element FJAb) becomes the ground potential.

[From Time T13 to Time T14]

In the period from Time T13 to Time T14, data to be written to the memory cell MC is transmitted to the memory cell MC from the wiring WRDL and the wiring WRDLb. Specifically, for example, one of $V_0$ and $V_1$ is supplied to the wiring WRDL as a potential corresponding to the data, and the other of $V_0$ and $V_1$ is supplied to the wiring WRDLb as a potential corresponding to the data. The transistor M1 and the transistor M1b have been in the on state since before Time T13; thus, the one of $V_0$ and $V_1$ is supplied to the gate of the transistor M6b (the output terminal of the FTJ element FJA) as the potential from the wiring WRDL, and the other of $V_0$ and $V_1$ is supplied to the gate of the transistor M6 (the output terminal of the FTJ element FJAb) as the potential from the wiring WRDLb.

Note that $V_0$ and $V_1$ are potentials representing binary data (digital values). For example, when the potential of the output terminal of the FTJ element FJA in the memory cell MC is $V_0$, the memory cell MC retains one of "0" and "1" as data, and when the potential of the output terminal of the FTJ element FJA in the memory cell MC is $V_1$, the memory cell MC retains the other of "0" and "1" as data. Description in this operation example is made on the assumption that when the potential of the output terminal of the FTJ element FJA in the memory cell MC is $V_0$, the memory cell MC retains "0" as data, and when the potential of the output terminal of the FTJ element FJA in the memory cell MC is $V_1$, the memory cell MC retains "1" as data, for example. Furthermore, the levels of $V_0$ and $V_1$ can be set such that $V_1-V_0$ is voltage with which polarization occurs or the direction of polarization is rewritten in the FTJ element FJA and the FTJ element FJAb. For example, in the case where the voltage with which polarization occurs (the direction of polarization changes) in the FTJ element FJA and the FTJ element FJAb is 3 V, $V_1$ and $V_0$ are set such that $V_1-V_0$ is higher than or equal to 3 V. Note that $V_0$ is preferably equal to $V_{0A}$ and/or $V_{0B}$, for example. Specifically, $V_0$ is 0 V and $V_1$ is 3 V, for example. Although writing of binary data is described in this operation example, the memory cell MC can sometimes perform writing of multilevel data or an analog potential, for example.

After the data to be written to the memory cell MC is transmitted to the memory cell MC from the wiring WRDL and the wiring WRDLb, a potential $V_{1A}$ is supplied to the wiring FCA and the potential $V_{0B}$ is supplied to the wiring FCB. For example, $V_{1A}$ is a potential higher than $V_{0A}$. $V_{1A}$ is set to a potential with which polarization occurs (the direction of polarization changes) in the FTJ element FJA when the output terminal of the FTJ element FJA has $V_0$. In that case, the direction of the polarization is from the input terminal to the output terminal of the FTJ element FJA (the positive direction). Similarly, $V_{1A}$ is set to a potential with which polarization occurs (the direction of polarization changes) in the FTJ element FJAb when the output terminal of the FTJ element FJAb has $V_0$. In that case, the direction of the polarization is from the input terminal to the output terminal of the FTJ element FJAb (the positive direction).

Note that in this operation example, $V_{1A}$ is preferably equal to the potential of $V_1$, for example.

First, attention is focused on the FTJ element FJA. When the potential of the output terminal of the FTJ element FJA (the gate of the transistor M6b) is $V_0$, the dielectric having ferroelectricity in the FTJ element FJA is polarized in the direction from the input terminal to the output terminal (the positive direction). Meanwhile, when the potential of the output terminal of the FTJ element FJA (the gate of the transistor M6b) is $V_1$, polarization does not change in the dielectric having ferroelectricity in the FTJ element FJA.

Next, attention is focused on the FTJ element FJAb. When the potential of the input terminal of the FTJ element FJAb (the gate of the transistor M6) is $V_0$, polarization does not change in the dielectric having ferroelectricity in the FTJ element FJAb. Meanwhile, when the potential of the input terminal of the FTJ element FJAb (the gate of the transistor M6) is $V_1$, the dielectric having ferroelectricity in the FTJ element FJAb is polarized in the direction from the input terminal to the output terminal (the positive direction).

[From Time T14 to Time T15]

In the period from Time T14 to Time T15, the potential $V_{0A}$ is supplied to the wiring FCA and the potential $V_{0B}$ is continuously supplied to the wiring FCB.

First, attention is focused on the FTJ element FJA. When the potential of the output terminal of the FTJ element FJA (the gate of the transistor M6$b$) is $V_0$, the direction of polarization does not change in the dielectric having ferroelectricity in the FTJ element FJA. Meanwhile, when the potential of the output terminal of the FTJ element FJA (the gate of the transistor M6$b$) is $V_1$, the dielectric having ferroelectricity in the FTJ element FJA is polarized in the direction from the output terminal to the input terminal (the negative direction).

Next, attention is focused on the FTJ element FJAb. When the potential of the input terminal of the FTJ element FJAb (the gate of the transistor M6) is $V_0$, the dielectric having ferroelectricity in the FTJ element FJAb is polarized in the direction from the output terminal to the input terminal (the negative direction). Meanwhile, when the potential of the input terminal of the FTJ element FJAb (the gate of the transistor M6) is $V_1$, the direction of polarization does not change in the dielectric having ferroelectricity in the FTJ element FJAb.

When the potentials of the wiring FCA and the wiring FCB in the period from Time T13 to Time T15 change according to the timing chart in FIG. 2, the direction of polarization in the FTJ element FJA and the FTJ element FJAb is determined as in the following table in response to the potentials supplied to the memory cell MC from the wiring WRDL and the wiring WRDLb.

element FJA) and the gate of the transistor M6 (the output terminal of the FTJ element FJAb) each become the ground potential.
[From Time T16 to Time T17]

In the period from Time T16 to Time T17, the potential of the wiring WRWL changes from the high-level potential to a low-level potential. Thus, the low-level potential is input to the gates of the transistor M1 and the transistor M1$b$, so that the transistor M1 and the transistor M1$b$ are turned off.

By the operation in the period from Time T11 to Time T17, data can be written to the memory cell MC in FIG. 1A.

Operation Example of Data Reading

Figure 3:
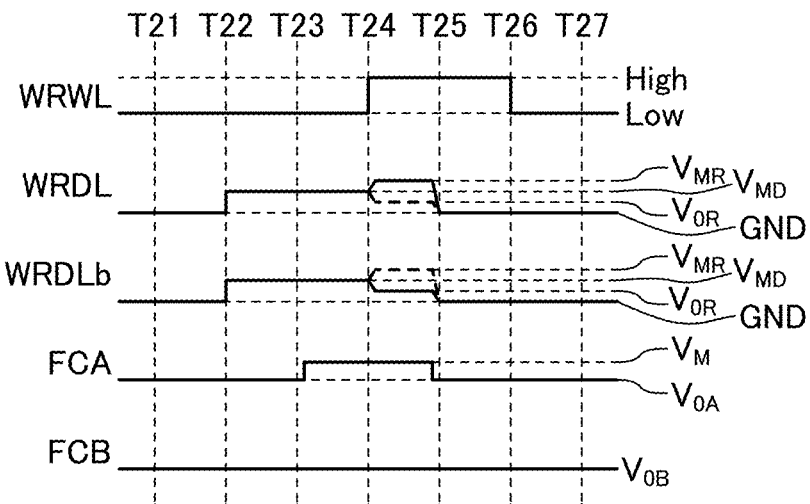
FIG. 3 is a timing chart showing an operation example of a memory cell of a semiconductor device.

FIG. 3 is a timing chart showing an example of a data reading operation in the memory cell MC in FIG. 1A. The timing chart in FIG. 3 shows changes in the potentials of the wiring WRWL, the wiring WRDL, the wiring WRDLb, the wiring FCA, and the wiring FCB in a period from Time T21 to Time T27 and around the period.
[From Time T21 to Time T22]

In the period from Time T21 to Time T22, the potential of the wiring WRWL is a low-level potential (denoted as Low in FIG. 3). Thus, the low-level potential is input to the gates of the transistor M1 and the transistor M1$b$. Accordingly, the transistor M1 and the transistor M1$b$ are in the off state.

TABLE 1

| Potential written from wiring WRDL (gate potential of transistor M6b) | Potential written from wiring WRDLb (gate potential of transistor M6) | Direction of polarization in FTJ element FJA | Direction of polarization in FTJ element FJAb |
|---|---|---|---|
| $V_0$ | $V_1$ | From input terminal (wiring FCA) to output terminal (positive direction) | From output terminal to input terminal (wiring FCA) (negative direction) |
| $V_1$ | $V_0$ | From output terminal to input terminal (wiring FCA) (negative direction) | From input terminal (wiring FCA) to output terminal (positive direction) |

Note that after Time T15, the potentials supplied from the wiring FCA and the wiring FCB are $V_{OA}$ and $V_{OB}$, respectively. That is, the potentials supplied from the wiring FCA and the wiring FCB after Time T15 are the same as the potentials supplied from the wiring FCA and the wiring FCB since before Time T13.
[From Time T15 to Time T16]

In the period from Time T15 to Time T16, transmission of data to the memory cell MC from the wiring WRDL and the wiring WRDLb is completed. Specifically, for example, the ground potential is supplied to the wiring WRDL and the wiring WRDLb. The transistor M1 has been in the on state since before Time T15, so that the ground potential from the wiring WRDL is supplied to the gate of the transistor M6$b$ (the output terminal of the FTJ element FJA). The transistor M1$b$ has also been in the on state since before Time T15, so that the ground potential from the wiring WRDLb is supplied to the gate of the transistor M6 (the output terminal of the FTJ element FJAb).

Owing to the potential of the wiring FCA being $V_{OA}$, the direction of polarization written to each of the FTJ element FJA and the FTJ element FJAb in the period from Time T14 to Time T16 does not change even when the potentials of the gate of the transistor M6$b$ (the output terminal of the FTJ In the period from Time T21 to Time T22, the potentials of the wiring WRDL and the wiring WRDLb are each the ground potential (denoted as GND in FIG. 3).

The potentials supplied from the wiring FCA and the wiring FCB in the period from Time T21 to Time T22 are $V_{OA}$ and $V_{OB}$, respectively, which are the same as the potentials supplied from the wiring FCA and the wiring FCB in the period from Time T11 to Time T12.
[From Time T22 to Time T23]

In the period from Time T22 to Time T23, the wiring WRDL and the wiring WRDLb are precharged with a potential $V_{MD}$, for example. Note that the potential $V_{MD}$ is a potential higher than $V_{OB}$ and lower than $V_M$ described later.
[From Time T23 to Time T24]

In the period from Time T23 to Time T24, the potential $V_M$ is supplied to the wiring FCA, and the potential $V_{OB}$ is supplied to the wiring FCB. $V_M$ is a potential higher than $V_{OA}$ and $V_{OB}$ and lower than $V_{1A}$. When the potential of the wiring FCB is $V_{OB}$, $V_M$ is set to a potential with which a polarization change does not occur (the direction of polarization does not change) in the FTJ element FJA and the FTJ element FJAb.

First, the case is considered where the dielectric having ferroelectricity in the FTJ element FJA is polarized in the direction from the input terminal to the output terminal (the positive direction) and the dielectric having ferroelectricity in the FTJ element FJAb is polarized in the direction from the output terminal to the input terminal (the negative direction). At this time, a resistance value with respect to current flowing from the input terminal to the output terminal of the FTJ element FJA increases, whereas a resistance value with respect to current flowing from the input terminal to the output terminal of the FTJ element FJAb decreases. Thus, the potential of the output terminal of the FTJ element FJAb becomes close to the potential $V_M$ supplied from the wiring FCA. The gate of the transistor M6 is supplied with a potential close to the potential $V_M$ (a potential higher than $V_{OB}$); hence, the transistor M6 is turned on and the potential of the output terminal of the FTJ element FJA becomes close to the potential $V_{OB}$ supplied from the wiring FCB. The gate of the transistor M6b is supplied with a potential close to the potential $V_{OB}$; hence, the transistor M6b is turned off. Accordingly, the potential of the output terminal of the FTJ element FJAb becomes closer to the potential $V_M$ supplied from the wiring FCA.

Next, the case is considered where the dielectric having ferroelectricity in the FTJ element FJA is polarized in the direction from the output terminal to the input terminal (the negative direction) and the dielectric having ferroelectricity in the FTJ element FJAb is polarized in the direction from the input terminal to the output terminal (the positive direction). At this time, the resistance value with respect to the current flowing from the input terminal to the output terminal of the FTJ element FJAb increases, whereas the resistance value with respect to the current flowing from the input terminal to the output terminal of the FTJ element FJA decreases. Thus, the potential of the output terminal of the FTJ element FJA becomes close to the potential $V_M$ supplied from the wiring FCA. The gate of the transistor M6b is supplied with a potential close to the potential $V_M$ (a potential higher than $V_{OB}$); hence, the transistor M6b is turned on and the potential of the output terminal of the FTJ element FJAb becomes close to the potential $V_{OB}$ supplied from the wiring FCB. The gate of the transistor M6 is supplied with a potential close to the potential $V_{OB}$; hence, the transistor M6 is turned off. Accordingly, the potential of the output terminal of the FTJ element FJA becomes closer to the potential $V_M$ supplied from the wiring FCA.

For convenience, description in this operation example is made on the assumption that the potential of the output terminal of the FTJ element FJA becomes $V_{OB}$ and the potential of the output terminal of the FTJ element FJAb becomes $V_M$ in the case where the dielectric having ferroelectricity in the FTJ element FJA is polarized in the direction from the input terminal to the output terminal (the positive direction) and the dielectric having ferroelectricity in the FTJ element FJAb is polarized in the direction from the output terminal to the input terminal (the negative direction) in the period from Time T23 to Time T24. Alternatively, for convenience, it is assumed that the potential of the output terminal of the FTJ element FJA becomes $V_M$ and the potential of the output terminal of the FTJ element FJAb becomes $V_{OB}$ in the case where the dielectric having ferroelectricity in the FTJ element FJA is polarized in the direction from the output terminal to the input terminal (the negative direction) and the dielectric having ferroelectricity in the FTJ element FJAb is polarized in the direction from the input terminal to the output terminal (the positive direction).

[From Time T24 to Time T25]

In the period from Time T24 to Time T25, the potential supplied from the wiring WRWL changes from a low-level potential to a high-level potential (denoted as High in FIG. 3). Thus, the high-level potential is input to the gates of the transistor M1 and the transistor M1b, so that the transistor M1 and the transistor M1b are turned on.

First, the case is considered where the dielectric having ferroelectricity in the FTJ element FJA is polarized in the direction from the input terminal to the output terminal (the positive direction) and the dielectric having ferroelectricity in the FTJ element FJAb is polarized in the direction from the output terminal to the input terminal (the negative direction). At this time, the potential of the output terminal of the FTJ element FJA becomes $V_{OB}$, and the potential of the output terminal of the FTJ element FJAb becomes $V_M$. Accordingly, the charge precharged to the wiring WRDL flows to the wiring FCB through the transistor M1 and the transistor M6, so that the potential of the wiring WRDL decreases from $V_{MD}$. In addition, the charge flows to the wiring WRDLb from the wiring FCA through the FTJ element FJAb and the transistor M1b, so that the potential of the wiring WRDLb increases from $V_{MD}$. At this time, the potential of the wiring WRDL becomes $V_{OR}$ and the potential of the wiring WRDLb becomes $V_{MR}$.

For example, $V_{OR}$ is preferably $V_{OB}$ and $V_{MR}$ is preferably $V_M$.

Next, the case is considered where the dielectric having ferroelectricity in the FTJ element FJA is polarized in the direction from the output terminal to the input terminal (the negative direction) and the dielectric having ferroelectricity in the FTJ element FJAb is polarized in the direction from the input terminal to the output terminal (the positive direction). At this time, the potential of the output terminal of the FTJ element FJA becomes $V_M$, and the potential of the output terminal of the FTJ element FJAb becomes $V_{OB}$. Accordingly, the charge precharged to the wiring WRDLb flows to the wiring FCB through the transistor M1b and the transistor M6b, so that the potential of the wiring WRDLb decreases from $V_{MD}$. In addition, the charge flows to the wiring WRDL from the wiring FCA through the FTJ element FJA and the transistor M1, so that the potential of the wiring WRDL increases from $V_{MD}$. At this time, the potential of the wiring WRDL becomes $V_M$ and the potential of the wiring WRDLb becomes $V_{OR}$.

Here, the data retained in the memory cell MC can be read by reading the potentials of the wiring WRDL and the wiring WRDLb. For example, in the case where the dielectric having ferroelectricity in the FTJ element FJA is polarized in the direction from the input terminal to the output terminal (the positive direction) and the dielectric having ferroelectricity in the FTJ element FJAb is polarized in the direction from the output terminal to the input terminal (the negative direction), the data "0" written to the memory cell MC can be read by reading the potentials of the wiring WRDL and the wiring WRDLb. For another example, in the case where the dielectric having ferroelectricity in the FTJ element FJA is polarized in the direction from the output terminal to the input terminal (the negative direction) and the dielectric having ferroelectricity in the FTJ element FJAb is polarized in the direction from the input terminal to the output terminal (the positive direction), the data "0" written to the memory cell MC can be read by reading the potentials of the wiring WRDL and the wiring WRDLb.

Note that the potentials of the wiring WRDL and the wiring WRDLb can be read using a sense amplifier, for example.

Note that after Time T25, the potentials supplied from the wiring FCA and the wiring FCB are $V_{OA}$ and $V_{OB}$, respectively. That is, the potentials supplied from the wiring FCA and the wiring FCB after Time T25 are the same as the potentials supplied from the wiring FCA and the wiring FCB since before Time T23.

[From Time T25 to Time T26]

In the period from Time T25 to Time T26, the ground potential is input to the wiring WRDL and the wiring WRDLb. The transistor M1 has been in the on state since before Time T25, so that the ground potential from the wiring WRDL is supplied to the gate of the transistor M6$b$ (the output terminal of the FTJ element FJA). The transistor M1$b$ also has been in the on state since before Time T125, so that the ground potential from the wiring WRDLb is supplied to the gate of the transistor M6 (the output terminal of the FTJ element FJAb).

Owing to the potential of the wiring FCA being $V_{OA}$, the direction of polarization in each of the FTJ element FJA and the FTJ element FJAb does not change even when the potentials of the gate of the transistor M6$b$ (the output terminal of the FTJ element FJA) and the gate of the transistor M6 (the output terminal of the FTJ element FJAb) each become the ground potential.

[From Time T26 to Time T27]

In the period from Time T26 to Time T27, the potential of the wiring WRWL changes from the high-level potential to a low-level potential. Thus, the low-level potential is input to the gates of the transistor M1 and the transistor M1$b$, so that the transistor M1 and the transistor M1$b$ are turned off.

With the above-described operation example in the period from Time T21 to Time T27, the data written to the memory cell MC in FIG. 1A can be read. Operation example of data reading described above, in which the direction of polarization in the FTJ element FJA and the FTJ element FJAb does not change when the data is read from the memory cell MC in FIG. 1A, is not destructive reading. That is, the data can be read from the memory cell MC while the data written to the memory cell MC is retained.

Although the non-destructive reading is described as the method for reading data from the memory cell MC in the reading operation example in the timing chart of FIG. 3, the data reading in the memory cell MC in FIG. 1 may be destructive reading. In this case, the potential input to the wiring FCA in the period from Time T23 to Time T24 is preferably $V_{1A}$, for example. It is preferable to use an integrator circuit (a QV circuit) as a read circuit electrically connected to the wiring WRDL and the wiring WRDLb.

The operations in the timing charts of FIG. 2 and FIG. 3 described in this embodiment are examples, and the operations can be changed depending on circumstances or conditions. For example, in the timing chart of FIG. 2, a high-level potential is supplied to the wiring WRWL in the period from Time T12 to Time T16, and one of $V_0$ and $V_1$ is supplied to the wiring WRDL and the other of $V_0$ and $V_1$ is supplied to the wiring WRDLb in the period from Time T13 to Time T15; however, a high-level potential may be supplied to the wiring WRWL in a period during which one of $V_0$ and $V_1$ is supplied to the wiring WRDL and the other of $V_0$ and $V_1$ is supplied to the wiring WRDLb. The period during which the potential $V_{1A}$ is supplied to the wiring FCA and the potential $V_{OB}$ is supplied to the wiring FCB and the period during which the potential $V_{OA}$ is supplied to the wiring FCA and the potential $V_{OB}$ is supplied to the wiring FCB may be at any timing as long as they are within the period during which a high-level potential is supplied to the wiring WRWL, one of $V_0$ and $V_1$ is supplied to the wiring WRDL, and the other of $V_0$ and $V_1$ is supplied to the wiring WRDLb. The period during which the potential $V_{OA}$ is supplied to the wiring FCA and the potential $V_{OB}$ is supplied to the wiring FCB in the period from Time T14 to Time T15 may be prior to the period during which the potential $V_{1A}$ is supplied to the wiring FCA and the potential $V_{OB}$ is supplied to the wiring FCB in the period from Time T13 to Time T14.

Structure Example 2

The circuit structure of the memory cell MC included in the memory device, which is the semiconductor device of one embodiment of the present invention, is not limited to that in FIG. 1A. The circuit structure of the memory cell MC included in the memory device may be changed depending on circumstances or conditions. In this structure example, the memory cell MC in which one of the FTJ element FJA and the FTJ element FJAb provided in the memory cell MC in FIG. 1A is changed into another circuit element is described.

Figure 4A:
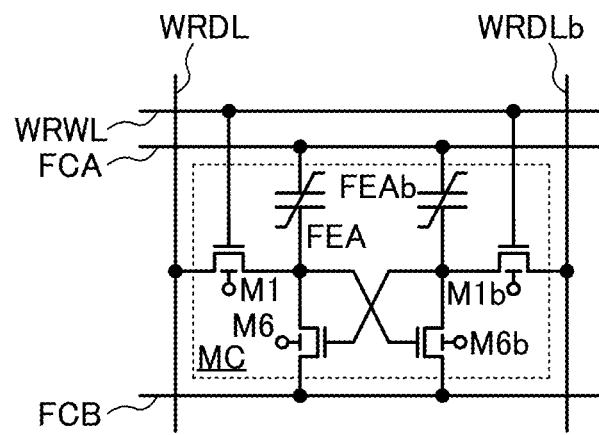
FIG. 4A to FIG. 4C are circuit diagrams illustrating structure examples of a memory cell of a semiconductor device.

As illustrated in FIG. 4A, the memory cell MC may have a structure in which the FTJ element FJA is replaced with a ferroelectric capacitor FEA and the FTJ element FJAb is replaced with a ferroelectric capacitor FEAb, for example. Note that in the drawings of this specification, the circuit symbol of a ferroelectric capacitor (e.g., the ferroelectric capacitor FEA, the ferroelectric capacitor FEAb, or the like) is a circuit symbol of a capacitor with a diagonal line as in FIG. 4A. As another circuit symbol, a circuit symbol of a capacitor with a plurality of diagonal lines between two parallel lines may be used as in FIG. 4B.

Figure 4B:
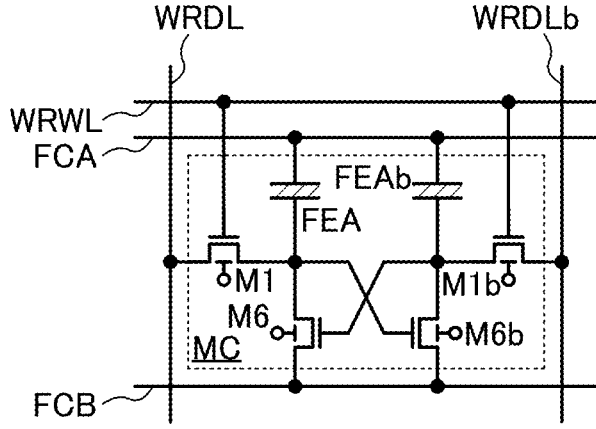

In FIG. 4A and FIG. 4B, a first terminal of the ferroelectric capacitor FEA is electrically connected to the wiring FCA, and a second terminal of the ferroelectric capacitor FEA is electrically connected to the second terminal of the transistor M1, the first terminal of the transistor M6, and the gate of the transistor M6$b$. A first terminal of the ferroelectric capacitor FEAb is electrically connected to the wiring FCA, and a second terminal of the ferroelectric capacitor FEAb is electrically connected to the second terminal of the transistor M1$b$, the first terminal of the transistor M6$b$, and the gate of the transistor M6.

As in the memory cell MC in each of FIG. 4A and FIG. 4B, even when the FTJ element FJA and the FTJ element FJAb in the memory cell in FIG. 1A are respectively replaced with the ferroelectric capacitor FEA and the ferroelectric capacitor FEAb, the memory cell MC in each of FIG. 4A and FIG. 4B can retain data for writing transmitted from the wiring WRDL and the wiring WRDLb and output the written data. In that case, an integrator circuit that converts the amount of charge flowing through a wiring into voltage is used as the read circuit electrically connected to the wiring WRDL and the wiring WRDLb, for example.

For a data writing method in the memory cell MC in each of FIG. 4A and FIG. 4B, refer to the data writing method shown in FIG. 2, for example.

In a data reading method in the memory cell MC in each of FIG. 4A and FIG. 4B, for example, the transistor M1 and the transistor M1$b$ are turned on and the potentials of the wiring WRDL and the wiring WRDLb are each set to the ground potential. After that, a predetermined potential is input to the wiring FCA. Note that the potential is set to a potential with which the direction of polarization in a material that can have ferroelectricity in each of the ferroelectric capacitor FEA and the ferroelectric capacitor FEAb is changed when the second terminals of the ferroelectric capacitor FEA and the ferroelectric capacitor FEAb have the ground potential. Thus, the potential may be either a negative potential or a positive potential as long as it is a potential with which the direction of polarization in the material that can have ferroelectricity is changed.

The ground potential is supplied to the second terminals of the ferroelectric capacitor FEA and the ferroelectric capacitor FEAb and the above potential is supplied to the wiring FCA, whereby the direction of polarization in the material that can have ferroelectricity in each of the ferroelectric capacitor FEA and the ferroelectric capacitor FEAb is changed. Specifically, the direction of polarization in the dielectric in each of the ferroelectric capacitor FEA and the ferroelectric capacitor FEAb is changed to the direction from the first terminal to the second terminal. Note that before data reading, the dielectric in one of the ferroelectric capacitor FEA and the ferroelectric capacitor FEAb is polarized in the direction from the first terminal to the second terminal and the dielectric in the other of the ferroelectric capacitor FEA and the ferroelectric capacitor FEAb is polarized in the direction from the second terminal to the first terminal; thus, at the time of data reading, the direction of polarization in the dielectric in the other of the ferroelectric capacitor FEA and the ferroelectric capacitor FEAb is changed.

At this time, the change in the direction of polarization in the dielectric in the other of the ferroelectric capacitor FEA and the ferroelectric capacitor FEAb causes a change in charge in the other of the ferroelectric capacitor FEA and the ferroelectric capacitor FEAb. Thus, the data retained in the memory cell MC can be read by reading the amount of change in the charge using the integrator circuit or the like electrically connected to the wiring WRDL or the wiring WRDLb.

Note that the above-described reading operation, in which the direction of polarization in the dielectric in the other of the ferroelectric capacitor FEA and the ferroelectric capacitor FEAb is changed, is destructive reading. Thus, after the data retained in the memory cell MC is read, the data needs to be written to the memory cell MC again.

Figure 4C:
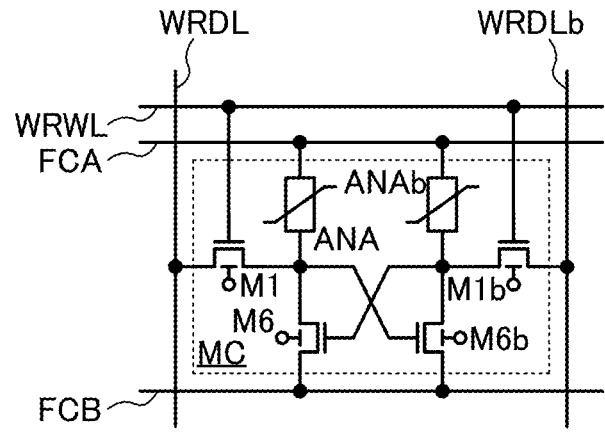

Although FIG. 4A and FIG. 4B each illustrate the example in which the FTJ element FJA and the FTJ element FJAb in the memory cell MC in FIG. 1A are respectively replaced with the ferroelectric capacitor FEA and the ferroelectric capacitor FEAb, the FTJ element FJA and the FTJ element FJAb in the memory cell MC in FIG. 1A may be replaced with circuit elements other than ferroelectric capacitors. For example, as illustrated in FIG. 4C, the FTJ element FJA and the FTJ element FJAb in the memory cell MC in FIG. 1A may be respectively replaced with a circuit element ANA and a circuit element ANAb whose resistance values can be changed. Specifically, an input terminal of the circuit element ANA is electrically connected to the wiring FCA, and an output terminal of the circuit element ANA is electrically connected to the second terminal of the transistor M1, the first terminal of the transistor M6, and the gate of the transistor M6*b*. An input terminal of the circuit element ANAb is electrically connected to the wiring FCA, and an output terminal of the circuit element ANAb is electrically connected to the second terminal of the transistor M1*b*, the first terminal of the transistor M6*b*, and the gate of the transistor M6. Examples of the circuit element ANA and the circuit element ANAb include a variable resistor used in a ReRAM (Resistive Random Access Memory) or the like, an MTJ (Magnetic Tunnel Junction or Magnetic Transportation Junction) element used in an MRAM (Magnetoresistive Random Access Memory) or the like, and a phase change memory (PCM) element.

As in the memory cell MC in FIG. 4C, even when the FTJ element FJA and the FTJ element FJAb in the memory cell in FIG. 1A are respectively replaced with the circuit element ANA and the circuit element ANAb, the resistance values of the circuit element ANA and the circuit element ANAb can be changed like those of the FTJ element FJA and the FTJ element FJAb in the memory cell MC in FIG. 1A. Thus, as in the memory cell MC in FIG. 1A, writing of data to the memory cell MC and reading of the data without destruction of the retained data can sometimes be performed in the memory cell MC in FIG. 4C.

Structure Example 3

This structure example describes a memory cell that is different from the memory cell MC in FIG. 1A and can be included in a memory device that is a semiconductor device of one embodiment of the present invention.

Figure 5A:
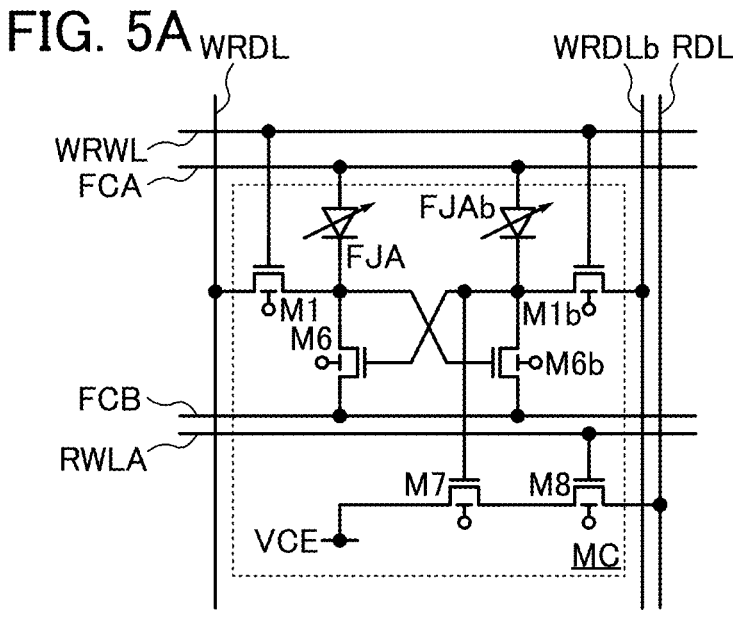
FIG. 5A and FIG. 5B are circuit diagrams illustrating structure examples of a memory cell of a semiconductor device.

The memory cell MC illustrated in FIG. 5A is a modification example of the memory cell MC in FIG. 1A, in which a transistor M7 and a transistor M8 are further provided in the memory cell MC in FIG. 1A.

A first terminal of the transistor M7 is electrically connected to a wiring VCE, a second terminal of the transistor M7 is electrically connected to a first terminal of the transistor M8, and a gate of the transistor M7 is electrically connected to the output terminal of the FTJ element FJA, the second terminal of the transistor M1, the first terminal of the transistor M6, and the gate of the transistor M6*b*. A second terminal of the transistor M8 is electrically connected to a wiring RDL, and a gate of the transistor M8 is electrically connected to a wiring RWLA.

The wiring VCE functions as a wiring that supplies a constant voltage, for example. The constant voltage can be, for example, a low-level potential, the ground potential, or the like.

The wiring RDL functions as a wiring that transmits data read from the memory cell MC, for example.

The wiring RWLA functions as a wiring for selecting the memory cell MC from which data is read, for example.

For an example of an operation of writing data to the memory cell MC in FIG. 5A, refer to the timing chart in FIG. 2. At the time of the operation of writing data to the memory cell MC in FIG. 5A, potentials supplied from the wiring RWLA and the wiring RDL are each preferably a low-level potential or the ground potential, for example.

For an example of an operation of reading data from the memory cell MC in FIG. 5A, refer to the timing chart in FIG. 3. Note that the ground potential is supplied to the wiring VCE, for example. In the memory cell MC in FIG. 5A, for example, it is preferable that a high-level potential be supplied to the wiring RWLA to turn on the transistor M8 and a high-level potential be supplied to the wiring RDL in the period from Time T24 to Time T25 in the timing chart of FIG. 3. Thus, the ground potential is supplied to the first terminal of the transistor M7 and the high-level potential is supplied to the second terminal of the transistor M7, so that the amount of current flowing between the first terminal and the second terminal of the transistor M7 depends on the potential of the gate of the transistor M7 (the output terminal of the FTJ element FJAb). That is, the current flows through the wiring RDL; thus, conversion of the amount of current into voltage by a current-voltage converter circuit or the like electrically connected to the wiring RDL enables data to be read from the memory cell MC in FIG. 5A.

Described next is a memory cell that is different from the memory cells MC in FIG. 1A, FIG. 1B, and FIG. 5A and can be included in a memory device that is a semiconductor device of one embodiment of the present invention.

Figure 5B:
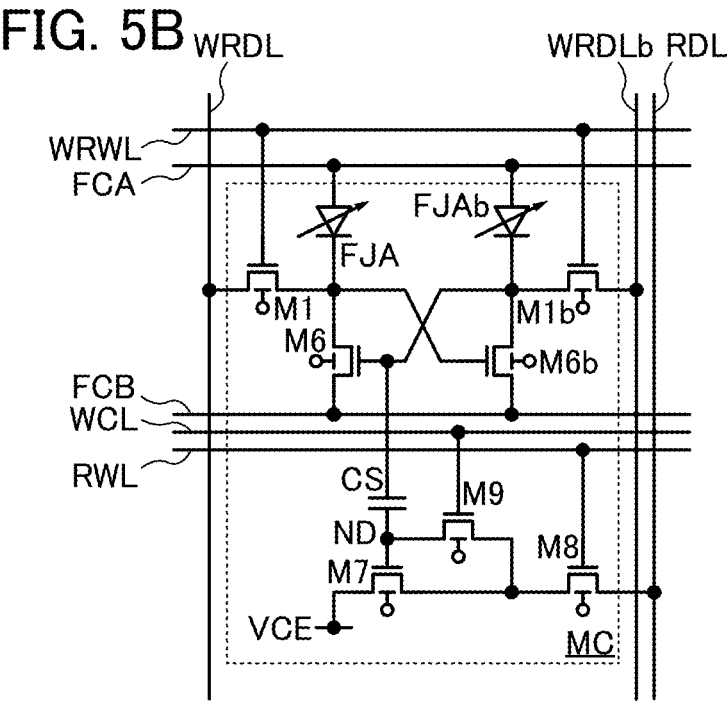

The memory cell MC illustrated in FIG. 5B is a modification example of the memory cell MC in FIG. 5A and is different from the memory cell MC in FIG. 5A in including a transistor M9 and a capacitor CS and in that the gate of the transistor M7 is electrically connected to the output terminal of the FTJ element FJA through the capacitor CS.

The memory cell MC in FIG. 5B has a function of correcting the threshold voltage of the transistor M7 in addition to the functions of the memory cell MC in FIG. 5A. Owing to the correction of the threshold voltage of the transistor M7, the amount of current flowing between the first terminal and the second terminal of the transistor M7 does not depend on the threshold voltage of the transistor M7 in some cases. Thus, given a memory cell array in which a plurality of the memory cells MC in FIG. 5B are provided, for example, variation in the threshold voltages of the transistors M7 included in the plurality of memory cells MC can be reduced, so that incorrect data reading from the plurality of memory cells MC can be prevented.

The gate of the transistor M7 is electrically connected to a first terminal of the capacitor CS and a first terminal of the transistor M9, and a second terminal of the capacitor CS is electrically connected to the output terminal of the FTJ element FJA, the second terminal of the transistor M1, the first terminal of the transistor M6, and the gate of the transistor M6b. A second terminal of the transistor M9 is electrically connected to the second terminal of the transistor M7 and the first terminal of the transistor M8, and a gate of the transistor M9 is electrically connected to a wiring WCL. In FIG. 5B, an electrical connection point of the gate of the transistor M7, the first terminal of the capacitor CS, and the first terminal of the transistor M9 is a node ND.

The wiring WCL functions as a control wiring that performs switching of the on state and the off state of the transistor M9, for example. Specifically, for example, the wiring WCL has a function of turning on or turning off the transistor M9 by inputting a high-level potential or a low-level potential at the time of correcting the threshold voltage of the transistor M7.

Operation Example of Correcting Threshold Voltage

Next, an operation of correcting the threshold voltage of the transistor M7 will be described. This operation example can be performed before data writing to the memory cell MC in FIG. 5B or after the data writing thereto, for example.

Figure 7:
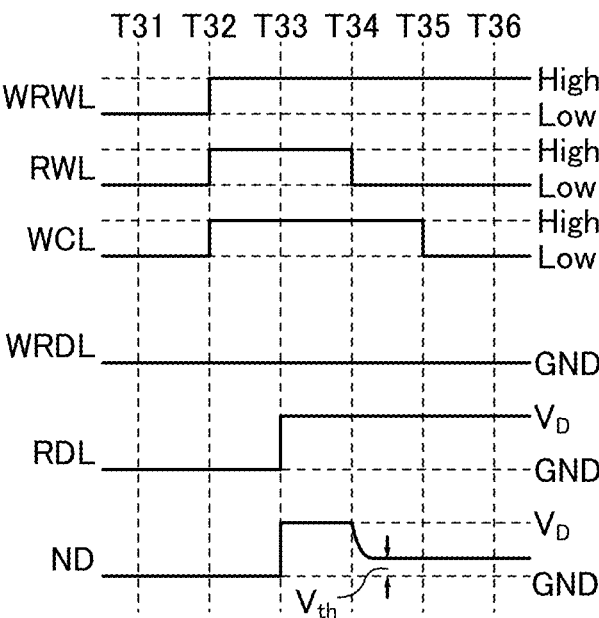
FIG. 7 is a timing chart showing an operation example of a memory cell of a semiconductor device.

FIG. 7 is a timing chart showing the example of the operation of correcting the threshold voltage of the transistor M7 in the memory cell MC in FIG. 5B. The timing chart in FIG. 7 shows changes in the potentials of the wiring WRWL, a wiring RWL, the wiring WCL, the wiring WRDL, the wiring RDL, and the node ND in a period from Time T31 to Time T36 and around the period.

[From Time T31 to Time T32]

In the period from Time T31 to Time T32, the potentials of the wiring WRWL, the wiring RWL, and the wiring WCL are low-level potentials (denoted as Low in FIG. 7), for example. Thus, the low-level potentials are input to the gates of the transistor M1 and the transistor M1b. Accordingly, the transistor M1, the transistor M1b, the transistor M8, and the transistor M9 are in the off state.

In the period from Time T31 to Time T32, the potentials of the wiring WRDL and the wiring RDL are each the ground potential (denoted as GND in FIG. 7), for example.

In the period from Time T31 to Time T32, the potential of the node ND is the ground potential, for example.

[From Time T32 to Time T33]

In the period from Time T32 to Time T33, the potentials supplied from the wiring WRWL, the wiring RWL, and the wiring WCL change from the low-level potentials to high-level potentials (denoted as High in FIG. 7). Thus, the high-level potentials are input to the gates of the transistor M1, the transistor M1b, the transistor M8, and the transistor M9, so that the transistor M1, the transistor M1b, the transistor M8, and the transistor M9 are turned on. That is, electrical continuity is established between the wiring WRDLb and the second terminal of the capacitor CS, and electrical continuity is established between the wiring RDL and the first terminal of the capacitor CS. Accordingly, the potentials of the output terminal of the FTJ element FJAb and the node ND each become the ground potential, and the voltage between the first terminal and the second terminal of the capacitor CS becomes approximately 0 V.

[From Time T33 to Time T34]

In the period from Time T33 to Time T34, a potential $V_D$ is supplied to the wiring RDL. The potential $V_D$ is a potential higher than the threshold voltage of the transistor M7, for example. In that case, the potential $V_D$ from the wiring RDL is supplied to the first terminal of the capacitor CS (the node ND) through the transistor M8 and the transistor M9.

[From Time T34 to Time T35]

In the period from Time T34 to Time T35, the potential supplied from the wiring RWL changes from the high-level potential to a low-level potential. Thus, the low-level potential is input to the gate of the transistor M8, so that the transistor M8 is turned off.

The transistor M9 has been in the on state; thus, electrical continuity is established between the second terminal and the gate of the transistor M7. Since the transistor M8 is in the off state, the potential of the first terminal of the capacitor CS (the node ND) is decreased by the current flow between the first terminal and the second terminal of the transistor M7. Note that the potential of the first terminal of the capacitor CS (the node ND) decreases until the gate-source voltage of the transistor M7 becomes equal to the threshold voltage ($V_{th}$). Accordingly, the potential of the gate of the transistor M7 (the first terminal of the capacitor CS and the node ND) decreases from $V_D$ to $V_{th}$.

[From Time T35 to Time T36]

In the period from Time T35 to Time T36, the potential supplied from the wiring WCL changes from the high-level potential to a low-level potential. Thus, the low-level potential is input to the gate of the transistor M9, so that the transistor M9 is turned off. Accordingly, the voltage between the first terminal and the second terminal of the capacitor CS is retained. At this time, the potential of the gate of the transistor M7 (the first terminal of the capacitor CS and the node ND) is $V_{th}$, and the gate-source voltage of the transistor M7 becomes equal to the threshold voltage.

Here, when the potential of the second terminal of the capacitor CS changes from the ground potential to the potential $V_{MR}$, for example, the gate potential of the transistor M7 becomes $V_{MR}+V_{th}$. A difference between the gate-source voltage and the threshold voltage of the transistor M7 at this time is $(V_{MR}+V_{th})-V_{th}=V_{MR}$. By supplying a potential higher than the ground potential to the second terminal of the transistor M7, current corresponding to the difference between the gate-source voltage and the threshold voltage of the transistor M7 and the source-drain voltage thereof flows between the source and the drain of the transistor M7. Since the difference between the gate-source voltage and the threshold voltage is $V_{MR}$, the current flowing between the source and the drain of the transistor M7 does not depend on the threshold voltage of the transistor M7. The correction of the threshold voltage of the transistor M7 in this manner enables current independent of the threshold voltage of the transistor M7 to flow between the source and the drain of the transistor M7.

As described above, the threshold voltage of the transistor M7 can be corrected by the operation example in the period from Time T31 to Time T36 shown in FIG. 7.

Structure Example 4

Figure 6:
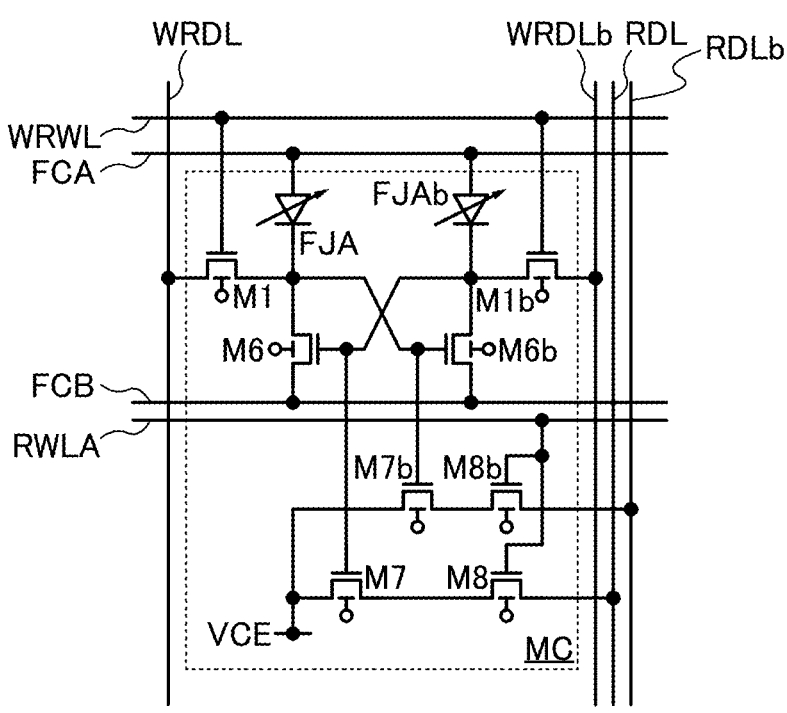
FIG. 6 is a circuit diagram illustrating a structure example of a memory cell of a semiconductor device.

The memory cell MC illustrated in FIG. 6 is a circuit structure example of a memory cell applicable to the memory device of one embodiment of the present invention. The memory cell MC in FIG. 6 is a modification example of the memory cell MC in FIG. 5A, in which a transistor M7*b* and a transistor M8*b* are further provided in the memory cell MC in FIG. 5A.

A first terminal of the transistor M7*b* is electrically connected to the wiring VCE, a second terminal of the transistor M7*b* is electrically connected to a first terminal of the transistor M8*b*, and a gate of the transistor M7*b* is electrically connected to the output terminal of the FTJ element FJA, the second terminal of the transistor M1, the first terminal of the transistor M6, and the gate of the transistor M6*b*. A second terminal of the transistor M8*b* is electrically connected to a wiring RDLb, and gates of the transistor M8 and the transistor M8*b* are electrically connected to the wiring RWLA.

The wiring RDLb functions as a wiring that transmits data read from the memory cell MC, for example, like the wiring RDL. Note that the wiring RDL and the wiring RDLb function as a wiring pair that transmits complementary data.

For an example of an operation of writing data to the memory cell MC in FIG. 6, refer to the timing chart in FIG. 2. At the time of the operation of writing data to the memory cell MC in FIG. 6, potentials supplied from the wiring RWLA, the wiring RDL, and the wiring RDLb are each preferably a low-level potential or the ground potential, for example.

For an example of an operation of reading data from the memory cell MC in FIG. 6, refer to the timing chart in FIG. 3. Note that the ground potential is supplied to the wiring VCE, for example. In the memory cell MC in FIG. 6, for example, it is preferable that a high-level potential be supplied to the wiring RWLA to turn on the transistor M8 and the transistor M8*b* and a high-level potential be supplied to the wiring RDL and the wiring RDLb in the period from Time T24 to Time T25 in the timing chart of FIG. 3. Thus, the ground potential is supplied to the first terminal of the transistor M7 and the high-level potential is supplied to the second terminal of the transistor M7, so that the amount of current flowing between the first terminal and the second terminal of the transistor M7 depends on the potential of the gate of the transistor M7 (the output terminal of the FTJ element FJAb). Simultaneously, the ground potential is supplied to the first terminal of the transistor M7*b* and the high-level potential is supplied to the second terminal of the transistor M7*b*, so that the amount of current flowing between the first terminal and the second terminal of the transistor M7*b* depends on the potential of the gate of the transistor M7*b* (the output terminal of the FTJ element FJA). That is, the currents corresponding to the source-drain voltages of the transistor M7 and the transistor M7*b* flow through the wiring RDL and the wiring RDLb, respectively;

thus, conversion of the amounts of currents flowing through the wiring RDL and the wiring RDLb into voltage values by a current-voltage converter circuit or the like enables data to be read from the memory cell MC in FIG. 7, for example.

With the use of the memory cell MC described in this embodiment in a semiconductor device, a semiconductor device that does not need data rewriting (a semiconductor device that performs non-destructive reading) can be formed. Since the semiconductor device including the memory cell MC does not require data rewriting, power consumption for rewriting can be cut off. In addition, the semiconductor device including the memory cell MC does not need to be provided with a circuit that performs data rewriting, thereby reducing the circuit area of the semiconductor device.

Note that this embodiment can be combined with any of the other embodiments described in this specification as appropriate.

Embodiment 2

In this embodiment, a memory device that can include the memory cell MC described in the above embodiment will be described.

Structure Example of Memory Device

Figure 8:
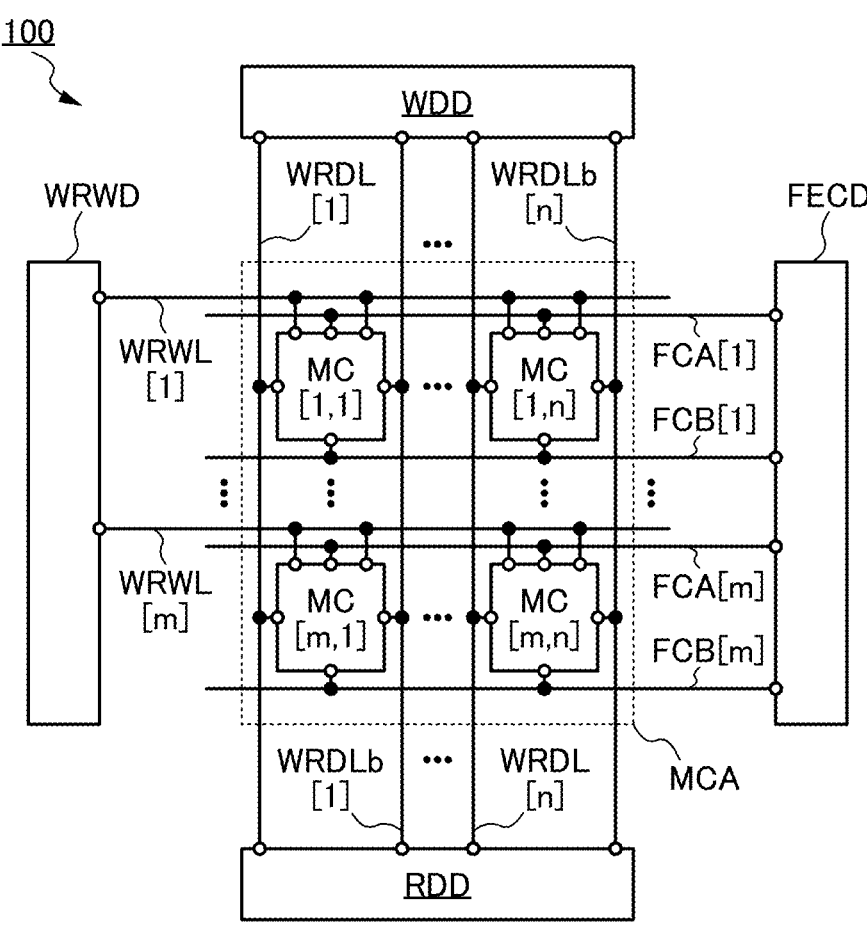
FIG. 8 is a block diagram illustrating a structure example of a memory device.

FIG. 8 illustrates an example of a circuit structure of the memory device. A memory device 100 includes a memory cell array MCA, a circuit WDD, a circuit WRWD, a circuit RDD, and a circuit FECD. Note that the memory cell MC that can be used in the memory device 100 in FIG. 8 is the memory cell MC in FIG. 1A (FIG. 1B) as an example.

The memory cell array MCA includes a plurality of memory cells MC. In the memory cell array MCA, the plurality of memory cells MC are arranged in a matrix of m rows and n columns (m and n are each an integer greater than or equal to 1). Note that in FIG. 8, the memory cell MC positioned in the i-th row and the j-th column (i is an integer greater than or equal to 1 and less than or equal to m, and j is an integer greater than or equal to 1 and less than or equal to n) is illustrated as a memory cell MC[i,j], for example.

In the memory cell array MCA of the memory device 100, a wiring WRDL[1] to a wiring WRDL[n] and a wiring WRDLb[1] to a wiring WRDLb[n] extend in the column direction. Note that [j] added to the wiring WRDL and the wiring WRDLb indicates that the wirings are in the j-th column. A wiring WRWL[1] to a wiring WRWL[m], a wiring FCA[1] to a wiring FCA[m], and a wiring FCB[1] to a wiring FCB[m] extend in the row direction. Note that [i] added to the wiring WRWL, the wiring FCA, and the wiring FCB indicates that the wirings are in the i-th row.

The wiring WRDL[1] to the wiring WRDL[n] correspond to the wiring WRDL in the memory cell MC in FIG. 1A (FIG. 1B). The wiring WRWL[1] to the wiring WRWL[m] correspond to the wiring WRDL in the memory cell MC in FIG. 1A (FIG. 1B), the wiring FCA[1] to the wiring FCA[m] correspond to the wiring FCA in the memory cell MC in FIG. 1A (FIG. 1B), and the wiring FCB[1] to the wiring FCB[m] correspond to the wiring FCB in the memory cell MC in FIG. 1A (FIG. 1B).

The circuit WDD is electrically connected to the wiring WRDL[1] to the wiring WRDL[n] and the wiring WRDLb[1] to the wiring WRDLb[n]. The circuit RDD is electrically connected to the wiring WRDL[1] to the wiring WRDL[n] and the wiring WRDLb[1] to the wiring WRDLb[n]. The circuit FECD is electrically connected to the wiring FCA[1] to the wiring FCA[m] and the wiring FCB[1] to the wiring FCB[m].

The circuit WRWD functions as, for example, a write word line driver circuit. For example, the circuit WRWD transmits a selection signal to one of the wiring WRWL[1] to the wiring WRWL[m] and transmits a non-selection signal to the other wirings, whereby a plurality of memory cells MC that perform a writing operation can be selected in the memory cell array MCA. Specifically, for example, in the case of the memory cell MC in FIG. 1A, the selection signal is a high-level potential and the non-selection signal is a low-level potential. In the case where a high-level potential is supplied to the wiring WRWL, the transistor M1 is turned on in the memory cell MC in FIG. 1A; thus, data for writing can be transmitted to the memory cell MC from the wiring WRDL and the wiring WRDLb. Meanwhile, in the case where a low-level potential is supplied to the wiring WRWL, the transistor M1 is turned off in the memory cell MC in FIG. 1A (FIG. 1B); thus, even when data to be written to another memory cell MC are transmitted from the wiring WRDL and the wiring WRDLb, the data are not written to the memory cell MC to which the low-level potential is supplied from the wiring WRWL.

The circuit WRWD functions also as, for example, a read word line driver circuit. For example, the circuit WRWD transmits a selection signal to one of a wiring RWL[1] to a wiring RWL[m] and transmits a non-selection signal to the other wirings, whereby a plurality of memory cells MC that perform a reading operation can be selected in the memory cell array MCA. Specifically, for example, in the case of the memory cell MC in FIG. 1A, the selection signal is a high-level potential and the non-selection signal is a low-level potential. When a high-level potential is supplied to the wiring WRWL, the transistor M1 is turned on in the memory cell MC in FIG. 1A; thus, data retained in the memory cell MC can be transmitted to the wiring WRDL and the wiring WRDLb from the memory cell MC. Meanwhile, when a low-level potential is supplied to the wiring WRWL, the transistor M1 and the transistor M1$b$ are turned off in the memory cell MC in FIG. 1A; thus, the data retained in the memory cell MC are not transmitted from the memory cell MC to the wiring WRDL and the wiring WRDLb.

The circuit FECD has a function of supplying potentials to the wiring FCA and the wiring FCB, for example. Specifically, for example, the circuit FECD supplies potentials to the wiring FCA and the wiring FCB at the time of writing data to the memory cell MC, thereby causing polarization (changing the direction of polarization) in the FTJ element FJA and the FTJ element FJAb included in each of the plurality of memory cells MC. Alternatively, the circuit FECD supplies potentials to the wiring FCA and the wiring FCB at the time of reading data from the memory cell MC, so that the potentials of the output terminals of the FTJ element FJA and the FTJ element FJAb are determined in accordance with the direction of polarization in each of the FTJ element FJA and the FTJ element FJAb.

The circuit WDD functions as, for example, a write data line driver circuit. For example, the circuit WDD transmits data for writing (e.g., voltage) to the wiring WRDL[1] to the wiring WRDL[n] and the wiring WRDL[1] to the wiring WRDL[n], thereby writing the data for writing to a plurality of memory cells MC arranged in a specified row selected by the circuit WRWD.

The circuit RDD functions as, for example, a read circuit. For example, the circuit RDD can obtain, from the wiring WRDL[1] to the wiring WRDL[n] and the wiring WRDLb

[1] to the wiring WRDLb[n], data (e.g., voltage or current) output from a plurality of memory cells MC arranged in a specified row selected by the circuit WRWD and thus can read the data. The circuit WDD includes, for example, one or more selected from a precharge circuit, a sense amplifier circuit, a current-voltage converter circuit, and the like.

Operation Example of Memory Device

Next, operation examples of the memory device 100 will be described.

Writing Operation Example 1

Figure 9:
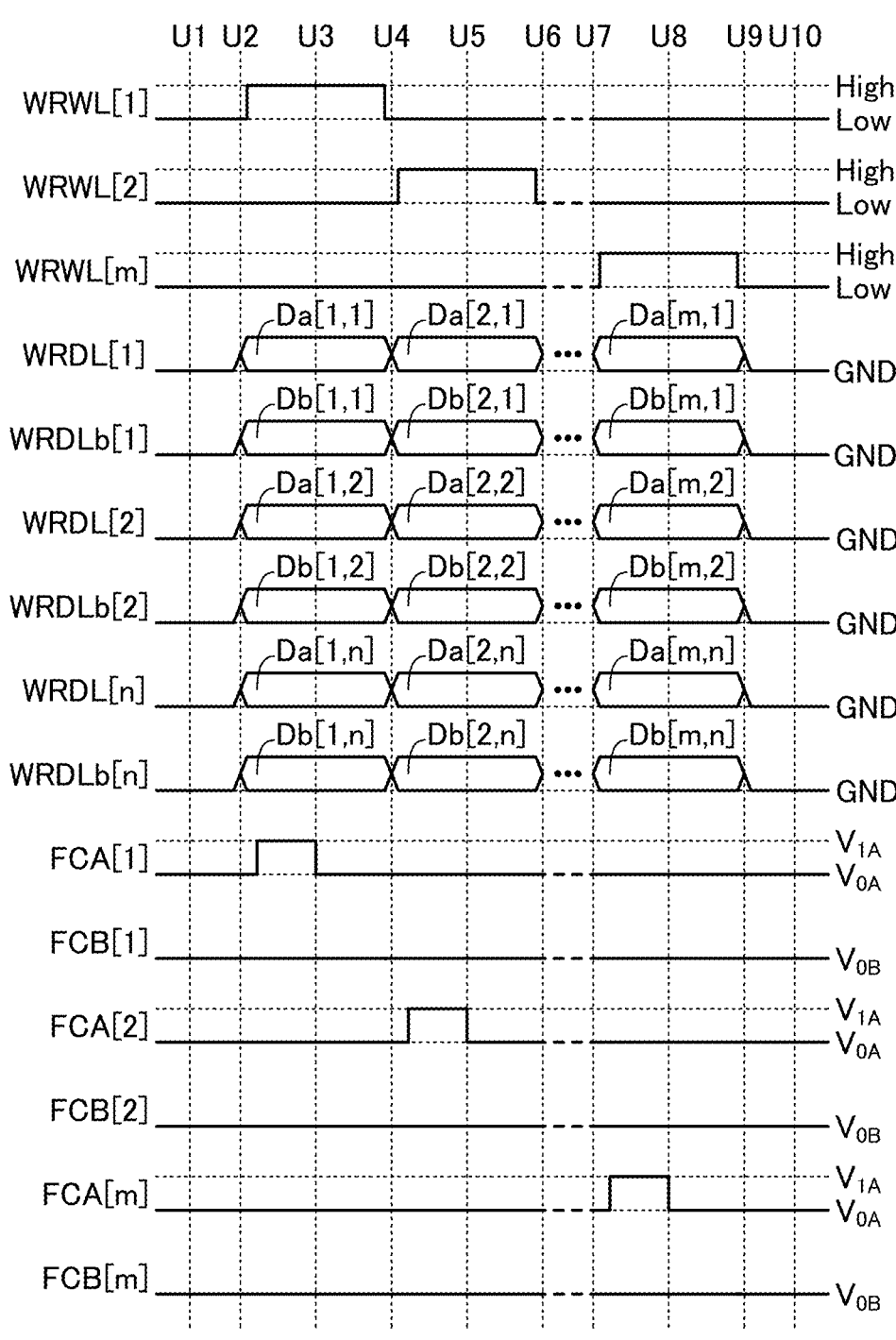
FIG. 9 is a timing chart showing an operation example of a memory device.

FIG. 9 is a timing chart showing an example of the operation of writing data to the memory cells MC of the memory device 100. Note that the timing chart in FIG. 2, which is described in the above embodiment, shows the operation example of one memory cell MC; whereas the timing chart in FIG. 9 shows an example of the operation of writing data to a plurality of memory cells MC included in the memory cell array MCA.

The timing chart in FIG. 9 shows changes in potentials of the wiring WRWL[1], the wiring WRWL[2], the wiring WRWL[m], the wiring WRDL[1], the wiring WRDLb[1], the wiring WRDL[2], the wiring WRDLb[2], the wiring WRDL[n], the wiring WRDLb[n], the wiring FCA[1], the wiring FCB[1], the wiring FCA[2], the wiring FCB[2], the wiring FCA[m], and the wiring FCB[m] in a period from Time U1 to Time U10 and around the period.

In the period from Time U1 to Time U2, for example, the circuit WRWD supplies a low-level potential (denoted as Low in FIG. 9) as an initial potential to the wiring WRWL[1] to the wiring WRWL[m]. Thus, the low-level potential is supplied to the gates of the transistors M1 in all the memory cells MC included in the memory cell array MCA, so that the transistors M1 are in the off state.

In the period from Time U1 to Time U2, the circuit WDD does not transmit data for writing to the wiring WRDL[1] to the wiring WRDL[n] and the wiring WRDLb[1] to the wiring WRDLb[n]. Thus, in the period from Time U1 to Time U2, the circuit WDD supplies the ground potential, for example, to the wiring WRDL[1] to the wiring WRDL[n] and the wiring WRDLb[1] to the wiring WRDLb[n].

In the period from Time U1 to Time U2, electrical continuity between the circuit RDD and each of the wiring WRDL[1] to the wiring WRDL[n] and the wiring WRDLb[1] to the wiring WRDLb[n] may be broken by a switch or the like included in the circuit RDD or the like. When electrical continuity between the circuit RDD and each of the wiring WRDL[1] to the wiring WRDL[n] and the wiring WRDLb[1] to the wiring WRDLb[n] is broken, data for writing transmitted from the circuit WDD to the wiring WRDL[1] to the wiring WRDL[n] and the wiring WRDLb[1] to the wiring WRDLb[n] are not input to the circuit RDD, thereby sometimes reducing power consumption required for transmitting the data for writing from the circuit WDD to the wiring WRDL[1] to the wiring WRDL[n] and the wiring WRDLb[1] to the wiring WRDLb[n].

In the period from Time U1 to Time U2, the circuit FECD supplies the potential $V_{OA}$ to the wiring FCA[1] to the wiring FCA[m] and the potential $V_{OB}$ to the wiring FCB[1] to the wiring FCB[m]. Note that refer to the description of the timing chart in FIG. 2 for the potential $V_{OA}$ and the potential $V_{OB}$.

In the period from Time U2 to Time U4, the circuit WRWD supplies a high-level potential (denoted as High in FIG. 9) to the wiring WRWL[1] and supplies a low-level potential to the wiring WRWL[2] to the wiring WRWL[m]. Accordingly, in the memory cell array MCA, the high-level potential is supplied to the gates of the transistors M1 and the transistors M1*b* included in the memory cell MC[1,1] to the memory cell MC[1,*n*] arranged in the first row; hence, the transistors M1 and the transistors M1*b* included in the memory cell MC[1,1] to the memory cell MC[1,*n*] are turned on. Moreover, in the memory cell array MCA, the low-level potential is supplied to the gates of the transistors M1 and the transistors M1*b* included in the memory cell MC[2,1] to the memory cell MC[m,n] arranged in the second row to the m-th row; thus, the transistors M1 and the transistors M1*b* included in the memory cell MC[2,1] to the memory cell MC[m,n] are turned off. That is, the circuit WRWD can select the memory cells MC arranged in the first row of the memory cell array MCA as writing targets by supplying a high-level potential to the wiring WRWL[1] and supplying a low-level potential to the wiring WRWL[2] to the wiring WRWL[m].

In the period from Time U2 to Time U4, the circuit WDD supplies Da[1,1] to Da[1,*n*], for example, which are part of data for rewriting, to the wiring WRDL[1] to the wiring WRDL[n], respectively. In addition, the circuit WDD supplies db[1,1] to db[1,*n*], for example, as data for writing to the wiring WRDLb[1] to the wiring WRDLb[n], respectively. In the case where Da[1,*j*] and db[1,*j*] (here, j is an integer greater than or equal to 1 and less than or equal to n) are digital values, for example, Da[1,*j*] and db[1,*j*] are preferably data with inverted logic. Specifically, it is preferable that when a potential corresponding to Da[1,*j*] is $V_0$, a potential corresponding to db[1,*j*] be $V_1$, or when the potential corresponding to Da[1,*j*] is $V_1$, the potential corresponding to db[1,*j*] be $V_0$. For $V_0$ and $V_1$, refer to the description of $V_0$ and $V_1$ in the operation example in the timing chart of FIG. 2. The memory cells MC arranged in the first row of the memory cell array MCA are selected as writing targets by the circuit WRWD; thus, the potentials corresponding to Da[1,1] to Da[1,*n*] are supplied to the second terminals of the transistors M1 in the memory cell MC[1,1] to the memory cell MC[1,*n*], and the potentials corresponding to db[1,1] to db[1,*n*] are supplied to the second terminals of the transistors M1*b* in the memory cell MC[1,1] to the memory cell MC[1,*n*].

In the period from Time U2 to Time U3, the circuit FECD supplies the potential $V_{1A}$ to the wiring FCA[1] and supplies the potential $V_{0B}$ to the wiring FCB[1]. Note that the circuit FECD supplies the potential $V_{0A}$ to the wiring FCA[2] to the wiring FCA[m] and supplies the potential $V_{0B}$ to the wiring FCB[2] to the wiring FCB[m].

In the period from Time U3 to Time U4, the circuit FECD supplies the potential $V_{0A}$ to the wiring FCA[1] and supplies the potential $V_{0B}$ to the wiring FCB[1]. Note that the circuit FECD continuously supplies the potential $V_{0A}$ to the wiring FCA[1] to the wiring FCA[m] and continuously supplies the potential $V_{0B}$ to the wiring FCB[2] to the wiring FCB[m].

Note that refer to the description of the timing chart in FIG. 2 for the potential $V_{1A}$ and the potential $V_{1B}$.

By the operation in the period from Time U2 to Time U4, the direction of polarization that occurs in the FTJ element FJA and the FTJ element FJAb included in each of the memory cell MC[1,1] to the memory cell MC[1,*n*] in the first row of the memory cell array MCA is determined in accordance with Da[1,1] to Da[1,*n*] transmitted from the wiring WRDL[1] to the wiring WRDL[n] and db[1,1] to db[1,*n*] transmitted from the wiring WRDLb[1] to the wiring WRDLb[n]. That is, when attention is focused on the j-th column, Da[1,*j*] and db[1,*j*] are written to the memory cell MC[1,*j*] by the operation from Time U2 to Time U4.

In the period from Time U4 to Time U6, the circuit WRWD supplies a high-level potential to the wiring WRWL[2] and supplies a low-level potential to the wiring WRWL[1] and the wiring WRWL[3] to the wiring WRWL[m]. Accordingly, in the memory cell array MCA, the high-level potential is supplied to the gates of the transistors M1 and the transistors M1*b* included in the memory cell MC[2,1] to the memory cell MC[2,*n*] arranged in the second row; hence, the transistors M1 and the transistors M1*b* included in the memory cell MC[2,1] to the memory cell MC[2,*n*] are turned on. Moreover, in the memory cell array MCA, the high-level potential is supplied to the gates of the transistors M1 and the transistors M1*b* included in the memory cell MC[1,1] to the memory cell MC[1,*n*] and the memory cell MC[3,1] to the memory cell MC[m,n] arranged in the first row and the third row to the m-th row; thus, the transistors M1 and the transistors M1*b* included in the memory cell MC[1,1] to the memory cell MC[1,*n*] and the memory cell MC[3,1] to the memory cell MC[m,n] are turned off. That is, the circuit WRWD can select the memory cells MC arranged in the second row of the memory cell array MCA as writing targets by supplying a high-level potential to the wiring WRWL[2] and supplying a low-level potential to the wiring WRWL[1] and the wiring WRWL[3] to the wiring WRWL[m].

In the period from Time U4 to Time U6, the circuit WDD supplies Da[2,1] to Da[2,*n*], for example, which are part of data for writing, to the wiring WRDL[1] to the wiring WRDL[n], respectively. In addition, the circuit WDD supplies db[2,1] to db[2,*n*], for example, as data for writing to the wiring WRDLb[1] to the wiring WRDLb[n], respectively. In the case where Da[2,*j*] and db[2,*j*] are digital values, for example, Da[2,*j*] and db[2,*j*] are preferably data with inverted logic. Specifically, it is preferable that when a potential corresponding to Da[2,*j*] is $V_0$, a potential corresponding to db[2,*j*] be $V_1$, or when the potential corresponding to Da[2,*j*] is $V_1$, the potential corresponding to db[2,*j*] be $V_0$. For $V_0$ and $V_1$, refer to the description of $V_0$ and $V_1$ in the operation example in the timing chart of FIG. 2. The memory cells MC arranged in the second row of the memory cell array MCA are selected as writing targets by the circuit WRWD; thus, the potentials corresponding to Da[2,1] to Da[2,*n*] are supplied to the second terminals of the transistors M1 in the memory cell MC[2,1] to the memory cell MC[2,*n*], and the potentials corresponding to db[2,1] to db[2,*n*] are supplied to the second terminals of the transistors M1*b* in the memory cell MC[2,1] to the memory cell MC[2,*n*].

In the period from Time U4 to Time U5, the circuit FECD supplies the potential $V_{1A}$ to the wiring FCA[2] and supplies the potential $V_{0B}$ to the wiring FCB[2]. Note that the circuit FECD supplies the potential $V_{0A}$ to the wiring FCA[1] and the wiring FCA[3] to the wiring FCA[m] and supplies the potential $V_{0B}$ to the wiring FCB[1] and the wiring FCB[3] to the wiring FCB[m].

In the period from Time U5 to Time U6, the circuit FECD supplies the potential $V_{0A}$ to the wiring FCA[2] and supplies the potential $V_{0B}$ to the wiring FCB[2]. Note that the circuit FECD continuously supplies the potential $V_{0A}$ to the wiring FCA[1] and the wiring FCA[3] to the wiring FCA[m] and continuously supplies the potential $V_{0B}$ to the wiring FCB[1] and the wiring FCB[3] to the wiring FCB[m].

By the operation in the period from Time U4 to Time U6, the direction of polarization that occurs in the FTJ element FJA and the FTJ element FJAb included in each of the memory cell MC[2,1] to the memory cell MC[2,*n*] in the second row of the memory cell array MCA is determined in accordance with Da[2,1] to Da[2,*n*] transmitted from the wiring WRDL[1] to the wiring WRDL[n] and db[2,1] to db[2,*n*] transmitted from the wiring WRDLb[1] to the wiring WRDLb[n]. That is, when attention is focused on the j-th column, Da[2,*j*] and db[2,*j*] are written to the memory cell MC[2,*j*] by the operation from Time U4 to Time U6.

In the period from Time U6 to Time U7, the operation of writing data to the memory cells MC arranged in the third row to the (m−1)-th row of the memory cell array MCA is performed in a manner similar to that of the operation of writing data to the memory cells MC arranged in the first row of the memory cell array MCA in the period from Time U2 to Time U4, and the operation of writing data to the memory cells MC arranged in the second row of the memory cell array MCA in the period from Time U4 to Time U6.

In the period from Time U7 to Time U9, the circuit WRWD supplies a high-level potential to the wiring WRWL [m] and supplies a low-level potential to the wiring WRWL [1] to the wiring WRWL[m−1]. Accordingly, in the memory cell array MCA, the high-level potential is supplied to the gates of the transistors M1 and the transistors M1*b* included in the memory cell MC[m,1] to the memory cell MC[m,n] arranged in the m-th row; hence, the transistors M1 and the transistors M1*b* included in the memory cell MC[m,1] to the memory cell MC[m,n] are turned on. Moreover, in the memory cell array MCA, the low-level potential is supplied to the gates of the transistors M1 and the transistors M1*b* included in the memory cell MC[1,1] to the memory cell MC[m−1,n] arranged in the first row to the (m−1)-th row; thus, the transistors M1 and the transistors M1*b* included in the memory cell MC[1,1] to the memory cell MC[m−1,n] are turned off. That is, the circuit WRWD can select the memory cells MC arranged in the first row of the memory cell array MCA as writing targets by supplying a high-level potential to the wiring WRWL[1] and supplying a low-level potential to the wiring WRWL[2] to the wiring WRWL[m].

In the period from Time U7 to Time U9, the circuit WDD supplies Da[m,1] to Da[m,n], for example, which are part of data for rewriting, to the wiring WRDL[1] to the wiring WRDL[n], respectively. In addition, the circuit WDD supplies db[m,1] to db[m,n], for example, as data for writing to the wiring WRDLb[1] to the wiring WRDLb[n], respectively. In the case where Da[m,j] and db[m,j] are digital values, for example, Da[m,j] and db[m,j] are preferably data with inverted logic. Specifically, it is preferable that when a potential corresponding to Da[m,j] is $V_0$, a potential corresponding to db[m,j] be $V_1$, or when the potential corresponding to Da[m,j] is $V_1$, the potential corresponding to db[m,j] be $V_0$. For $V_0$ and $V_1$, refer to the description of $V_0$ and $V_1$ in the operation example in the timing chart of FIG. 2. The memory cells MC arranged in the first row of the memory cell array MCA are selected as writing targets by the circuit WRWD; thus, the potentials corresponding to Da[m,1] to Da[m,n] are supplied to the second terminals of the transistors M1 in the memory cell MC[m,1] to the memory cell MC[m,n], and the potentials corresponding to db[m,1] to db[m,n] are supplied to the second terminals of the transistors M1*b* in the memory cell MC[m,1] to the memory cell MC[m,n].

In the period from Time U7 to Time U8, the circuit FECD supplies the potential $V_{1A}$ to the wiring FCA[m] and supplies the potential $V_{0B}$ to the wiring FCB[m]. Note that the circuit FECD supplies the potential $V_{0A}$ to the wiring FCA [1] to the wiring FCA[m−1] and supplies the potential $V_{0B}$ to the wiring FCB[1] to the wiring FCB[m−1].

In the period from Time U8 to Time U9, the circuit FECD supplies the potential $V_{0A}$ to the wiring FCA[m] and supplies the potential $V_{0B}$ to the wiring FCB[m]. Note that the circuit FECD continuously supplies the potential $V_{0A}$ to the wiring FCA[1] to the wiring FCA[m−1] and continuously supplies the potential $V_{0B}$ to the wiring FCB[1] to the wiring FCB[m−1].

By the operation in the period from Time U7 to Time U9, the direction of polarization that occurs in the FTJ element FJA and the FTJ element FJAb included in each of the memory cell MC[m,1] to the memory cell MC[m,n] in the m-th row of the memory cell array MCA is determined in accordance with Da[m,1] to Da[m,n] transmitted from the wiring WRDL[1] to the wiring WRDL[n] and db[m,1] to db[m,n] transmitted from the wiring WRDLb[1] to the wiring WRDLb[n]. That is, when attention is focused on the j-th column, Da[m,j] and db[m,j] are written to the memory cell MC[m,j] by the operation from Time U7 to Time U8.

By the operation from Time U1 to Time U10, D[1,1] to D[m,n] can be respectively written to the memory cell MC[1,1] to the memory cell MC[m,n] included in the memory cell array MCA.

Note that in the timing chart of FIG. 9, as the operation after the operation of writing data to the memory cell MC[1,1] to the memory cell MC[m,n] ends (operation in the period from Time U9 to Time U10), the circuit WRWD supplies a low-level potential to the wiring WRWL[1] to the wiring WRWL[m], for example. The circuit WDD supplies the ground potential to the wiring WRDL[1] to the wiring WRDL[n], for example. The circuit FECD supplies the potential $V_{0A}$ to the wiring FCA[1] to the wiring FCA[m] and the potential $V_{0B}$ to the wiring FCB[1] to the wiring FCB[m], for example.

Since the operation in the timing chart of FIG. 9 is an example, the operation may be changed depending on circumstances or conditions. For example, in the operation in the period from Time U2 to Time U4 in the timing chart of FIG. 9, a high-level potential is supplied to the wiring WRWL[1], Da[1,1] to Da[1,*n*] are supplied to the wiring WRDL[1] to the wiring WRDL[n], and db[1,1] to db[1,*n*] are supplied to the wiring WRDLb[1] to the wiring WRDLb [n]; alternatively, Da[1,1] to Da[1,*n*] may be supplied to the wiring WRDL[1] to the wiring WRDL[n] and db[1,1] to db[1,*n*] may be supplied to the wiring WRDLb[1] to the wiring WRDLb[n] in a period during which a high-level potential is supplied to the wiring WRWL[1]. Alternatively, a high-level potential may be supplied to the wiring WRWL [1] in a period during which Da[1,1] to Da[1,*n*] are supplied to the wiring WRDL[1] to the wiring WRDL[n] and db[1,1] to db[1,*n*] are supplied to the wiring WRDLb[1] to the wiring WRDLb[n]. The period during which the potential $V_{1A}$ is supplied to the wiring FCA[1] and the potential $V_{0B}$ is supplied to the wiring FCB[1] and the period during which the potential $V_{0A}$ is supplied to the wiring FCA[1] and the potential $V_{0B}$ is supplied to the wiring FCB[1] may be at any timing as long as they are within the period during which a high-level potential is supplied to the wiring WRWL[1], Da[1,1] to Da[1,*n*] are supplied to the wiring WRDL[1] to the wiring WRDL[n], and db[1,1] to db[1,*n*] are supplied to the wiring WRDLb[1] to the wiring WRDLb[n]. The period during which the potential $V_{0A}$ is supplied to the wiring FCA[1] and the potential $V_{0B}$ is supplied to the wiring FCB[1] may be prior to the period during which the potential $V_{1A}$ is supplied to the wiring FCA[1] and the potential $V_{0B}$ is supplied to the wiring FCB[1].

Writing Operation Example 2

Next, an example of the operation of writing data to the memory cells MC of the memory device 100, which is different from that in the timing chart of FIG. 9, will be described.

Figure 10:
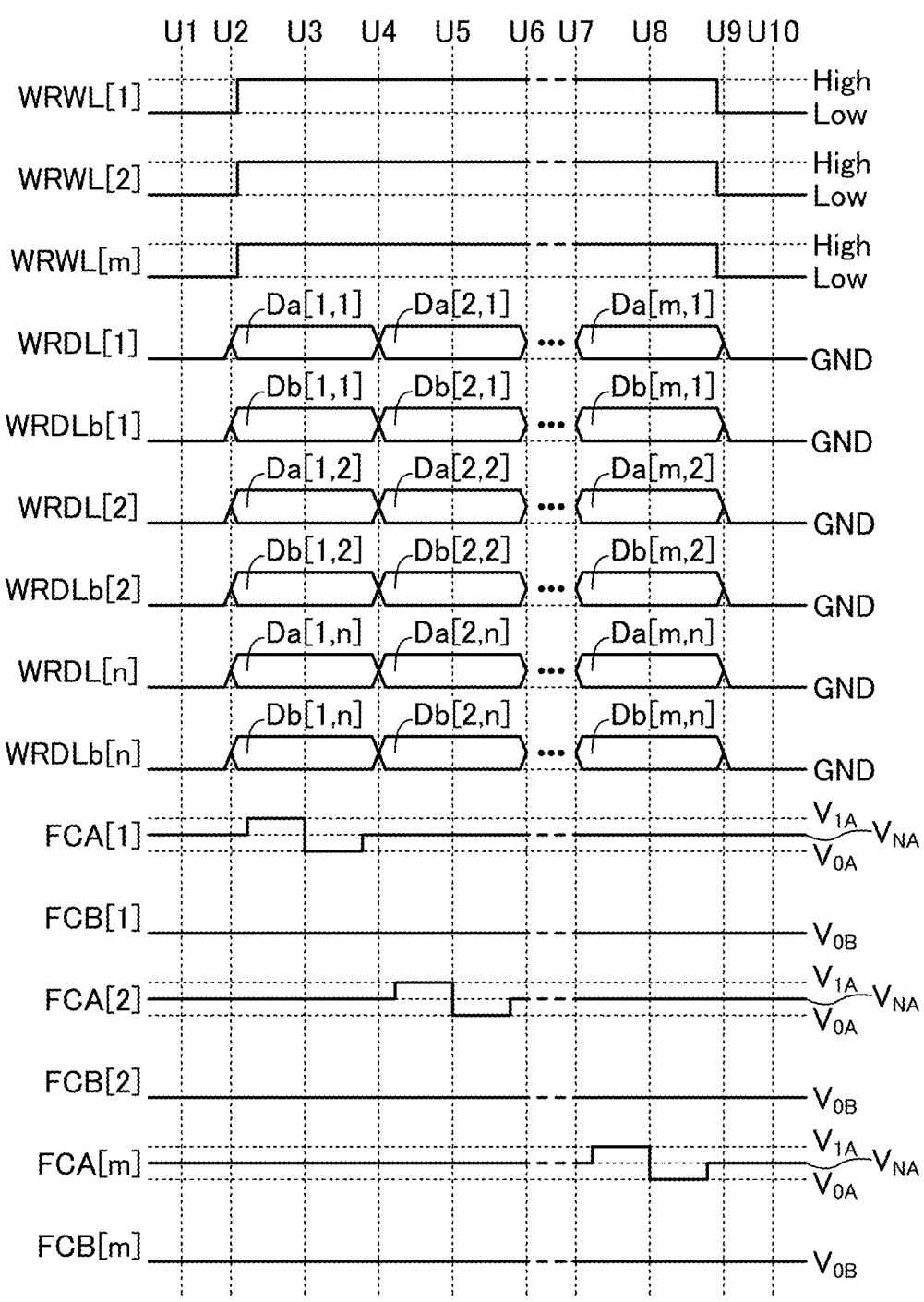
FIG. 10 is a timing chart showing an operation example of a memory device.

A timing chart in FIG. 10 shows a writing operation example different from the writing operation example in the timing chart of FIG. 9. Like the timing chart in FIG. 9, the timing chart in FIG. 10 shows changes in the potentials of the wiring WRWL[1], the wiring WRWL[2], the wiring WRWL[m], the wiring WRDL[1], the wiring WRDLb[1], the wiring WRDL[2], the wiring WRDLb[2], the wiring WRDL[n], the wiring WRDLb[n], the wiring FCA[1], the wiring FCB[1], the wiring FCA[2], the wiring FCB[2], the wiring FCA[m], and the wiring FCB[m] in the period from Time U1 to Time U10 and around the period.

The writing operation in the timing chart of FIG. 10 differs from the writing operation in the timing chart of FIG. 9 in that a high-level potential is input to the wiring WRWL[1] to the wiring WRWL[m] in the period from Time U2 to Time U9, and in potential changes of the wiring FCA[1] to the wiring FCA[m] in the period from Time U1 to Time U9.

Since a high-level potential is input to the wiring WRWL[1] to the wiring WRWL[m] in the period from Time U2 to Time U9 in the timing chart of FIG. 10, the high-level potential is input to the gates of the transistors M1 and the transistors M1$b$ in the memory cell MC[1,1] to the memory cell MC[m,n] included in the memory cell array MCA in the period from Time U2 to Time U9; thus, the transistors M1 and the transistors M1$b$ in the memory cell MC[1,1] to the memory cell MC[m,n] are turned on. That is, when attention is focused on the j-th column, electrical continuity is established between the wiring WRDL[j] and the second terminals of the transistors M1 in the memory cell MC[1,$j$] to the memory cell MC[m,j], and electrical continuity is established between the wiring WRDLb[j] and the second terminals of the transistors M1$b$ in the memory cell MC[1,$j$] to the memory cell MC[m,j].

In the period from Time U1 to Time U2 in the timing chart of FIG. 10, a potential $V_{NA}$ is supplied to the wiring FCA[1] to the wiring FCA[m].

Note that $V_{NA}$ is set to a potential with which polarization does not occur (change) in the FTJ element FJA with respect to all the pieces of data (potentials) input from the wiring WRDL to the second terminals of the transistors M1 and is set to a potential with which polarization does not occur (change) in the FTJ element FJAb with respect to all the pieces of data (potentials) input from the wiring WRDLb to the second terminals of the transistors M1$b$. For example, $V_{NA}$ can be a potential higher than $V_{OA}$ and lower than $V_{1A}$.

In the period from Time U2 to Time U3 in the timing chart of FIG. 10, the potential $V_{1A}$ is supplied to the wiring FCA[1] and the potential $V_{OB}$ is supplied to the wiring FCB[1]. Note that the potential $V_{NA}$ is continuously supplied to the wiring FCA[2] to the wiring FCA[m] and the potential $V_{OB}$ is continuously supplied to the wiring FCB[2] to the wiring FCB[m].

In the period from Time U3 to Time U4 in the timing chart of FIG. 10, the potential $V_{OA}$ is supplied to the wiring FCA[1] and the potential $V_{OB}$ is supplied to the wiring FCB[1]. Note that the potential $V_{NA}$ is continuously supplied to the wiring FCA[2] to the wiring FCA[m] and the potential $V_{OB}$ is continuously supplied to the wiring FCB[2] to the wiring FCB[m].

By the operation in the period from Time U2 to Time U4 in the timing chart of FIG. 10, the direction of polarization that occurs in the FTJ element FJA included in each of the memory cell MC[1,1] to the memory cell MC[1,$n$] in the first row of the memory cell array MCA is determined in accordance with Da[1,1] to Da[1,$n$] transmitted from the wiring WRDL[1] to the wiring WRDL[n], and the direction of polarization that occurs in the FTJ element FJAb included in each of the memory cell MC[1,1] to the memory cell MC[1,$n$] in the first row of the memory cell array MCA is determined in accordance with db[1,1] to db[1,$n$] transmitted from the wiring WRDL[1] to the wiring WRDL[n]. Meanwhile, since the potential $V_{NA}$ is supplied to the wiring FCA[2] to the wiring FCA[m] and the potential $V_{OB}$ is supplied to the wiring FCB[2] to the wiring FCB[m] in the period from Time U2 to Time U4, Da[1,1] to Da[1,$n$] and db[1,1] to db[1,$n$] are not written to the memory cells MC in each column even when the transistors M1 in the memory cell MC[2,1] to the memory cell MC[m,n] are turned on.

That is, in the operation in the timing chart of FIG. 10, the wiring FCA[1] to the wiring FCA[m] and the wiring FCB[1] to the wiring FCB[m] can function not only as wirings for controlling polarization in the FTJ element FJA and the FTJ element FJAb but also as selection signal lines for data writing.

After Time U4 in the timing chart of FIG. 10, the memory cells MC in the second row to the m-th row of the memory cell array MCA are selected by using the wiring FCA[1] to the wiring FCA[m] and the wiring FCB[1] to the wiring FCB[m] in accordance with data transmitted from the wiring WRDL[1] to the wiring WRDL[n] and the wiring WRDLb[1] to the wiring WRDLb[n]; hence, as in the operation example in the timing chart of FIG. 9, D[1,1] to D[m,n] can be written to the memory cell MC[1,1] to the memory cell MC[m,n] included in the memory cell array MCA.

Reading Operation Example 1

Figure 11:
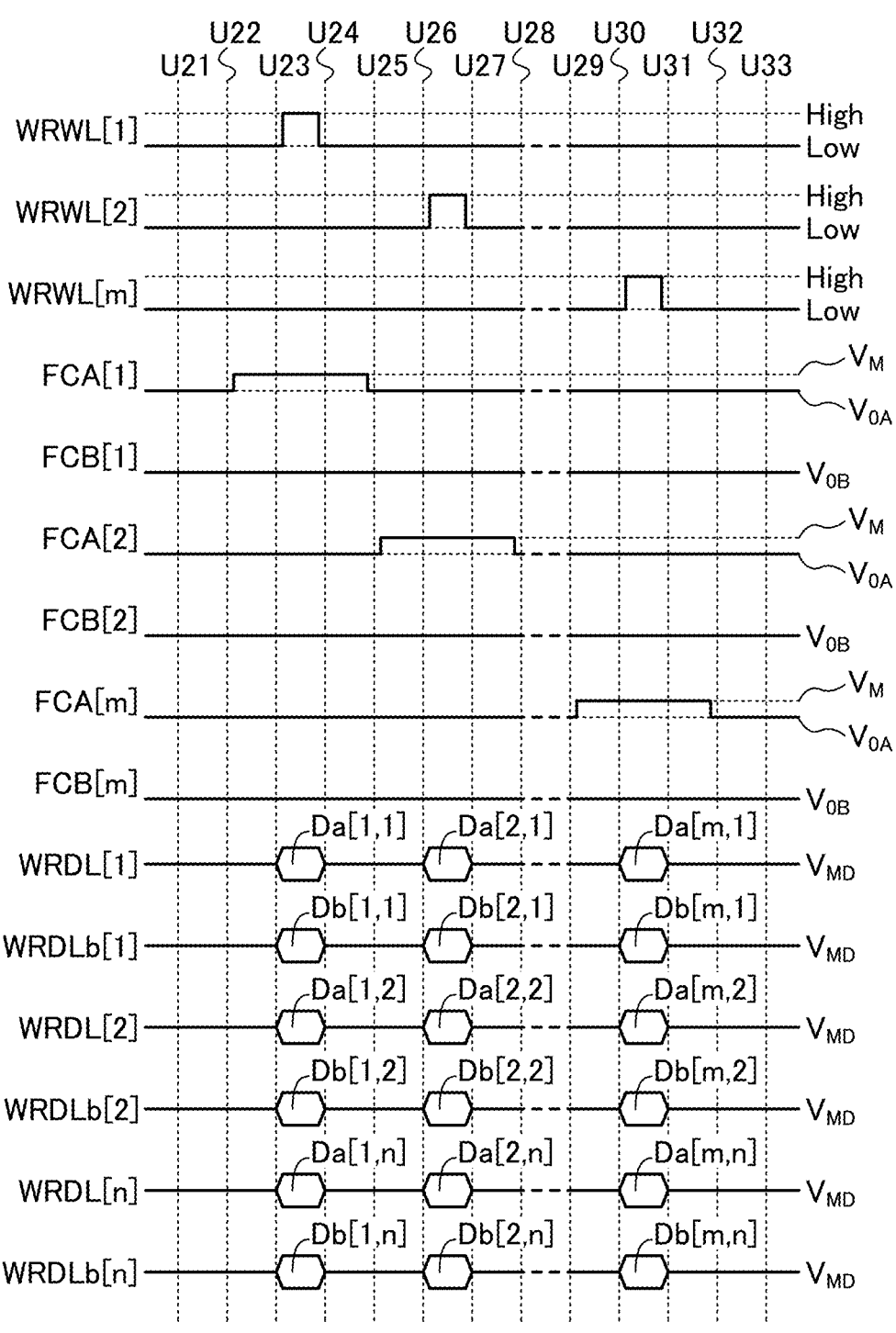
FIG. 11 is a timing chart showing an operation example of a memory device.

FIG. 11 is a timing chart showing an example of the operation of reading data from the memory cells MC of the memory device 100. Note that the timing chart in FIG. 3, which is described in the above embodiment, shows the operation example of one memory cell MC; whereas the timing chart in FIG. 11 shows an example of the operation of writing data to a plurality of memory cells MC included in the memory cell array MCA.

The timing chart in FIG. 11 shows changes in the potentials of the wiring WRWL[1], the wiring WRWL[2], the wiring WRWL[m], the wiring FCA[1], the wiring FCB[1], the wiring FCA[2], the wiring FCB[2], the wiring FCA[m], the wiring FCB[m], the wiring WRDL[1], the wiring WRDLb[1], the wiring WRDL[2], the wiring WRDLb[2], the wiring WRDL[n], and the wiring WRDLb[n] in a period from Time U21 to Time U33 and around the period.

In the period from Time U21 to Time U22, for example, the circuit WRWD supplies a low-level potential (denoted as Low in FIG. 11) as an initial potential to the wiring WRWL[1] to the wiring WRWL[m]. Thus, the low-level potential is supplied to the gates of the transistors M1 and the transistors M1$b$ in all the memory cells MC included in the memory cell array MCA, so that the transistors M1 and the transistors M1$b$ are in the off state.

In the period from Time U21 to Time U22, the circuit FECD supplies the potential $V_{OA}$ to the wiring FCA[1] to the wiring FCA[m] and supplies the potential $V_{OB}$ to the wiring FCB[1] to the wiring FCB[m]. Note that refer to the description of the timing charts in FIG. 2, FIG. 3, and the like for the potential $V_{OA}$ and the potential $V_{OB}$.

In the period from Time U21 to Time U22, the potential $V_{MD}$ is supplied to the wiring WRDL[1] to the wiring WRDL[n] and the wiring WRDLb[1] to the wiring WRDLb [n], for example. For $V_{MD}$, refer to the description of the timing charts in FIG. 3 and the like.

In the period from Time U22 to Time U25, the circuit FECD supplies the potential $V_M$ to the wiring FCA[1] and supplies the potential $V_{OB}$ to the wiring FCB[1]. In addition, the circuit FECD supplies the potential $V_{OA}$ to the wiring FCA[2] to the wiring FCA[m] and supplies the potential $V_{OB}$ to the wiring FCB[2] to the wiring FCB[m]. At this time, a voltage $V_M$-$V_{OB}$ is applied between the wiring FCA[1] and the wiring FCB[1]; thus, voltages obtained by dividing the voltage are applied to the FTJ elements FJA and the transistors M6 in the memory cell MC[1,1] to the memory cell MC[1,$n$] in the first row of the memory cell array MCA. Similarly, the voltages obtained by dividing the voltage are applied to the FTJ elements FJAb and the transistors M6$b$ in the memory cell MC[1,1] to the memory cell MC[1,$n$] in the first row of the memory cell array MCA. The divided voltages applied to the FTJ elements FJA depend on the direction of polarization in the dielectrics having ferroelectricity in the FTJ elements FJA, and the divided voltages applied to the FTJ elements FJAb depend on the direction of polarization in the dielectrics having ferroelectricity in the FTJ elements FJAb. That is, the divided voltages applied to the FTJ elements FJA and the FTJ elements FJAb are determined by the data written to the corresponding memory cells MC.

In the period from Time U23 to Time U24, the circuit WRWD supplies a high-level potential (denoted as High in FIG. 11) to the wiring WRWL[1]. In addition, the circuit WRWD supplies a low-level potential to the wiring WRWL [2] to the wiring WRWL[m]. Accordingly, in the memory cell array MCA, the high-level potential is supplied to the gates of the transistors M1 and the transistors M1$b$ included in the memory cell MC[1,1] to the memory cell MC[1,$n$] arranged in the first row; hence, the transistors M1 and the transistors M1$b$ included in the memory cell MC[1,1] to the memory cell MC[1,$n$] are turned on. Moreover, in the memory cell array MCA, the low-level potential is supplied to the gates of the transistors M1 and the transistors M1$b$ included in the memory cell MC[2,1] to the memory cell MC[m,n] arranged in the second row to the m-th row; thus, the transistors M1 and the transistors M1$b$ included in the memory cell MC[2,1] to the memory cell MC[m,n] are turned off.

That is, the circuit FECD supplies the potential $V_M$ to the wiring FCA[1], supplies the potential $V_{OB}$ to the wiring FCB[1], supplies the potential $V_{OA}$ to the wiring FCA[2] to the wiring FCA[m], and supplies the potential $V_{OB}$ to the wiring FCB[1] to the wiring FCB[m], and the circuit WRWD supplies a high-level potential to the wiring WRWL [1] and supplies a low-level potential to the wiring WRWL [2] to the wiring WRWL[m], whereby the memory cells MC arranged in the first row of the memory cell array MCA can be selected as reading targets.

When attention is focused on the memory cell MC in the first row and the j-th column of the memory cell array MCA in the period from Time U23 to Time U24, electrical continuity is established between the wiring WRDL[j] and the second terminal of the transistor M1 in the memory cell MC[1,$j$]; thus, current corresponding to the divided voltage applied to the FTJ element FJA in the memory cell MC[1,$j$] flows through the wiring WRDL[j]. Alternatively, the potential of the wiring WRDL[j] changes in accordance with the divided voltage applied to the FTJ element FJA in the memory cell MC[1,$j$]. That is, as the data retained in the FTJ element FJA in the memory cell MC[1,$j$], information (e.g., current or voltage) corresponding to Da[1,$j$] is transmitted to the wiring WRDL[j].

When attention is focused on the memory cell MC in the first row and the j-th column of the memory cell array MCA in the period from Time U23 to Time U24, electrical continuity is established between the wiring WRDLb[j] and the second terminal of the transistor M1$b$ in the memory cell MC[1,$j$]; thus, current corresponding to the divided voltage applied to the FTJ element FJAb in the memory cell MC[1,$j$] flows through the wiring WRDLb[j]. Alternatively, the potential of the wiring WRDLb[j] changes in accordance with the divided voltage applied to the FTJ element FJAb in the memory cell MC[1,$j$]. That is, as the data retained in the FTJ element FJAb in the memory cell MC[1,$j$], information (e.g., current or voltage) corresponding to db[1,$j$] is transmitted to the wiring WRDLb[j].

The above description also applies to the memory cells MC in the columns other than the j-th column; the retained data are transmitted from the memory cell MC[1,1] to the memory cell MC[1,$n$] arranged in the first row of the memory cell array MCA in the period from Time U23 to Time U24.

Specifically, for example, the data Da[1,1] and db[1,1] are read from the memory cell MC[1,1], and the data Da[1,$n$] and db[1,$n$] are read from the memory cell MC[1,$n$]. At this time, the circuit RDD or the like obtains information (e.g., current or voltage) transmitted to the wiring WRDL[1] and the wiring WRDLb[1], whereby Da[1,1] and db[1,1] retained in the memory cell MC[1,1] can be read. Meanwhile, the circuit RDD or the like obtains information (e.g., current or voltage) transmitted to the wiring WRDL[n] and the wiring WRDLb[n], whereby Da[1,$n$] and db[1,$n$] retained in the memory cell MC[1,$n$] can be read.

In the period from Time U25 to Time U27, the circuit FECD supplies the potential $V_M$ to the wiring FCA[2] and supplies the potential $V_{OB}$ to the wiring FCB[2]. In addition, the circuit FECD supplies the potential $V_{OA}$ to the wiring FCA[1] and the wiring FCA[3] to the wiring FCA[m] and supplies the potential $V_{OB}$ to the wiring FCB[1] and the wiring FCB[3] to the wiring FCB[m]. At this time, a voltage $V_M$-$V_{OB}$ is applied between the wiring FCA[2] and the wiring FCB[2]; thus, voltages obtained by dividing the voltage are applied to the FTJ elements FJA and the transistors M6 in the memory cell MC[2,1] to the memory cell MC[2,$n$] in the second row of the memory cell array MCA. Similarly, the voltages obtained by dividing the voltage are applied to the FTJ elements FJAb and the transistors M6$b$ in the memory cell MC[2,1] to the memory cell MC[2,$n$] in the second row of the memory cell array MCA. The divided voltages applied to the FTJ elements FJA depend on the direction of polarization in the dielectrics having ferroelectricity in the FTJ elements FJA, and the divided voltages applied to the FTJ elements FJAb depend on the direction of polarization in the dielectrics having ferroelectricity in the FTJ elements FJAb. That is, the divided voltages applied to the FTJ elements FJA and the FTJ elements FJAb are determined by the data written to the corresponding memory cells MC.

In the period from Time U26 to Time U27, the circuit WRWD supplies a high-level potential to the wiring RWL [2]. In addition, the circuit WRWD supplies a low-level potential to the wiring WRWL[1] and the wiring WRWL[3] to the wiring WRWL[m]. Accordingly, in the memory cell array MCA, the high-level potential is supplied to the gates of the transistors M1 and the transistors M1$b$ included in the memory cell MC[2,1] to the memory cell MC[2,$n$] arranged in the second row; hence, the transistors M1 and the transistors M1$b$ included in the memory cell MC[2,1] to the memory cell MC[2,$n$] are turned on. Moreover, in the memory cell array MCA, the low-level potential is supplied to the gates of the transistors M1 and the transistors M1$b$ included in the memory cells MC arranged in the first row and the third row to the m-th row; thus, the transistors M1 and the transistors M1$b$ included in the memory cells MC arranged in the first row and the third row to the m-th row are turned off.

That is, the circuit FECD supplies the potential $V_M$ to the wiring FCA[2], supplies the potential $V_{OB}$ to the wiring FCB[2], supplies the potential $V_{OA}$ to the wiring FCA[1] and the wiring FCA[3] to the wiring FCA[m], and supplies the potential $V_{OB}$ to the wiring FCB[1] and the wiring FCB[3] to the wiring FCB[m], and the circuit WRWD supplies a high-level potential to the wiring WRWL[2] and supplies a low-level potential to the wiring WRWL[1] and the wiring WRWL[3] to the wiring WRWL[m], whereby the memory cells MC arranged in the second row of the memory cell array MCA can be selected as reading targets.

When attention is focused on the memory cell MC in the second row and the j-th column of the memory cell array MCA in the period from Time U26 to Time U27, electrical continuity is established between the wiring WRDL[j] and the second terminal of the transistor M1 in the memory cell MC[2,$j$]; thus, current corresponding to the divided voltage applied to the FTJ element FJA in the memory cell MC[2,$j$] flows through the wiring WRDL[j]. Alternatively, the potential of the wiring WRDL[j] changes in accordance with the divided voltage applied to the FTJ element FJA in the memory cell MC[2,$j$]. That is, as the data retained in the FTJ element FJA in the memory cell MC[2,$j$], information (e.g., current or voltage) corresponding to Da[2,$j$] is transmitted to the wiring WRDL[j].

When attention is focused on the memory cell MC in the second row and the j-th column of the memory cell array MCA in the period from Time U26 to Time U27, electrical continuity is established between the wiring WRDLb[j] and the second terminal of the transistor M1$b$ in the memory cell MC[2,$j$]; thus, current corresponding to the divided voltage applied to the FTJ element FJAb in the memory cell MC[2,$j$] flows through the wiring WRDLb[j]. Alternatively, the potential of the wiring WRDLb[j] changes in accordance with the divided voltage applied to the FTJ element FJAb in the memory cell MC[2,$j$]. That is, as the data retained in the FTJ element FJAb in the memory cell MC[2,$j$], information (e.g., current or voltage) corresponding to db[2,$j$] is transmitted to the wiring WRDLb[j].

The above description also applies to the memory cells MC in the columns other than the j-th column; the retained data are transmitted from the memory cell MC[2,1] to the memory cell MC[2,$n$] arranged in the second row of the memory cell array MCA in the period from Time U23 to Time U24.

Specifically, for example, the data Da[2,1] and db[2,1] are read from the memory cell MC[2,1], and the data Da[2,$n$] and db[2,$n$] are read from the memory cell MC[2,$n$]. At this time, the circuit RDD or the like obtains information (e.g., current or voltage) transmitted to the wiring WRDL[1] and the wiring WRDLb[1], whereby Da[2,1] and db[2,1] retained in the memory cell MC[2,1] can be read. Meanwhile, the circuit RDD or the like obtains information (e.g., current or voltage) transmitted to the wiring WRDL[n] and the wiring WRDLb[n], whereby Da[2,$n$] and db[2,$n$] retained in the memory cell MC[2,$n$] can be read.

In the period from Time U28 to Time U29, the operation of reading data from the memory cells MC arranged in the third row to the (m−1)-th row of the memory cell array MCA is performed in a manner similar to that of the operation of reading data from the memory cells MC arranged in the first row of the memory cell array MCA in the period from Time U22 to Time U25, and the operation of reading data from the memory cells MC arranged in the second row of the memory cell array MCA in the period from Time U25 to Time U28.

In the period from Time U29 to Time U32, the circuit FECD supplies the potential $V_M$ to the wiring FCA[m] and supplies the potential $V_{OB}$ to the wiring FCB[m]. In addition, the circuit FECD supplies the potential $V_{OA}$ to the wiring FCA[1] to the wiring FCA[m−1] and supplies the potential $V_{OB}$ to the wiring FCB[1] to the wiring FCB[m−1]. At this time, a voltage $V_M$-$V_{OB}$ is applied between the wiring FCA[m] and the wiring FCB[m]; thus, voltages obtained by dividing the voltage are applied to the FTJ elements FJA and the transistors M6 in the memory cell MC[m,1] to the memory cell MC[m,n] in the first row of the memory cell array MCA. Similarly, the voltages obtained by dividing the voltage are applied to the FTJ elements FJAb and the transistors M6$b$ in the memory cell MC[m,1] to the memory cell MC[m,n] in the m-th row of the memory cell array MCA. The divided voltages applied to the FTJ elements FJA depend on the direction of polarization in the dielectrics having ferroelectricity in the FTJ elements FJA, and the divided voltages applied to the FTJ elements FJAb depend on the direction of polarization in the dielectrics having ferroelectricity in the FTJ elements FJAb. That is, the divided voltages applied to the FTJ elements FJA and the FTJ elements FJAb are determined by the data written to the corresponding memory cells MC.

In the period from Time U30 to Time U31, the circuit WRWD supplies a high-level potential to the wiring WRWL [m]. In addition, the circuit WRWD supplies a low-level potential to the wiring WRWL[1] to the wiring WRWL[m−1]. Accordingly, in the memory cell array MCA, the high-level potential is supplied to the gates of the transistors M1 and the transistors M1$b$ included in the memory cell MC[m,1] to the memory cell MC[m,n] arranged in the m-th row; hence, the transistors M1 and the transistors M1$b$ included in the memory cell MC[m,1] to the memory cell MC[m,n] are turned on. Moreover, in the memory cell array MCA, the low-level potential is supplied to the gates of the transistors M1 and the transistors M1$b$ included in the memory cell MC[1,1] to the memory cell MC[m−1,n] arranged in the first row to the (m−1)-th row; thus, the transistors M1 and the transistors M1$b$ included in the memory cell MC[1,1] to the memory cell MC[m−1,n] are turned off.

That is, the circuit FECD supplies the potential $V_M$ to the wiring FCA[m], supplies the potential $V_{OB}$ to the wiring FCB[m], supplies the potential $V_{OA}$ to the wiring FCA[1] to the wiring FCA[m−1], and supplies the potential $V_{OB}$ to the wiring FCB[1] to the wiring FCB[m−1], and the circuit WRWD supplies a high-level potential to the wiring WRWL [m] and supplies a low-level potential to the wiring WRWL [1] to the wiring WRWL[m−1], whereby the memory cells MC arranged in the m-th row of the memory cell array MCA can be selected as reading targets.

When attention is focused on the memory cell MC in the m-th row and the j-th column of the memory cell array MCA in the period from Time U30 to Time U31, electrical continuity is established between the wiring WRDL[j] and the second terminal of the transistor M1 in the memory cell MC[m,j]; thus, current corresponding to the divided voltage applied to the FTJ element FJA in the memory cell MC[m,j] flows through the wiring WRDL[j]. Alternatively, the potential of the wiring WRDL[j] changes in accordance with the divided voltage applied to the FTJ element FJA in the memory cell MC[m,j]. That is, as the data retained in the FTJ element FJA in the memory cell MC[m,j], information (e.g., current or voltage) corresponding to Da[m,j] is transmitted to the wiring WRDL[j].

When attention is focused on the memory cell MC in the m-th row and the j-th column of the memory cell array MCA in the period from Time U30 to Time U31, electrical continuity is established between the wiring WRDLb[j] and the second terminal of the transistor M1b in the memory cell MC[m,j]; thus, current corresponding to the divided voltage applied to the FTJ element FJAb in the memory cell MC[m, j] flows through the wiring WRDLb[j]. Alternatively, the potential of the wiring WRDLb[j] changes in accordance with the divided voltage applied to the FTJ element FJAb in the memory cell MC[m,j]. That is, as the data retained in the FTJ element FJAb in the memory cell MC[m,j], information (e.g., current or voltage) corresponding to db[m,j] is transmitted to the wiring WRDLb[j].

The above description also applies to the memory cells MC in the columns other than the j-th column; the retained data are transmitted from the memory cell MC[m,1] to the memory cell MC[m,n] arranged in the m-th row of the memory cell array MCA in the period from Time U30 to Time U31.

Specifically, for example, the data Da[m,1] and db[m,1] are read from the memory cell MC[m,1], and the data Da[m,n] and db[m,n] are read from the memory cell MC[m, n]. At this time, the circuit RDD or the like obtains information (e.g., current or voltage) transmitted to the wiring WRDL[1] and the wiring WRDLb[1], whereby Da[m,1] and db[m,1] retained in the memory cell MC[m,1] can be read. Meanwhile, the circuit RDD or the like obtains information (e.g., current or voltage) transmitted to the wiring WRDL[n] and the wiring WRDLb[n], whereby Da[m,n] and db[m,n] retained in the memory cell MC[m,n] can be read.

By the operation from Time U21 to Time U32, D[1,1] to D[m,n] can be respectively read from the memory cell MC[1,1] to the memory cell MC[m,n] included in the memory cell array MCA.

Note that in the timing chart of FIG. 11, as the operation after the operation of reading data from the memory cell MC[1,1] to the memory cell MC[m,n] ends (operation in the period from Time U32 to Time U33), the circuit WRWD supplies a low-level potential to the wiring WRWL[1] to the wiring WRWL[m], for example. The circuit FECD supplies the potential $V_{0A}$ to the wiring FCA[1] to the wiring FCA[m] and the potential $V_{0B}$ to the wiring FCB[1] to the wiring FCB[m], for example. The ground potential is supplied to the wiring WRDL[1] to the wiring WRDL[n], for example.

Reading Operation Example 2

Next, an example of the operation of reading data from the memory cells MC of the memory device 100, which is different from that in the timing chart of FIG. 11, will be described.

Figure 12:
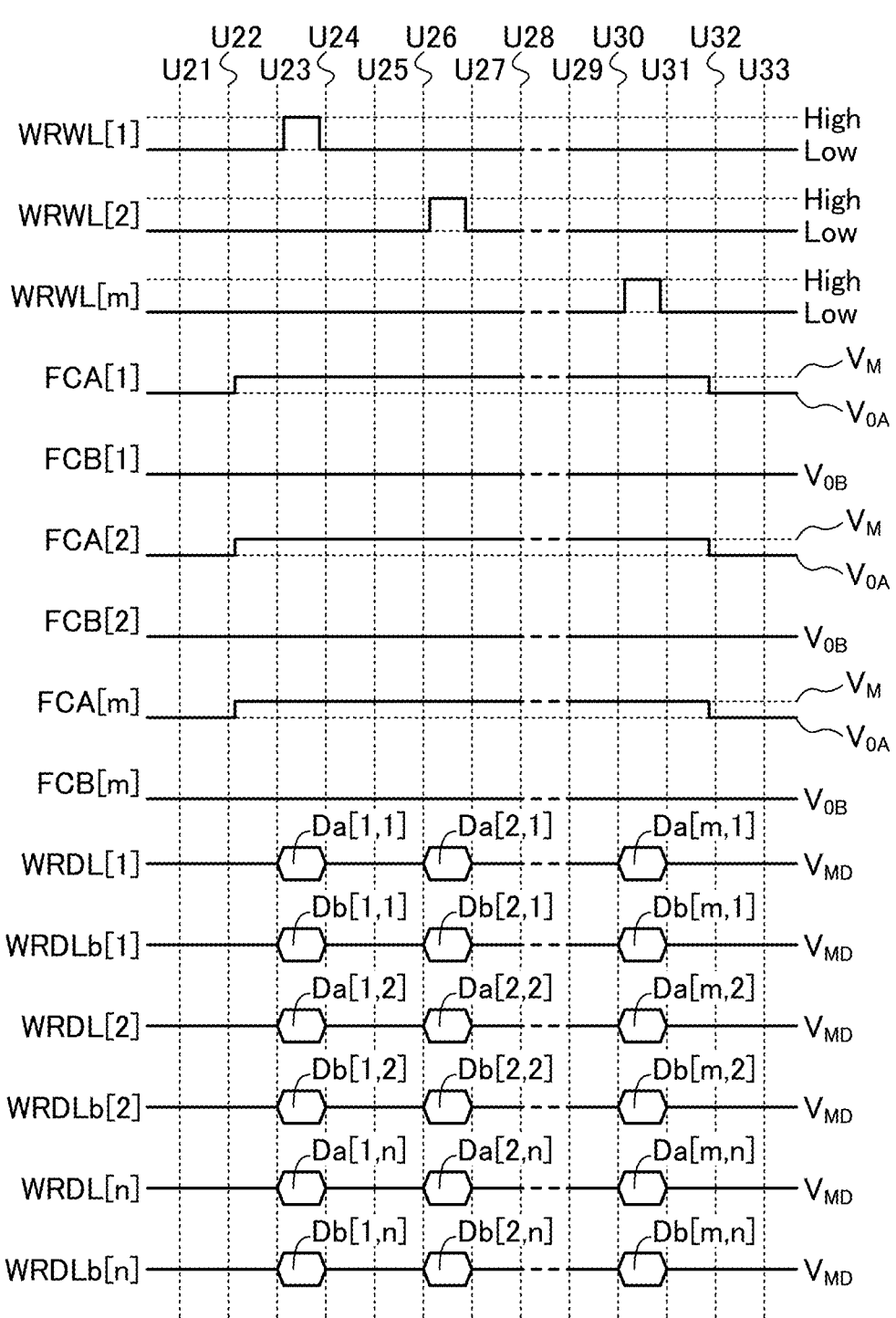
FIG. 12 is a timing chart showing an operation example of a memory device.

A timing chart in FIG. 12 shows a reading operation example different from the reading operation example in the timing chart of FIG. 11. Like the timing chart in FIG. 11, the timing chart in FIG. 12 shows changes in the potentials of the wiring WRWL[1], the wiring WRWL[2], the wiring WRWL[m], the wiring FCA[1], the wiring FCB[1], the wiring FCA[2], the wiring FCB[2], the wiring FCA[m], the wiring FCB[m], the wiring WRDL[1], the wiring WRDLb [1], the wiring WRDL[2], the wiring WRDLb[2], the wiring WRDL[n], and the wiring WRDLb[n] in the period from Time U21 to Time U33 and around the period.

The reading operation in the timing chart of FIG. 12 differs from the reading operation in the timing chart of FIG. 11 in that the wiring FCA[1] to the wiring FCA[m] have the potential $V_M$ in the period from Time U22 to Time U32.

In the period from Time U22 to Time U32 in the timing chart of FIG. 12, $V_M$ is input to the wiring FCA[1] to the wiring FCA[m] and $V_{0B}$ is input to the wiring FCB[1] to the wiring FCB[m], so that in the period from Time U22 to Time U32, the potentials of the second terminals of the transistors M1 in the memory cell MC[1,1] to the memory cell MC[m, n] are determined in accordance with the direction of polarization in the materials that can have ferroelectricity in the FTJ elements FJA in the corresponding memory cells MC. Similarly, the potentials of the second terminals of the transistors M1b in the memory cell MC[1,1] to the memory cell MC[m,n] are determined in accordance with the direction of polarization in the materials that can have ferroelectricity in the FTJ elements FJAb in the corresponding memory cells MC. That is, the potentials of the second terminals of the transistors M1 and the transistors M1b become potentials corresponding to the data retained in the respective memory cells MC.

In this operation example, the memory cell MC from which data is read can be selected from the memory cell array MCA by inputting a high-level potential to any one of the wiring WRWL[1] to the wiring WRWL[m] and inputting a low-level potential to the other wirings from the circuit WRWD. For example, in the timing chart of FIG. 12, by supplying a high-level potential to the wiring WRWL[1] and supplying a low-level potential to the wiring WRWL[2] to the wiring WRWL[m] as in the period from Time U23 to Time U24, data retained in the memory cells MC arranged in the first row of the memory cell array MCA can be read. Similarly, by supplying a high-level potential to the wiring WRWL[2] and supplying a low-level potential to the wiring WRWL[1] and the wiring WRWL[3] to the wiring WRWL [m] as in the period from Time U26 to Time U27, data retained in the memory cells MC arranged in the second row of the memory cell array MCA can be read, and by supplying a high-level potential to the wiring WRWL[m] and supplying a low-level potential to the wiring WRWL[1] to the wiring WRWL[m−1] as in the period from Time U30 to Time U31, data retained in the memory cells MC arranged in the m-th row of the memory cell array MCA can be read.

That is, potential changes of the wiring WRWL[1] to the wiring WRWL[m] in the operation example of the timing chart in FIG. 12 can be similar to those in the operation example of the timing chart in FIG. 11.

In the operation of the timing chart in FIG. 12, at the time of reading data from the plurality of memory cells MC included in the memory cell array MCA, the potentials of the wiring FCA[1] to the wiring FCA[m] and the wiring FCB[1] to the wiring FCB[m] do not need to be changed in each memory cell MC subjected to data reading. That is, employing the operation example of the timing chart in FIG. 12 enables the circuit FECD to have a structure without a circuit that selects a wiring for transmitting a signal, such as a selector.

Reading Operation Example 3

Next, an example of the operation of reading data from the memory cells MC of the memory device 100, which is different from those in the timing charts of FIG. 11 and FIG. 12, will be described.

Figure 13:
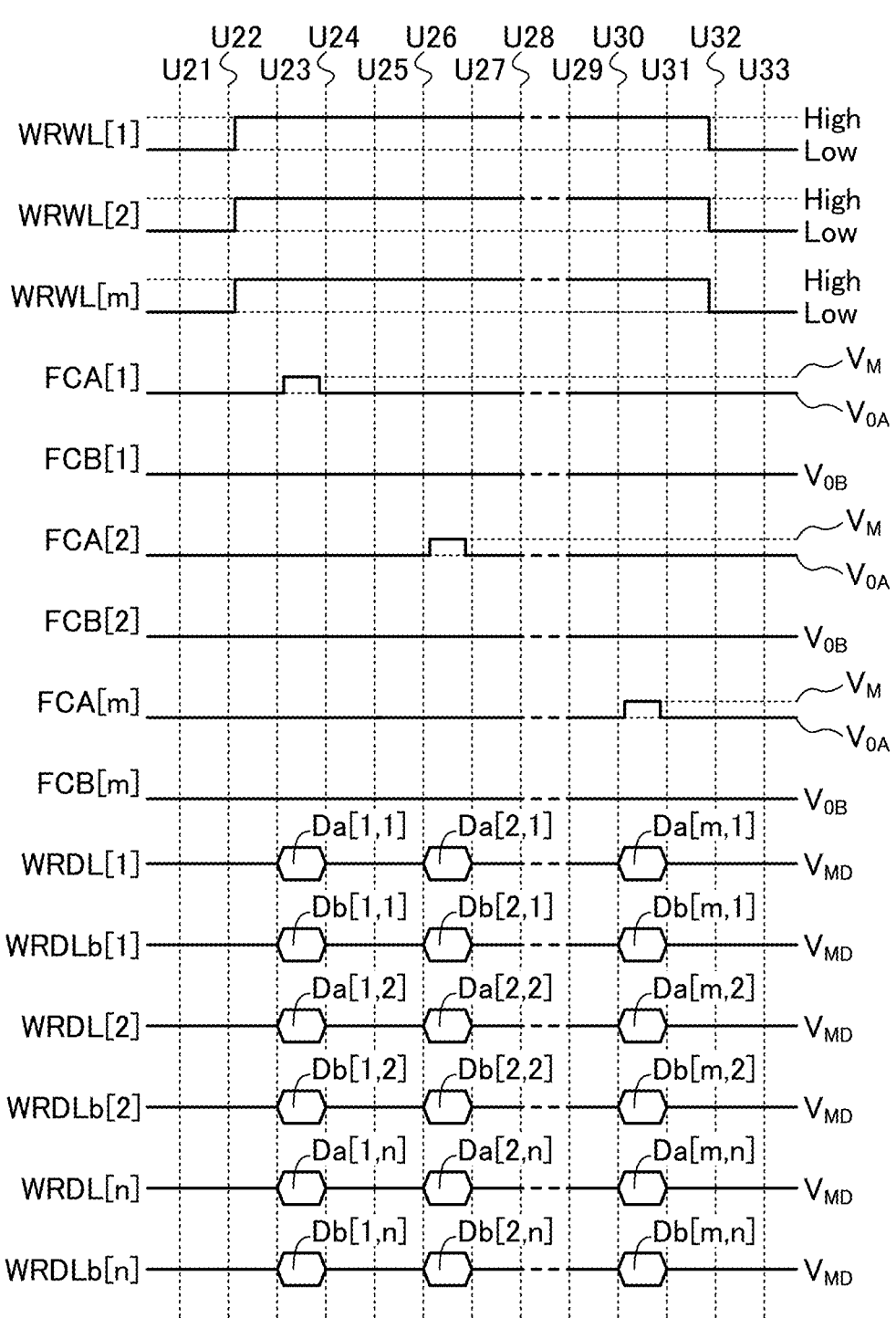
FIG. 13 is a timing chart showing an operation example of a memory device.

A timing chart in FIG. 13 shows a writing operation example different from the writing operation examples in the timing charts of FIG. 11 and FIG. 12. Like the timing charts in FIG. 11 and FIG. 12, the timing chart in FIG. 13 shows changes in the potentials of the wiring WRWL[1], the wiring WRWL[2], the wiring WRWL[m], the wiring FCA[1], the wiring FCB[1], the wiring FCA[2], the wiring FCB[2], the wiring FCA[m], the wiring FCB[m], the wiring WRDL[1], the wiring WRDLb[1], the wiring WRDL[2], the wiring WRDLb[2], the wiring WRDL[n], and the wiring WRDLb [n] in the period from Time U21 to Time U33 and around the period.

The reading operation in the timing chart of FIG. 13 differs from the reading operation in the timing chart of FIG. 11 in that the wiring WRWL[1] to the wiring WRWL[m] have a high-level potential in the period from Time U22 to Time U32, and in potential changes of the wiring FCA[1] to the wiring FCA[m] and the wiring FCB[1] to the wiring FCB[m] in the period from Time U22 to Time U32.

Since a high-level potential is input to the wiring WRWL [1] to the wiring WRWL[m] in the period from Time U22 to Time U32 in the timing chart of FIG. 13, the high-level potential is input to the gates of the transistors M1 and the transistors M1b in the memory cell MC[1,1] to the memory cell MC[m,n] in the period from Time U22 to Time U32. Thus, the transistors M1 and the transistors M1b in the memory cell MC[1,1] to the memory cell MC[m,n] are turned on.

In the period from Time U23 to Time U24 in the timing chart of FIG. 13, the potential $V_M$ is supplied to the wiring FCA[1] and the potential $V_{OB}$ is supplied to the wiring FCB[1]. The potential $V_{OA}$ is supplied to the wiring FCA[2] to the wiring FCA[m] and the potential $V_{OB}$ is supplied to the wiring FCB[1] to the wiring FCB[m]. At this time, a voltage $V_M$–$V_{OB}$ is applied between the wiring FCA[1] and the wiring FCB[1]; thus, voltages obtained by dividing the voltage are applied to the FTJ elements FJA and the transistors M6 in the memory cell MC[1,1] to the memory cell MC[1,n] in the first row of the memory cell array MCA. Similarly, the voltages obtained by dividing the voltage are applied to the FTJ elements FJAb and the transistors M6b in the memory cell MC[1,1] to the memory cell MC[1,n] in the first row of the memory cell array MCA. The divided voltages applied to the FTJ elements FJA depend on the direction of polarization in the dielectrics having ferroelectricity in the FTJ elements FJA, and the divided voltages applied to the FTJ elements FJAb depend on the direction of polarization in the dielectrics having ferroelectricity in the FTJ elements FJAb. That is, the divided voltages applied to the FTJ elements FJA and the FTJ elements FJAb are determined by the data written to the corresponding memory cells MC.

The transistors M1 in the memory cell MC[1,1] to the memory cell MC[1,n] have been in the on state; thus, the potentials of the wiring WRDL[1] to the wiring WRDL[n] are determined in accordance with the divided voltages applied to the FTJ elements FJA in the memory cell MC[1,1] to the memory cell MC[1,n]. Similarly, the transistors M1b in the memory cell MC[1,1] to the memory cell MC[1,n] have been in the on state; thus, the potentials of the wiring WRDL[1] to the wiring WRDL[n] are determined in accordance with the divided voltages applied to the FTJ elements FJAb in the memory cell MC[1,1] to the memory cell MC[1,n]. Accordingly, to the wiring WRDL[1] to the wiring WRDL[n], information (e.g., current or voltage) corresponding to Da[1,1] to Da[1,n] are transmitted as the data retained in the memory cell MC[1,1] to the memory cell MC[1,n]. In addition, to the wiring WRDLb[1] to the wiring WRDLb[n], information (e.g., current or voltage) corresponding to db[1,1] to db[1,n] are transmitted as the data retained in the memory cell MC[1,1] to the memory cell MC[1,n].

Meanwhile, the potential $V_{OA}$ is supplied to the wiring FCA[2] to the wiring FCA[m] and the potential $V_{OB}$ is supplied to the wiring FCB[2] to the wiring FCB[m], so that voltages obtained by dividing $V_{OA}$–$V_{OB}$ are applied to the FTJ elements FJA and the transistors M6 in the memory cells MC in the second row to the m-th row of the memory cell array MCA. When $V_{OA}$–$V_{OB}$ is 0 V or an approximate value of 0 V, the potentials of the second terminals of the transistors M1 in the memory cell MC[1,1] to the memory cell MC[1,n] can also be 0 V or an approximate value of 0. That is, when the threshold voltages of the transistors M1 are appropriate values, the transistors M1 are turned off, so that electrical continuity between the wiring WRDL[1] to the wiring WRDL[n] and the second terminals of the transistors M1 in the memory cells MC in the second row to the m-th row of the memory cell array MCA is broken, and information (e.g., current or voltage) corresponding to the data retained in the memory cells MC do not flow through the wiring WRDL[1] to the wiring WRDL[n]. Similarly, when $V_{OA}$–$V_{OB}$ is 0 V or an approximate value of 0 V, the potentials of the second terminals of the transistors M1b in the memory cell MC[1,1] to the memory cell MC[1,n] can also be 0 V or an approximate value of 0. Thus, when the threshold voltages of the transistors M1b are appropriate values, the transistors M1 are turned off, so that electrical continuity between the wiring WRDLb[1] to the wiring WRDLb[n] and the second terminals of the transistors M1b in the memory cells MC in the second row to the m-th row of the memory cell array MCA is broken. Accordingly, information (e.g., current or voltage) corresponding to the data retained in the memory cells MC do not flow through the wiring WRDLb[1] to the wiring WRDLb[n].

In this operation example, in the case where the data are read from the memory cells MC in the second row of the memory cell array MCA, the potential $V_M$ is supplied to the wiring FCA[2] and the potential $V_{OB}$ is supplied to the wiring FCB[2] as in the period from Time U26 to Time U27. In the case where the data are read from the memory cells MC in the m-th row of the memory cell array MCA, the potential $V_M$ is supplied to the wiring FCA[m] and the potential $V_{OB}$ is supplied to the wiring FCB[m] as in the period from Time U30 to Time U31.

That is, in the operation example of the timing chart in FIG. 13, the wiring FCA[1] to the wiring FCA[m] function as selection signal lines for selecting, from the memory cell array MCA, the memory cells MC from which data are read. Therefore, in the operation example of the timing chart in FIG. 13, the potentials of the wiring WRWL[1] to the wiring WRWL[m] do not need to be changed in each memory cell MC subjected to data reading. Thus, employing the operation example of the timing chart in FIG. 13 enables the circuit RDD to have a structure without a circuit that selects a wiring for transmitting a signal, such as a selector.

Note that this embodiment can be combined with any of the other embodiments described in this specification as appropriate.

Embodiment 3

In this embodiment, the case where the memory device described in the above embodiment is treated as an arithmetic circuit will be described.

<Arithmetic Circuit 1>

Figure 14:
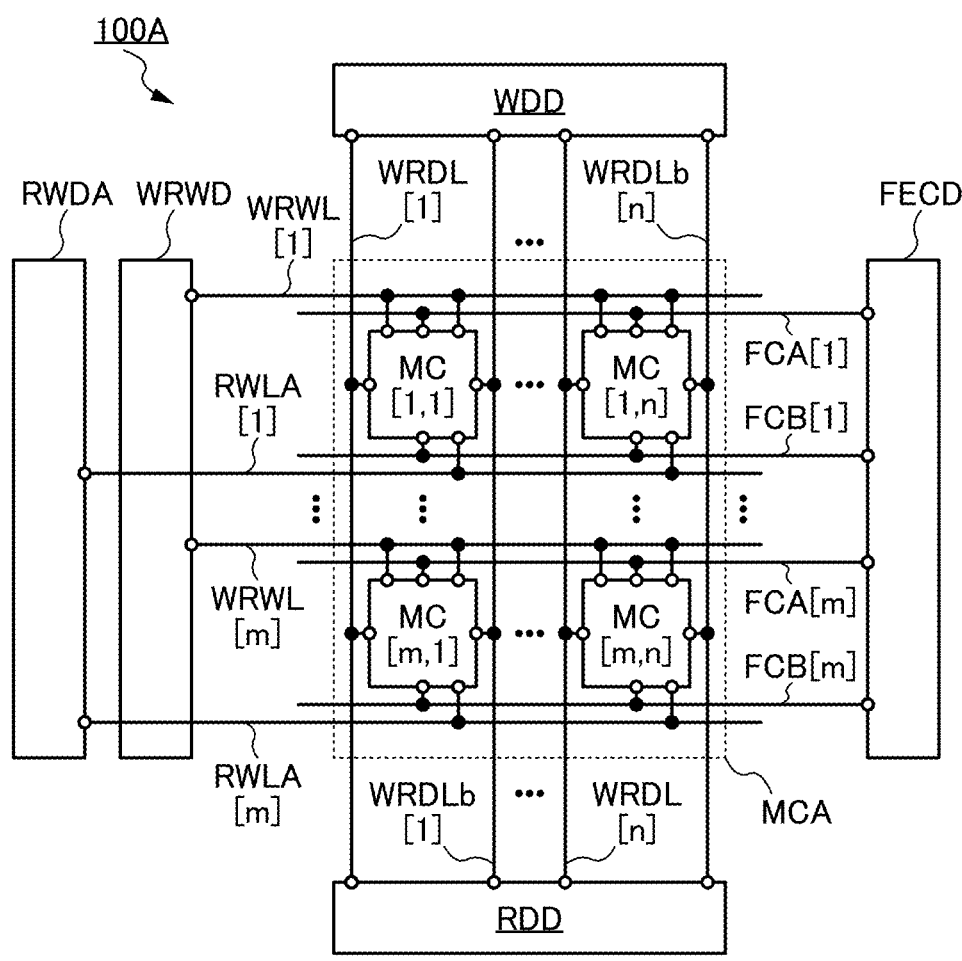
FIG. 14 is a block diagram illustrating a structure example of an arithmetic circuit.

A memory device 100A in FIG. 14 including the memory cell MC in FIG. 5A is considered, for example. In that case, the memory device 100A functioning as an arithmetic circuit can perform a product-sum operation of a plurality of pieces of first data and a plurality of pieces of second data, for example. The plurality of pieces of first data are each "0" or "1", and the plurality of pieces of second data are each "0" or "1".

The memory device 100A illustrated in FIG. 14 has a structure in which a circuit RWDA is provided in the memory device 100 in FIG. 8. The circuit RWDA functions as a read word line driver circuit, for example. The circuit RWDA also functions as a circuit that transmits the second data to the memory cells MC included in the memory cell array MCA. That is, in that case, a wiring RWLA[1] to a wiring RWLA[m] (corresponding to the wiring RWLA in FIG. 5A) function as wirings that transmit the second data. Note that the operation of the memory cells MC that perform an arithmetic operation for calculating the product of the first data and the second data will be described later.

The first data are retained in the plurality of memory cells MC included in the memory cell array MCA of the memory device 100A, for example. That is, the plurality of memory cells MC included in the memory cell array MCA retain "0" or "1" as the data. Specifically, as described in the operation of data writing in Embodiment 1, for example, the values of the first data are determined in accordance with the direction of polarization that occurs in the FTJ element FJA and the FTJ element FJAb included in each of the memory cells MC.

Here, the relationships between the values of the first data written to the plurality of memory cells MC included in the memory cell array MCA of the memory device 100 and the direction of polarization that occurs in the FTJ element FJA and the FTJ element FJAb are defined as in the following table, for example.

TABLE 2

| First data | Direction of polarization in FTJ element FJA | Direction of polarization in FTJ element FJAb |
|---|---|---|
| "1" | From input terminal (wiring FCA) to output terminal (positive direction) | From output terminal to input terminal (wiring FCA) (negative direction) |
| "0" | From output terminal to input terminal (wiring FCA) (negative direction) | From input terminal (wiring FCA) to output terminal (positive direction) |

That is, when the first data of "1" is written to the memory cell MC, for example, the potential $V_1$ is input to the memory cell MC through the wiring WRDL and the potential $V_0$ is input to the memory cell MC through the wiring WRDLb from the circuit WDD as described in Operation example of data writing in Embodiment 1 so that polarization is caused (rewritten) in a predetermined direction in the FTJ element FJA and the FTJ element FJAb included in the memory cell MC. For another example, when the first data of "0" is written to the memory cell MC, the potential $V_0$ is input to the memory cell MC through the wiring WRDL and the potential $V_1$ is input to the memory cell MC through the wiring WRDLb from the circuit WDD as described in Operation example of data writing in Embodiment 1 so that polarization is caused (rewritten) in a predetermined direction in the FTJ element FJA and the FTJ element FJAb included in the memory cell MC.

In the case where the first data of "1" is written to the memory cell MC, the potential of the output terminal of the FTJ element FJA becomes $V_{OB}$ and the potential of the output terminal of the FTJ element FJAb becomes $V_M$ through the operation in the period from Time T23 to Time T25 in the timing chart in FIG. 3 of Operation example of data reading in Embodiment 1. Thus, the gate potential of the transistor M7 included in the memory cell MC becomes $V_M$. At this time, a low-level potential from the wiring VCE is supplied to the first terminal of the transistor M7 and a high-level potential from the wiring RDL is supplied to the second terminal of the transistor M7 through the transistor M8, for example, so that current corresponding to the gate-source voltage (a potential difference between $V_M$ and the low-level potential) flows between the source and the drain of the transistor M7. In the case where the first data of "0" is written to the memory cell MC, the potential of the output terminal of the FTJ element FJA becomes $V_M$ and the potential of the output terminal of the FTJ element FJAb becomes $V_{OB}$ through the operation in the period from Time T23 to Time T25 in the timing chart in FIG. 3 of Operation example of data reading in Embodiment 1. Thus, the gate potential of the transistor M7 included in the memory cell MC becomes $V_{OB}$. At this time, a low-level potential from the wiring VCE is supplied to the first terminal of the transistor M7 and a high-level potential from the wiring RDL is supplied to the second terminal of the transistor M7 through the transistor M8, for example, so that current corresponding to the gate-source voltage (a potential difference between $V_{OB}$ and the low-level potential) flows between the source and the drain of the transistor M7. Note that description in this embodiment is made on the assumption that when the first data of "0" is written to the memory cell MC, i.e., when the potential of the output terminal of the FTJ element FJAb (the gate of the transistor M7) is $V_{OB}$, no current flows between the first terminal and the second terminal of the transistor M7 (sometimes rephrased as the transistor M7 being in the off state or current with the current amount of 0 flowing between the first terminal and the second terminal of the transistor M7).

The second data can be a value corresponding to a potential supplied to the wiring RWLA, for example. When the second data is "0", a low-level potential is supplied to the wiring RWLA from the circuit WRWD, and when the second data is "1", a high-level potential is supplied to the wiring RWLA from the circuit WRWD, for example.

Here, an operation example of the memory cell MC based on the first data retained in the memory cell MC and the second data input to the memory cell MC will be described.

When the first data retained in the memory cell MC is "1", the current with the amount corresponding to the gate-source voltage of the transistor M7 (the potential difference between $V_M$ and the low-level potential) flows between the first terminal and the second terminal of the transistor M7 as described above. This amount of current is denoted as Lt. When the first data retained in the memory cell MC is "0", no current (current with the current amount of 0) flows between the first terminal and the second terminal of the transistor M7 as described above.

When the second data is "0", i.e., when a low-level potential is input to the memory cell MC from the wiring RWLA, the transistor M1 included in the memory cell MC is turned off. Meanwhile, when the second data is "1", i.e., when a high-level potential is input to the memory cell MC from the wiring RWLA, the transistor M1 included in the memory cell MC is turned on.

As described above, when the first data is "1" and the second data "1", electrical continuity is established between the wiring VCE and the wiring RDL, so that the current with the current amount Lt flows between the memory cell MC and the wiring RDL. When at least one of the first data and the second data is "0", the transistor M7 is in the off state and/or the transistor M8 is in the off state; thus, no current flows between the memory cell MC and the wiring RDL.

That is, the amount of current flowing between the wiring RDL and the circuit RDD depends on the value of the first data and the value of the second data as in the following table.

TABLE 3

| First data | Second data | Amount of current flowing from wiring RDL to circuit RDD |
|---|---|---|
| "0" | "0" | 0 |
| "1" | "0" | 0 |
| "0" | "1" | 0 |
| "1" | "1" | $I_{ut}$ |

That is, when the product of the first data and the second data is "1", current with the current amount $I_{ut}$ flows as an arithmetic operation result from the memory cell MC to the circuit RDD through the wiring RDL; and when the product of the first data and the second data is "0", current with the current amount 0 flows as an arithmetic operation result between the memory cell MC and the circuit RDD (no current flows between the memory cell MC and the circuit RDD). In this manner, the first data is retained in the memory cell MC and then the second data is input to the memory cell MC, whereby the memory cell MC can calculate the product of the first data and the second data.

Next, the case where the plurality of pieces of second data are simultaneously supplied to the wiring RWLA[1] to the wiring RWLA[m] while the plurality of memory cells MC included in the memory cell array MCA retain the first data is considered. Note that the first data retained in the memory cell MC[i,j] (i is an integer greater than or equal to 1 and less than or equal to m, and j is an integer greater than or equal to 1 and less than or equal to n) is represented by W[i,j], and the second data supplied to the wiring RWLA[i] is represented by X[i].

For example, when X[1] to X[m] as the second data are input to the memory cell MC[1,j] to the memory cell MC[m,j] respectively from the wiring RWLA[1] to the wiring RWLA[m] in the j-th column, the arithmetic operations of W[1,j]×X[1] to W[m,j]×X[m] are performed in the memory cell MC[1,j] to the memory cell MC[m,j].

For example, when the product of the first data and the second data is "1", the amount of current flowing from the corresponding memory cell MC to a wiring RDL[j] is Lt. For another example, when the product of the first data and the second data is "0", the amount of current flowing between the corresponding memory cell MC and the wiring WRDL[j] is 0 (no current flows between the corresponding memory cell MC and the wiring WRDL[j]).

Here, assuming that, among the memory cell MC[1,j] to the memory cell MC[m,j], the number of memory cells MC in which the product of the first data and the second data is "1" is p and the number of memory cells MC in which the product of the first data and the second data is "0" is q, the total amount of current flowing from the wiring RDL to the circuit RDD is $p \times I_{ut} + q \times 0 = p \times I_{ut}$. Note that p and q are positive integers satisfying p+q=m.

Here, when the circuit RDD has a function of a current-voltage converter circuit or the like, for example, the total amount of current flowing through the wiring RDL[j] can be converted into a voltage value. That is, the current amount $p \times I_{ut}$, which is the result of the product-sum operations performed in the memory cell MC[1,j] to the memory cell MC[m,j] in the j-th column of the memory cell array MCA, can be output as a voltage value.

The circuit RDD may further have a function of performing an arithmetic operation of a function with the use of the product-sum result, for example. The circuit RDD that performs an arithmetic operation of an activation function using a product-sum result can perform an arithmetic operation of an artificial neural network, for example. As the activation function, for example, a sigmoid function, a tanh function, a softmax function, a ReLU function, a threshold function, or the like can be used.

Described above is the result of the product-sum operations of the plurality of pieces of first data and the plurality of pieces of second data in the memory cell MC[1,j] to the memory cell MC[m,j] positioned in the j-th column; however, the product-sum operations can be performed in columns other than the j-th column because the plurality of pieces of second data are transmitted through the wiring RWLA[1] to the wiring RWLA[m] extending in the row direction. That is, with the use of the memory device 100A as a circuit that calculates a product sum, product-sum operations whose number corresponds to the number of columns (n in FIG. 14) can be performed at the same time.

<Arithmetic Circuit 2>

In the above, the arithmetic operation of the arithmetic circuit in which the first data is binary ("0" or "1") and the second data is binary ("0" or "1") is described as an example, and in one embodiment of the present invention, an arithmetic operation using a multilevel value, an analog value, or the like can be performed by changing the structure of the arithmetic circuit.

Figure 15:
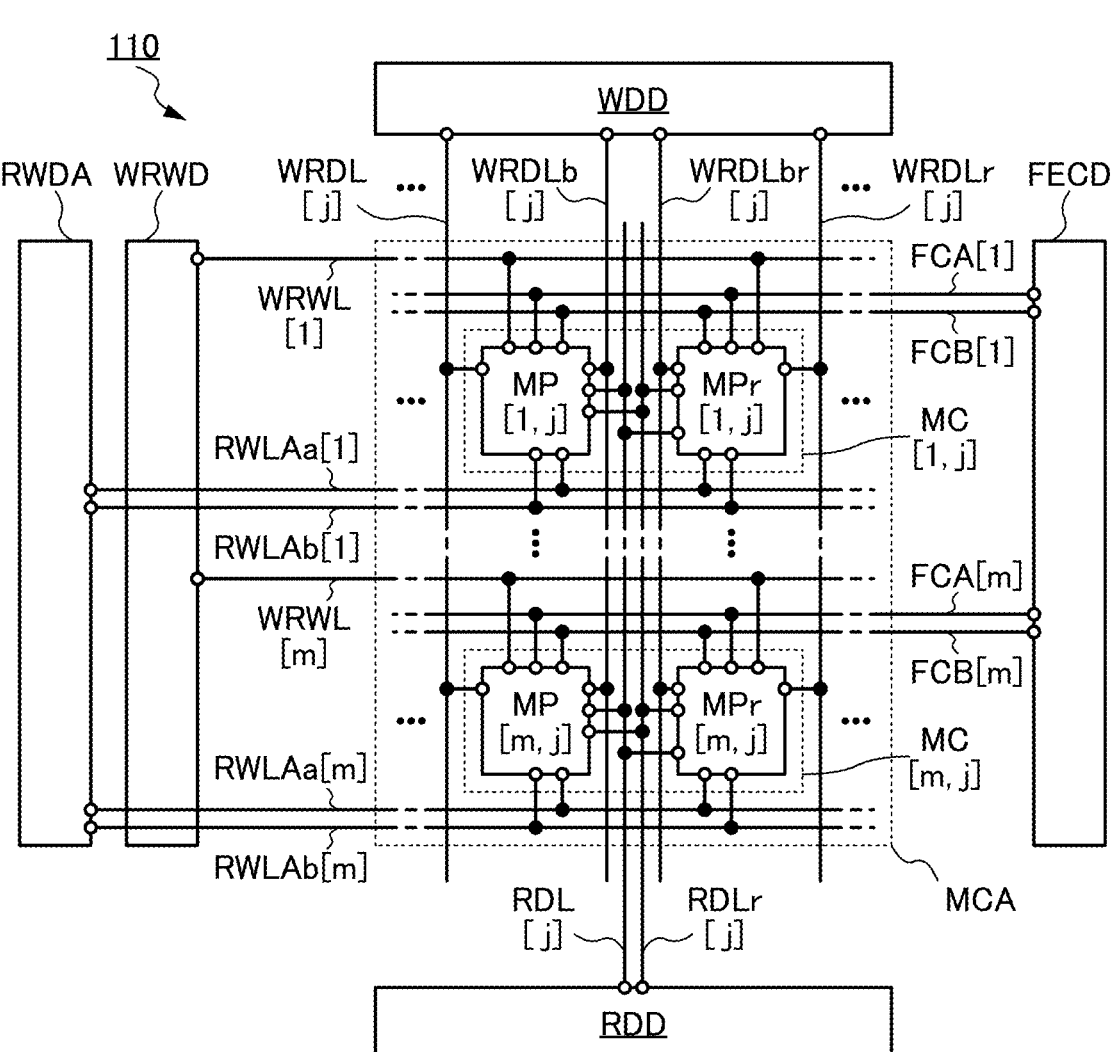
FIG. 15 is a block diagram illustrating a structure example of an arithmetic circuit.

FIG. 15 illustrates a structure example of an arithmetic circuit capable of performing a product-sum operation of the plurality of pieces of first data having any of "−1", "0", and "1" and the plurality of pieces of second data having any of "−1", "0", and "1".

An arithmetic circuit 110 includes the memory cell array MCA, the circuit WDD, the circuit RDD, the circuit RWDA, the circuit WRWD, and the circuit FECD.

The memory cell array MCA includes the plurality of memory cells MC. In the memory cell array MCA, the plurality of memory cells MC are arranged in a matrix of m rows and n columns (here, m and n are each an integer greater than or equal to 1). Note that in FIG. 15, the memory cell MC positioned in the i-th row and the j-th column (here, i is an integer greater than or equal to 1 and less than or equal to m, and j is an integer greater than or equal to 1 and less than or equal to n) is illustrated as the memory cell MC[i,j]. FIG. 15 selectively illustrates the memory cell MC[1,j] and the memory cell MC[m,j].

The memory cells MC each include a circuit MP and a circuit MPr. The circuit structures of the circuit MP and the circuit MPr will be described later.

In the memory cell array MCA of the arithmetic circuit 110, the wiring WRDL[1] to the wiring WRDL[n], the wiring WRDLb[1] to the wiring WRDLb[n], a wiring WRDLr[1] to a wiring WRDLr[n], and a wiring WRDLbr[1] to a wiring WRDLbr[n] extend in the column direction. Note that [j] added to the wiring WRDL, the wiring WRDLb, the wiring WRDLr, and the wiring WRDLbr indicates that the wirings are in the j-th column. The wiring WRWL[1] to the wiring WRWL[m], a wiring RWLAa[1] to a wiring RWLAa[m], a wiring RWLAb[1] to a wiring RWLAb[m], the wiring FCA[1] to the wiring FCA[m], and the wiring FCB[1] to the wiring FCB[m] extend in the row direction. Note that [I] added to the wiring WRWL, the wiring RWLAa, the wiring RWLAb, the wiring FCA, and the wiring FCB indicates that the wirings are in the i-th row.

In the memory cell MC[1,j], a circuit MP[1,j] is electrically connected to the wiring WRDL[j], the wiring WRDLb[j], the wiring WRWL[1], the wiring FCA[1], the wiring FCB[1], the wiring RWLAa[1], and the wiring RWLAb[1]. A circuit MPr[1,j] is electrically connected to the wiring WRDLr[j], the wiring WRDLbr[j], the wiring WRWL[1], the wiring FCA[1], the wiring FCB[1], the wiring RWLAa[1], and the wiring RWLAb[1].

In the memory cell MC[m,j], a circuit MP[m,j] is electrically connected to the wiring WRDL[j], the wiring WRDLb[j], the wiring WRWL[m], the wiring FCA[m], the wiring FCB[m], the wiring RWLAa[m], and the wiring RWLAb[m]. A circuit MPr[m,j] is electrically connected to the wiring WRDLr[j], the wiring WRDLbr[j], the wiring WRWL[m], the wiring FCA[m], the wiring FCB[m], the wiring RWLAa[m], and the wiring RWLAb[m].

Next, structure examples of the circuit MP and the circuit MPr included in the memory cell MC will be described.

Figure 16:
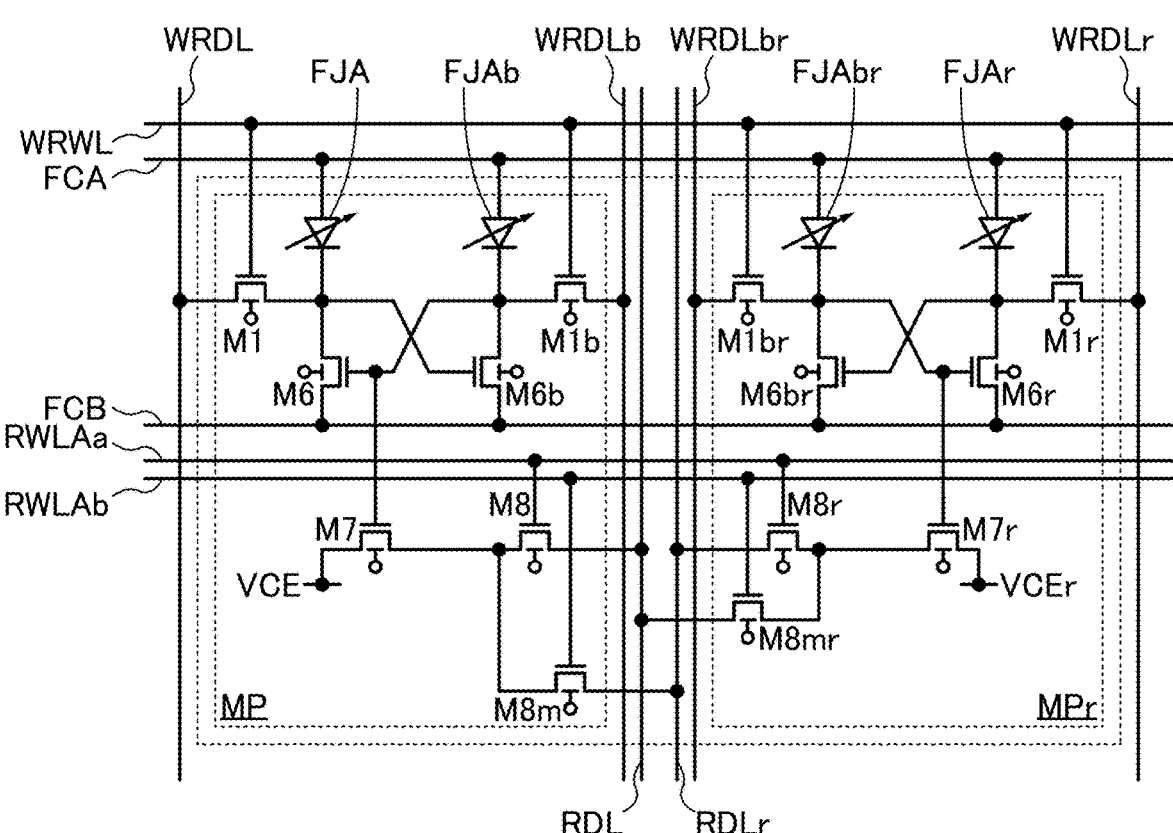
FIG. 16 is a circuit diagram illustrating structure examples of circuits included in an arithmetic circuit.

FIG. 16 illustrates an example of a circuit structure applicable to the memory cells MC included in the memory cell array MCA of the arithmetic circuit 110 in FIG. 15.

The circuit MP illustrated in FIG. 16 has a structure changed from that of the memory cell MC in FIG. 5A described in Embodiment 1; specifically, a transistor M8m is further provided in the memory cell MC in FIG. 5A.

A first terminal of the transistor M8m is electrically connected to the second terminal of the transistor M7 and the first terminal of the transistor M8, and a second terminal of the transistor M8m is electrically connected to a wiring RDLr[j]. The gate of the transistor M8 is electrically connected to the wiring RWLAa, and a gate of the transistor M8m is electrically connected to the wiring RWLAb.

The circuit MPr illustrated in FIG. 16 has a structure similar to that of the circuit MP. Thus, "r" is added to the reference numerals of the circuit elements and the like included in the circuit MPr to differentiate them from the circuit elements and the like included in the circuit MP.

In the circuit MPr, a first terminal of a transistor M1r is electrically connected to the wiring WRDLr, and a gate of the transistor M1r is electrically connected to the wiring WRWL. An input terminal of an FTJ element FJAr is electrically connected to the wiring FCA. An output terminal of the FTJ element FJAr is electrically connected to a second terminal of the transistor Mir, a first terminal of a transistor M6r, and a gate of a transistor M6br. A second terminal of the transistor M6r is electrically connected to the wiring FCB. A first terminal of a transistor M1br is electrically connected to the wiring WRDLbr, and a gate of the transistor M1br is electrically connected to the wiring WRWL. An input terminal of an FTJ element FJAbr is electrically connected to the wiring FCA. An output terminal of the FTJ element FJAbr is electrically connected to a second terminal of the transistor M1br, a first terminal of the transistor M6br, a gate of the transistor M6r, and a gate of a transistor M7r. A second terminal of the transistor M6br is electrically connected to the wiring FCB. A first terminal of the transistor M7r is electrically connected to a wiring VCEr. A first terminal of a transistor M8r is electrically connected to the second terminal of the transistor M7 and a first terminal of a transistor M8mr. A second terminal of the transistor M8r is electrically connected to a wiring RDLr, and a second terminal of the transistor M8mr is electrically connected to the wiring RDL[j]. The gate of the transistor M8m is electrically connected to the wiring RWLAa, and a gate of the transistor M8mr is electrically connected to the wiring RWLAb.

The wiring WRDL and the wiring WRDLr function as wirings that transmit the first data to be written to the circuit MP and the circuit MPr in the memory cell MC, for example. Note that the first data are expressed by a pair of signals transmitted to the wiring WRDL and the wiring WRDLr.

The wiring RWLAa and the wiring RWLAb function as wirings that transmit the second data, for example. Note that the second data are expressed by a pair of signals transmitted to the wiring RWLAa and the wiring RWLAb.

The wiring RDL and the wiring RDLr function as wirings that transmit results of arithmetic operations in the circuit MP and the circuit MPr in the memory cell MC as data, for example.

The wiring WRWL functions as a wiring for selecting the memory cells MC to which the first data are written, for example. That is, the wiring WRWL may function as a write word line.

As in the memory cell MC in FIG. 1 described in Embodiment 1, for example, the wiring FCA and the wiring FCB function as wirings that supply a potential with which polarization occurs in the material that can have ferroelectricity in each of the FTJ element FJA, the FTJ element FJAb, the FTJ element FJAr, and the FTJ element FJAbr when the first data are written to the circuit MP and the circuit MPr. The wiring FCA and the wiring FCB function also as wirings that supply a potential with which polarization in the dielectric does not change when the product of the first data and the second data is calculated in the memory cell MC, for example. The potential may be a pulse voltage.

The wiring VCE and the wiring VCEr each function as a wiring that supplies a constant voltage, for example, as in the memory cell MC in FIG. 5A described in Embodiment 1. The constant voltage can be, for example, a low-level potential, the ground potential, or the like. The voltages supplied from the wiring VCE and the wiring VCEr may be pulse voltages.

The circuit WDD is electrically connected to the wiring WRDL[1] to the wiring WRDL[n], the wiring WRDLb[1] to the wiring WRDLb[n], the wiring WRDLr[1] to the wiring WRDLr[n], and the wiring WRDLbr[1] to the wiring WRDLbr[n]. The circuit WRWD is electrically connected to the wiring WRWL[1] to the wiring WRWL[m]. The circuit RWDA is electrically connected to the wiring RWLAa[1] to the wiring RWLAa[m] and the wiring RWLAb[1] to the wiring RWLAb[m]. The circuit FECD is electrically connected to the wiring FCA[1] to the wiring FCA[m] and the wiring FCB[1] to the wiring FCB[m]. The circuit RDD is electrically connected to a wiring RDL[1] to a wiring RDL[n] and a wiring RDLr[1] to the wiring RDLr[1].

For the circuit FECD, refer to the circuit FECD in the memory device 100 in FIG. 8 described in Embodiment 2.

The circuit WDD functions as a circuit that supplies the first data to the wiring WRDL[j], the wiring WRDLb[j], the wiring WRDLr[j], and the wiring WRDLbr[j] in the j-th column, for example. The circuit WDD may have a structure in which the first data can be simultaneously supplied to the wiring WRDL[1] to the wiring WRDL[n], the wiring WRDLb[1] to the wiring WRDLb[n], the wiring WRDLr[1] to the wiring WRDLr[n], and the wiring WRDLbr[1] to the wiring WRDLbr[n].

The circuit WRWD functions as a wiring for selecting the memory cell MC to which the first data is written, for example. That is, in the structure in FIG. 15, the circuit WRWD functions as a circuit that selects a word line at the time of writing.

The circuit RWDA functions as a circuit that supplies the second data to the wiring RWLAa[i] and the wiring RWLAb [i] in the i-th row, for example. The circuit RWDA may have a structure in which the second data can be simultaneously supplied to the wiring RWLAa[1] to the wiring RWLAa[m] and the wiring RWLAb[1] to the wiring RWLAb[m].

Here, the potentials supplied as the first data to the circuit MP and the circuit MPr in the memory cell MC are defined as follows.

In the case where "1" is retained as the first data in the memory cell MC, potentials with which the direction of polarization in the FTJ element FJA is a positive direction and the direction of polarization in the FTJ element FJAb is a negative direction in the circuit MP are supplied from the circuit WDD to the circuit MP through the wiring WRDL and the wiring WRDLb, and potentials with which the direction of polarization in the FTJ element FJAr is a negative direction and the direction of polarization in the FTJ element FJAbr is a positive direction in the circuit MPr are supplied from the circuit WDD to the circuit MPr through the wiring WRDLr and the wiring WRDLbr. In the case where "−1" is retained as the first data in the memory cell MC, potentials with which the direction of polarization in the FTJ element FJA is a negative direction and the direction of polarization in the FTJ element FJAb is a positive direction in the circuit MP are supplied from the circuit WDD to the circuit MP through the wiring WRDL and the wiring WRDLb, and potentials with which the direction of polarization in the FTJ element FJAr is a positive direction and the direction of polarization in the FTJ element FJAbr is a negative direction in the circuit MPr are supplied from the circuit WDD to the circuit MPr through the wiring WRDLr and the wiring WRDLbr. In the case where "0" is retained as the first data in the memory cell MC, potentials with which the direction of polarization in the FTJ element FJA is a negative direction and the direction of polarization in the FTJ element FJAb is a positive direction in the circuit MP are supplied from the circuit WDD to the circuit MP through the wiring WRDL and the wiring WRDLb, and potentials with which the direction of polarization in the FTJ element FJAr is a negative direction and the direction of polarization in the FTJ element FJAbr is a positive direction in the circuit MPr are supplied from the circuit WDD to the circuit MPr through the wiring WRDLr and the wiring WRDLbr.

Furthermore, the potentials supplied as the second data to the wiring RWLAa and the wiring RWLAb are defined as follows.

In the case where "1" is input as the second data to the memory cell MC, a high-level potential is supplied from the wiring RWLAa to the circuit MP and the circuit MPr, and a low-level potential is supplied from the wiring RWLAb to the circuit MP and the circuit MPr. In the case where "−1" is input as the second data to the memory cell MC, a low-level potential is supplied from the wiring RWLAa to the circuit MP and the circuit MPr, and a high-level potential is supplied from the wiring RWLAb to the circuit MP and the circuit MPr. In the case where "0" is input as the second data to the memory cell MC, a low-level potential is supplied from the wiring RWLAa to the circuit MP and the circuit MPr, and a low-level potential is supplied from the wiring RWLAb to the circuit MP and the circuit MPr.

That is, when "1" is input as the second data to the memory cell MC, the transistor M8 is turned on and the transistor M8m is turned off in the circuit MP and the transistor M8r is turned on and the transistor M8mr is turned off in the circuit MPr; thus, electrical continuity is established between the circuit MP and the wiring RDL[j], electrical continuity is established between the circuit MPr and the wiring RDLr[j], electrical continuity between the circuit MP and the wiring RDLr[j] is broken, and electrical continuity between the circuit MPr and the wiring RDL[j] is broken. When "−1" is input as the second data to the memory cell MC, the transistor M8 is turned off and the transistor M8m is turned on in the circuit MP and the transistor M8r is turned off and the transistor M8mr is turned on in the circuit MPr; thus, electrical continuity between the circuit MP and the wiring RDL[j] is broken, electrical continuity between the circuit MPr and the wiring RDLr[j] is broken, electrical continuity is established between the circuit MP and the wiring RDLr[j], and electrical continuity is established between the circuit MPr and the wiring RDL[j]. When "0" is input as the second data to the memory cell MC, the transistor M8 is turned off and the transistor M8m is turned off in the circuit MP and the transistor M8r is turned off and the transistor M8mr is turned off in the circuit MPr; thus, electrical continuity between the circuit MP and the wiring RDL[j] is broken, electrical continuity between the circuit MPr and the wiring RDLr[j] is broken, electrical continuity between the circuit MP and the wiring RDLr[j] is broken, and electrical continuity between the circuit MPr and the wiring RDL[j] is broken.

Since the first data retained in the memory cell MC and the second data input to the memory cell MC are defined as described above, the current flowing between the memory cell MC and the wiring RDL or the wiring RDLr is as shown in the following table.

TABLE 4

| First data | Second data | First data × Second data | Amount of current flowing between wiring RDL and circuit MP or circuit MPr | Amount of current flowing between wiring RDLr and circuit MP or circuit MPr |
|---|---|---|---|---|
| 1 | 1 | 1 | $I_{ut}$ | 0 |
| 1 | −1 | −1 | 0 | $I_{ut}$ |
| 1 | 0 | 0 | 0 | 0 |
| −1 | 1 | −1 | 0 | $I_{ut}$ |
| −1 | −1 | 1 | $I_{ut}$ | 0 |
| −1 | 0 | 0 | 0 | 0 |
| 0 | 1 | 0 | 0 | 0 |
| 0 | −1 | 0 | 0 | 0 |
| 0 | 0 | 0 | 0 | 0 |

That is, when the product of the first data and the second data is "1", current with the current amount $I_{ut}$ flows as an arithmetic operation result between the wiring RDL and the circuit MP or the circuit MPr; when the product of the first data and the second data is "−1", current with the current amount $I_{ut}$ flows as an arithmetic operation result between the wiring RDLr and the circuit MP or the circuit MPr; and when the product of the first data and the second data is "0", current with the current amount 0 flows as an arithmetic operation result between the wiring RDL and the circuit MP or the circuit MPr and between the wiring RDLr and the circuit MP or the circuit MPr (no current flows between the wiring RDL and the circuit MP or the circuit MPr and between the wiring RDLr and the circuit MP or the circuit MPr). In this manner, the first data is retained in the memory cell MC and then the second data is input to the memory cell MC, whereby the memory cell MC can calculate the product of the first data and the second data.

Next, the case where the plurality of pieces of second data are simultaneously supplied to the wiring RWLAa[1] to the wiring RWLAa[m] and the wiring RWLAb[1] to the wiring RWLAb[m] while the plurality of memory cells MC included in the memory cell array MCA retain the first data is considered. Note that the first data retained in the memory cell MC[i,j] (i is an integer greater than or equal to 1 and less than or equal to m, and j is an integer greater than or equal to 1 and less than or equal to n) is represented by W[i,j], and the second data supplied to the wiring RWLAa[i] and the wiring RWLAb[i] are represented by X[i].

For example, when X[1] to X[m] as the second data are input to the memory cell MC[1,j] to the memory cell MC[m, j] from the wiring RWLAa[1] to the wiring RWLAa[m] and the wiring RWLAb[1] to the wiring RWLAb[m] in the j-th column, the arithmetic operations of W[1,j]×X[1] to W[m, j]×X[m] are performed in the memory cell MC[1,j] to the memory cell MC[m,j].

Since the product of the first data and the second data is "1", "−1", or "0", among the memory cell MC[1,j] to the memory cell MC[m,j], the number of memory cells MC in which the product of the first data and the second data is "1" is P, the number of memory cells MC in which the product of the first data and the second data is "−1" is Q, and the number of memory cells MC in which the product of the first data and the second data is "0" is R (P, Q, and R are each an integer that is greater than or equal to 0 and satisfies P+Q+R=m). In that case, the total amount of current flowing through the wiring RDL[j] is $P \times I_{ut}$, and the total amount of current flowing through the wiring RDLr[j] is $Q \times I_{ut}$.

Here, for example, the circuit RDD has a function of obtaining a difference between the amount $P \times I_{ut}$ of current flowing through the wiring RDL[j] and the amount $Q \times I_{ut}$ of current flowing through the wiring RDLr[j] and converting the difference into a voltage value, so that the result of the product-sum operations of the plurality of pieces of first data and the plurality of pieces of second data in the memory cell MC[1,j] to the memory cell MC[m,j] can be output as the voltage value.

The circuit RDD may further have a function of performing an arithmetic operation of a function with the use of the product-sum result, for example. The circuit RDD that performs an arithmetic operation of an activation function using a product-sum result can perform an arithmetic operation of an artificial neural network, for example. As the activation function, for example, a sigmoid function, a tanh function, a softmax function, a ReLU function, a threshold function, or the like can be used.

Described above is the result of the product-sum operations of the plurality of pieces of first data and the plurality of pieces of second data in the memory cell MC[1,j] to the memory cell MC[m,j] positioned in the j-th column; however, the product-sum operations can be performed in columns other than the j-th column because the plurality of pieces of second data are transmitted through the wiring RWLAa[1] to the wiring RWLAa[m] and the wiring RWLAb[1] to the wiring RWLAb[m] extending in the row direction. That is, in the case where the arithmetic circuit 110 calculates a product sum, product-sum operations whose number corresponds to the number of columns in the memory cell array MCA can be performed at the same time.

Although the case where the first data has a ternary value of "1", "0", and "−1" is described above, a change of the operation method, a change of the circuit structure, and the like enable the first data to have a binary value, a quaternary or higher-level value, or an analog value in some cases.

Although the case where the second data has a ternary value of "1", "0", and "−1" is described above, a change of the operation method, a change of the circuit structure, and the like enable the second data to have a binary value, a quaternary or higher-level value, or an analog value.

For example, in the operation of the arithmetic circuit, a potential that corresponds to the second data and is supplied to each of the wiring RWLAa and the wiring RWLAb is a pulse voltage. When the pulse voltage input from one of the wiring RWLAa and the wiring RWLAb is a high-level potential, the transistor M8 and transistor M8r or the transistor M8m and transistor M8mr are in the on state during the input time of the pulse voltage.

Here, when the direction of polarization in the FTJ element FJA is a positive direction and the direction of polarization in the FTJ element FJAb is a negative direction in the circuit MP and the direction of polarization in the FTJ element FJAr is a negative direction and the direction of polarization in the FTJ element FJAbr is a positive direction in the circuit MPr (i.e., when the first data retained in the memory cell MC is "1"), current flows from the circuit MP to one of the wiring RDL and the wiring RDLr during the input time.

The case where the memory cell MC retains "1" as the first data is considered, for example. When the second data is "1", a high-level potential is supplied to the wiring RWLAa and a low-level potential is supplied to the wiring RWLAb during input time $T_{ut}$. At this time, the amount of charge flowing between the circuit MP of the memory cell MC and the wiring RDL is $T_{ut} \times I_{MP}$, the amount of charge flowing between the circuit MPr of the memory cell MC and the wiring RDL is 0, the amount of charge flowing between the circuit MP of the memory cell MC and the wiring RDLr is 0, and the amount of charge flowing between the circuit MPr of the memory cell MC and the wiring RDLr is 0.

When the second data is "2", a high-level potential is supplied to the wiring RWLAa and a low-level potential is supplied to the wiring RWLAb during input time $2 \times T_{ut}$. At this time, the amount of charge flowing between the circuit MP of the memory cell MC and the wiring RDL is $2 \times T_{ut} \times I_{MP}$, the amount of charge flowing between the circuit MPr of the memory cell MC and the wiring RDL is 0, the amount of charge flowing between the circuit MP of the memory cell MC and the wiring RDLr is 0, and the amount of charge flowing between the circuit MPr of the memory cell MC and the wiring RDLr is 0.

When the second data is "−2", a low-level potential is supplied to the wiring RWLAa and a high-level potential is supplied to the wiring RWLAb during input time $2 \times T_{ut}$. At this time, the amount of charge flowing between the circuit MP of the memory cell MC and the wiring RDL is 0, the amount of charge flowing between the circuit MPr of the memory cell MC and the wiring RDL is 0, the amount of charge flowing between the circuit MP of the memory cell MC and the wiring RDLr is $2 \times T_{ut} \times I_{MP}$, and the amount of charge flowing between the circuit MPr of the memory cell MC and the wiring RDLr is 0.

As described above, increasing and decreasing the input time of the pulse voltages supplied to the wiring RWLAa and the wiring RWLAb can change the amount of charge flowing between the wiring RDL and the circuit MP or the circuit MPr of the memory cell MC and the amount of charge flowing between the wiring RDLr and the circuit MP or the circuit MPr of the memory cell MC. Specifically, the amount of charge flowing through each of the wiring RDL and the wiring RDLr is proportional to the input time of the pulse voltage; thus, determining the input time in accordance with the value of the second data enables the memory cell MC to supply charge with the amount corresponding to the result of the product of the first data and the second data, in which the second data is a binary value, a quaternary or higher-level value, or an analog value, to the wiring RDL or the wiring RDLr.

Here, when the circuit RDD includes a circuit that converts the amount of charge flowing through the wiring RDL and the amount of charge flowing through the wiring RDLr into voltage values (e.g., a QV converter circuit or an integrator circuit), for example, the circuit RDD can obtain the amount of charge flowing through the wiring RDL and the amount of charge flowing through the wiring RDLr as the voltage values.

For another example, when the circuit RDD includes a circuit that compares a voltage value corresponding to the amount of charge flowing through the wiring RDL and a voltage value corresponding to the amount of charge flowing through the wiring RDLr and outputs the comparison result as a voltage value, the circuit RDD can output the result of the product-sum operations of the plurality of pieces of first data and the plurality of pieces of second data in the memory cell MC[1,j] to the memory cell MC[m,j] as the voltage value.

Although the operation in which the pulse voltages are supplied to the wiring RWLAa and the wiring RWLAb is described in the above example, the product-sum operation may be, for example, an operation in which a pulse voltage is supplied to at least one of the wiring FCA, the wiring FCB, and the like. For example, predetermined voltages are input as pulse voltages to the wiring FCA and the wiring FCB at the time when charge is supplied between the memory cell MC and each of the wiring RDL and the wiring RDLr. For another example, the product-sum operation may be an operation in which a pulse voltage is supplied to at least one of the wiring VCE, the wiring VCEr, and the like. For example, predetermined voltages are input as pulse voltages to the wiring VCE and the wiring VCEr at the time when charge is supplied between the memory cell MC and each of the wiring RDL and the wiring RDLr.

Note that this embodiment can be combined with any of the other embodiments described in this specification as appropriate.

Embodiment 4

This embodiment describes a memory cell that is different from the memory cell MC described in the above embodiments. The memory cell is applicable to a memory device that is a semiconductor device of one embodiment of the present invention.

Structure Example

Figure 17:
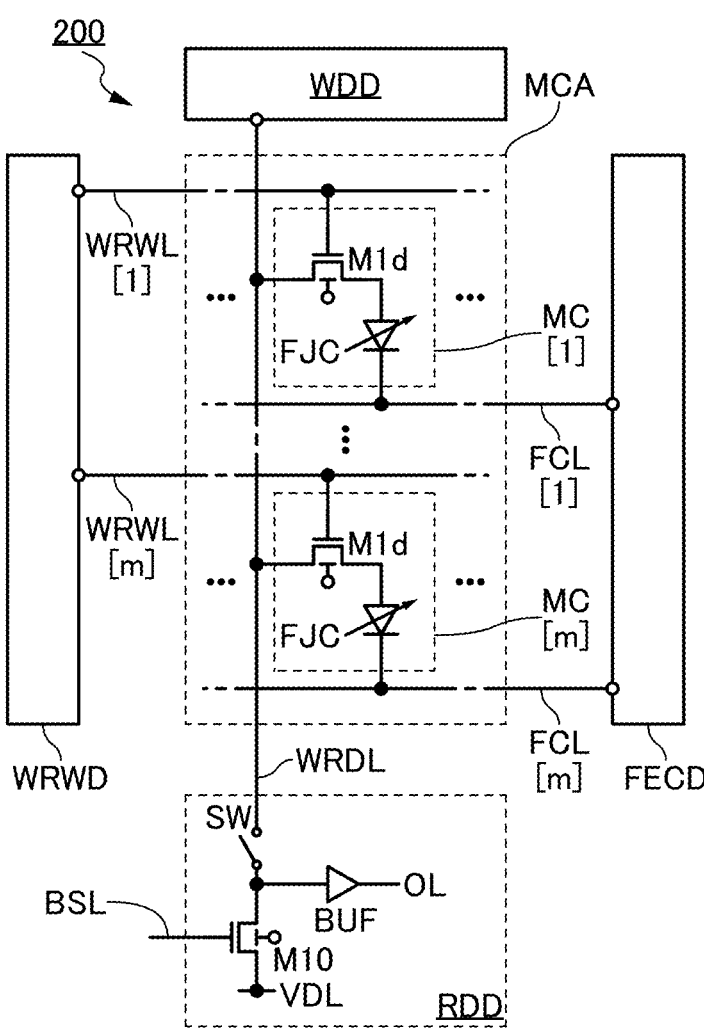
FIG. 17 is a block diagram illustrating a structure example of a memory device.

FIG. 17 illustrates a structure example of a memory device 200. The memory device 200 includes the memory cell array MCA, the circuit WDD, the circuit RDD, the circuit WRWD, and the circuit FECD, for example.

The memory cell array MCA illustrated in FIG. 17 includes the plurality of memory cells MC. Specifically, plurality of memory cells MC are arranged in a matrix in the memory cell array MCA. Note that in the memory cell array MCA illustrated in FIG. 17, the memory cells MC are arranged in m rows, for example. FIG. 17 illustrates one column of a plurality of columns in the memory cell array MCA.

Thus, square brackets for indicating addresses are added to the reference numerals of the circuit elements, the wirings, and the like included in the memory cell array MCA in FIG. 17. For example, in FIG. 17, the memory cell MC positioned in the first row is denoted as a memory cell MC[1], and the memory cell MC positioned in the m-th row is denoted as a memory cell MC[m].

The plurality of memory cells MC each include a transistor M1$d$ and an FTJ element FJC, for example.

As the transistor M1$d$, a transistor that can be used as the transistor M1 described in Embodiment 1 can be used, for example.

As the FTJ element FJC, for example, an FTJ element that can be used as the FTJ element FJA and the FTJ element FJAb described in Embodiment 1 can be used.

In the memory cell MC[1] in FIG. 17, a first terminal of the transistor M1$d$ is electrically connected to the wiring WRDL, a second terminal of the transistor M1$d$ is electrically connected to an input terminal of the FTJ element FJC, and a gate of the transistor M1$d$ is electrically connected to the wiring WRWL[1]. An output terminal of the FTJ element FJC is electrically connected to a wiring FCL[1].

In the memory cell MC[m] in FIG. 17, the first terminal of the transistor M1$d$ is electrically connected to the wiring WRDL, the second terminal of the transistor M1$d$ is electrically connected to the input terminal of the FTJ element FJC, and the gate of the transistor M1$d$ is electrically connected to the wiring WRWL[m]. The output terminal of the FTJ element FJC is electrically connected to a wiring FCL[m].

The circuit WDD is electrically connected to the wiring WRDL. The circuit WDD has a function of supplying a potential corresponding to data for writing to one of the memory cell MC[1] to the memory cell MC[m] through the wiring WRDL, for example. The circuit WDD also has a function of supplying a potential corresponding to data read from one of the memory cell MC[1] to the memory cell MC[m] to a read circuit or the like.

The circuit WRWD is electrically connected to the wiring WRWL[1] to the wiring WRWL[m]. The circuit WRWD has a function of transmitting a selection signal to one of the wiring WRWL[1] to the wiring WRWL[m] and transmitting a non-selection signal to the other wirings at the time of a writing operation or a reading operation, for example, in order to select a memory cell MC subjected to such an operation from the memory cell MC[1] to the memory cell MC[m].

The circuit FECD is electrically connected to the wiring FCL[1] to the wiring FCL[m]. When data is written to the memory cell MC selected by the circuit WRWD or data is read from the memory cell MC, for example, the circuit FECD has a function of supplying a predetermined potential to the wiring FCL in the same row as the selected memory cell MC.

The circuit RDD illustrated in FIG. 17 includes a switch SW, a transistor M10, and a buffer circuit BUF.

The circuit RDD has a function of reading data retained in one of the plurality of memory cells MC by converting current flowing from the one of the plurality of memory cells MC included in the memory cell array MCA into voltage, for example.

In the circuit RDD in FIG. 17, the wiring WRDL is electrically connected to a first terminal of the switch SW, and a second terminal of the switch SW is electrically connected to a first terminal of the transistor M10 and an input terminal of the buffer circuit BUF. A second terminal of the transistor M10 is electrically connected to a wiring VDL, and a gate of the transistor M10 is electrically connected to a wiring BSL. An output terminal of the buffer circuit BUF is electrically connected to a wiring OL.

The switch SW is configured to be in the off state during a writing operation performed in any one of the memory cell MC[1] to the memory cell MC[m] electrically connected to the wiring WRDL, for example. Alternatively, the switch SW is configured to be in the on state during a writing operation performed in any one of the memory cell MC[1] to the memory cell MC[m] electrically connected to the wiring WRDL.

As the switch SW, an electrical switch such as an analog switch or a transistor can be used, for example. When a transistor is used as the switch SW, for example, the transistor can be a transistor having a structure similar to that of the transistor M1. Other than the electrical switch, a mechanical switch may be used.

The transistor M10 functions as a load for converting current flowing through the wiring WRDL into voltage, for example. When a bias voltage is applied to the gate of the transistor M10 from the wiring BSL and a high-level potential is supplied to the second terminal of the transistor M10 from the wiring VDL, for example, the potential of the first terminal of the transistor M10 is determined in accordance with current flowing from the wiring WRDL to the first terminal of the transistor M10 through the switch SW.

The buffer circuit BUF included in the circuit RDD functions as a circuit for stably outputting, to the wiring OL, a potential equal to the potential of the first terminal of the transistor M10.

That is, the circuit RDD converts the current that flows through the wiring WRDL and corresponds to the data read from the memory cell MC into voltage by the transistor M10, and outputs the voltage to the wiring OL. The data read from the memory cell MC can be read by obtaining the voltage of the wiring OL.

Operation Example

First, an operation of writing data to the memory cell MC illustrated in FIG. 17 is described. Here, an operation of writing data to the memory cell MC[1] is described, for example.

In the case where data is written to the memory cell MC[1], the memory cell MC[1] is selected as a data writing target by the circuit WRWD. Specifically, the circuit WRWD supplies a high-level potential to the wiring WRWL[1] and supplies a low-level potential to the wiring WRWL[2] to the wiring WRWL[m]. At this time, the high-level potential is input to the gate of the transistor M1$d$ in the memory cell MC[1], whereby the transistor M1$d$ in the memory cell MC[1] is turned on. Meanwhile, the low-level potential is input to the gates of the transistors M1$d$ in the memory cell MC[2] to the memory cell MC[m], whereby the transistors M1$d$ in the memory cell MC[2] to the memory cell MC[m] are turned off.

At the time of the writing operation in the memory device 200, the switch SW in the circuit RDD is turned off to prevent transmission of data for writing from the wiring WRDL to the circuit RDD.

To the wiring FCL[1], a reference potential is supplied from the circuit FECD, for example. The reference potential may be, for example, the ground potential, a low-level potential, or the like.

As the data for writing, the potential $V_0$ or the potential $V_1$ is supplied to the wiring WRDL from the circuit WDD. Note that $V_0$ is a potential lower than the reference potential supplied to the wiring FCL[1], for example. In the case where the reference potential is supplied to the output terminal of the FTJ element FJC, $V_0$ supplied to the input terminal of the FTJ element FJC is set to a potential with which polarization occurs (the direction of polarization changes) in a material that can have ferroelectricity in the FTJ element FJC. Since $V_0$ is a potential lower than the reference potential, the direction of polarization written to the FTJ element FJC is from the output terminal to the input terminal (the negative direction). $V_1$ is a potential higher than the reference potential supplied to the wiring FCL[1], for example. In the case where the reference potential is supplied to the output terminal of the FTJ element FJC, $V_1$ supplied to the input terminal of the FTJ element FJC is set to a potential with which polarization occurs (the direction of polarization changes) in the material that can have ferroelectricity in the FTJ element FJC. Since $V_1$ is a potential higher than the reference potential, the direction of polarization written to the FTJ element FJC is from the input terminal to the output terminal (the positive direction).

After the data for writing is supplied to the wiring WRDL from the circuit WDD, a low-level potential is supplied to the wiring WRWL[1] from the circuit WRWD. At this time, the low-level potential is input to the gate of the transistor M1$d$ in the memory cell MC[1], whereby the transistor M1$d$ in the memory cell MC[1] is turned off.

By the above-described operation, data can be written to the memory cell MC[1] in the memory device 200.

Next, an operation of reading data from the memory cell MC illustrated in FIG. 17 is described. Here, an operation of reading data from the memory cell MC[1] is described, for example.

In the case where data is read from the memory cell MC[1], the memory cell MC[1] is selected as a data reading target by the circuit WRWD. Specifically, the circuit WRWD supplies a high-level potential to the wiring WRWL[1] and supplies a low-level potential to the wiring WRWL[1] to the wiring WRWL[m]. At this time, the high-level potential is input to the gate of the transistor M1$d$ in the memory cell MC[1], whereby the transistor M1$d$ in the memory cell MC[1] is turned on. Meanwhile, the low-level potential is input to the gates of the transistors M1$d$ in the memory cell MC[2] to the memory cell MC[m], whereby the transistors M1$d$ in the memory cell MC[2] to the memory cell MC[m] are turned off.

At the time of the reading operation in the memory device 200, the switch SW in the circuit RDD is turned on.

To the wiring FCL[1], the reference potential is supplied from the circuit FECD, for example.

A potential higher than the reference potential is supplied to the wiring VDL, for example.

At this time, electrical continuity is established between the input terminal of the FTJ element FJC in the memory cell MC[1] and the first terminal of the transistor M10 in the circuit RDD. Moreover, tunnel current flows between the input terminal and the output terminal of the FTJ element FJC in the memory cell MC[1]. Note that the amount of tunnel current depends on the polarization direction (the positive direction or the negative direction) in the material that can have ferroelectricity in the FTJ element FJC.

In the circuit RDD, the potential of the first terminal of the transistor M10 is determined in accordance with the amount of current flowing from the wiring WRDL to the input terminal of the FTJ element FJC in the memory cell MC[1].

As a result, a potential substantially equal to the potential of the first terminal of the transistor M10 is output to the output terminal of the buffer circuit BUF. Here, the data retained in the memory cell MC[1] can be read by obtaining the potential from the wiring OL.

As described above, in the reading operation in the memory device 200, the tunnel current flows between the input terminal and the output terminal of the FTJ element FJC included in each of the memory cell MC[1] to the memory cell MC[m]. The amount of tunnel current is determined in accordance with the direction of polarization in the material that can have ferroelectricity in the FTJ element FJC, the material, the voltage between the input terminal and the output terminal, and the like, and is approximately greater than or equal to $1\times10^{-8}$ A/cm$^2$ and less than or equal to $1\times10^{-7}$ A/cm$^2$ in some cases.

Here, with the use of a Si transistor as the transistor M1$d$ included in each of the memory cell MC[1] to the memory cell MC[m], even when the transistor M1$d$ is in the off state, a current of approximately $1\times10^{-10}$ A or lower sometimes flows as an off-state current (leakage current), for example. The same applies to the case where a Si transistor is used as the transistor M10 included in the circuit RDD.

In particular, in the case where the amount of tunnel current flowing between the input terminal and the output terminal of the FTJ element FJC is in an operation region where an off-state current flows in the transistor M10, the potential of the first terminal of the transistor M10 becomes approximately equal to the potential of the second terminal of the transistor M10, i.e., the potential supplied from the wiring VDL. That is, even when the amount of tunnel current flowing between the input terminal and the output terminal of the FTJ element FJC changes, the potential of the first terminal of the transistor M10 hardly changes. Thus, it is difficult to read data retained in the memory cell MC on the basis of the amount of tunnel current flowing between the input terminal and the output terminal of the FTJ element FJC in the memory cell MC.

In the case where a Si transistor is used as the transistor M1$d$, the transistor M10, or the like, the amount of tunnel current flowing between the input terminal and the output terminal of the FTJ element FJC is preferably large in order to read the data retained in the memory cell MC. Specifically, for example, the amount of tunnel current is set to the amount of current flowing in a subthreshold region, a saturation region, or the like in the transistor M1$d$, the transistor M10, or the like. To increase the amount of tunnel current flowing between the input terminal and the output terminal of the FTJ element FJC, the area of a pair of electrodes of the FTJ element FJC is enlarged, for example.

With the use of an OS transistor as the transistor M1$d$ included in each of the memory cell MC[1] to the memory cell MC[m], a drain current per micrometer of channel width of lower than $1\times10^{-20}$ A, lower than $1\times10^{-22}$ A, or lower than $1\times10^{-24}$ A can sometimes flow in a region where the gate-source voltage of the transistor M1$d$ is lower than its threshold voltage. In addition, a drain current per micrometer of channel width of lower than or equal to $1.0\times10^{-8}$ A, lower than or equal to $1.0\times10^{-12}$ A, or lower than or equal to $1.0\times10^{-15}$ A can sometimes flow in a region where the gate-source voltage of the transistor M1$d$ is in the vicinity of the threshold voltage of the transistor M1$d$.

Figure 18:
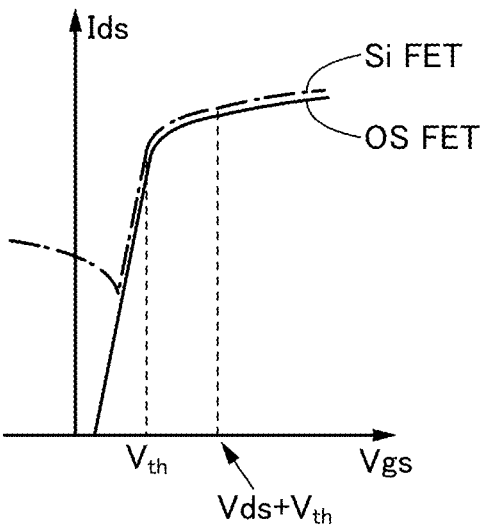
FIG. 18 is a timing chart showing an operation example of a memory device.

FIG. 18 shows the overviews of the characteristics of the source-drain current (Ids) and the gate-source voltage (Vgs) of a Si transistor (Si FET) and an OS transistor (OS FET). In the characteristics in FIG. 18, the Si FET and the OS FET are regarded as having the equivalent threshold voltage ($V_{th}$). In the case where Vgs is higher than the sum of the source-drain voltage Vds and $V_{th}$, for example, the transistors operate in their linear regions; in the case where Vgs is higher than $V_{th}$ and lower than or equal to the sum of the source-drain voltage Vds and $V_{th}$, the transistors operate in their saturation regions; and in the case where Vgs is lower than or equal to $V_{th}$, the transistors operate in their subthreshold regions.

As shown in FIG. 18, an OS transistor can have a wider range of the gate voltage where the transistor operates in a subthreshold region than a Si transistor. Specifically, when the threshold voltage of an OS transistor is $V_{th}$, a circuit operation using the gate voltage in the voltage range of $V_{th}-1.0$ V to $V_{th}$ inclusive, or $V_{th}-0.5$ V to $V_{th}$ inclusive, is possible in the subthreshold region.

Thus, in the case where an OS transistor is used as the transistor M1$d$, the transistor M10, or the like and the amount of tunnel current flowing between the input terminal and the output terminal of the FTJ element FJC is in a subthreshold region in the transistor M10, the potential of the first terminal of the transistor M10 is determined in accordance with the amount of tunnel current. Accordingly, the data retained in the memory cell MC can be read on the basis of the amount of tunnel current flowing between the input terminal and the output terminal of the FTJ element FJC in the memory cell MC.

With the use of an OS transistor as the transistor M10, the amount of current flowing in a subthreshold region in the transistor M10 can be read as a potential, and when the potential is within the range where the transistor M10 operates in the subthreshold region, the amount of tunnel current flowing between the input terminal and the output terminal of the FTJ element FJC can be reduced. To reduce the amount of tunnel current flowing between the input terminal and the output terminal of the FTJ element FJC, the area of the pair of electrodes of the FTJ element FJC is reduced, for example.

That is, the use of an OS transistor as the transistor M1$d$, the transistor M10, or the like in the memory device 200 can reduce the circuit area necessary for the FTJ element FJC, thereby downsizing the memory cell MC in the memory device 200. A reduction in the amount of tunnel current flowing through the FTJ element FJC can reduce the power consumption required for the reading operation in the memory device 200.

Note that this embodiment can be combined with any of the other embodiments described in this specification as appropriate.

Embodiment 5

This embodiment will describe structure examples of the semiconductor device described in the above embodiments and structure examples of transistors that can be used in the semiconductor device described in the above embodiments.

Structure Example 1 of Semiconductor Device

Figure 19:
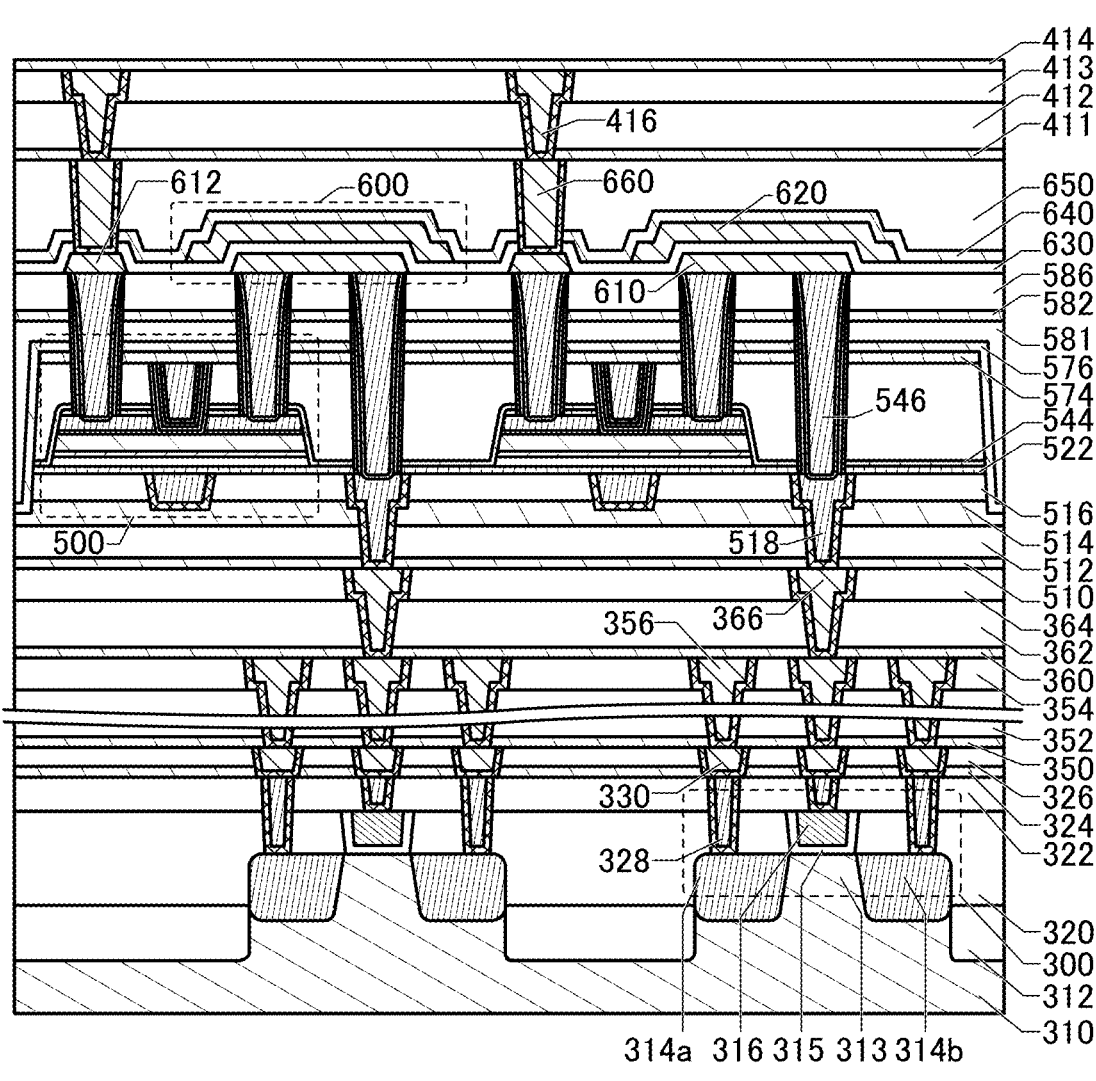
FIG. 19 is a schematic cross-sectional view illustrating a structure example of a semiconductor device.
Figures 20A, 20B, 20C:
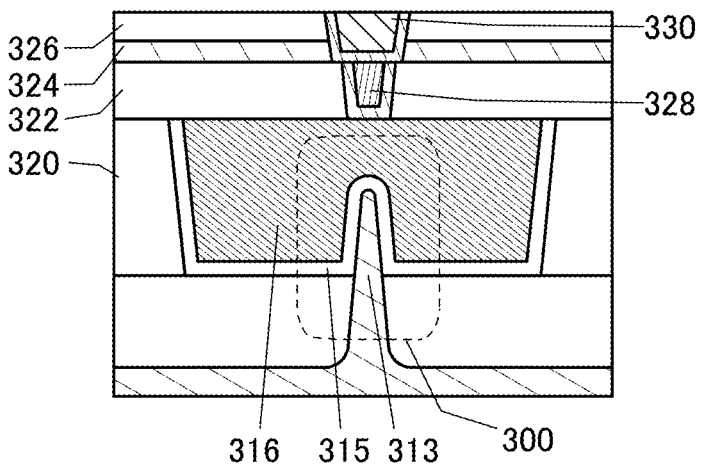
FIG. 20A to FIG. 20C are schematic cross-sectional views illustrating a structure example of a transistor.

FIG. 19 illustrates a semiconductor device including a memory cell having a capacitor, and the semiconductor device includes a transistor 300, a transistor 500, and a capacitor 600. FIG. 20A is a cross-sectional view of the transistor 500 in the channel length direction, FIG. 20B is a cross-sectional view of the transistor 500 in the channel width direction, and FIG. 20C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. The transistor 500 is used as the transistor M1, the transistor M1b, or the like included in a semiconductor device, for example, the memory cell MC described in the above embodiments, whereby a semiconductor device whose operating capability hardly deteriorates even at high temperatures can be obtained. In particular, when the transistor 500 is used as the transistor M1 or the transistor M1b, for example, a potential written to the capacitor of the memory cell MC can be retained for a long time by utilizing the feature of a low off-state current.

The transistor 500 is provided above the transistor 300, for example, and the capacitor 600 is provided above the transistor 300 and the transistor 500, for example. Note that the capacitor 600 can be a capacitor that retains a potential corresponding to data written to the memory cell, for example. Note that depending on a circuit structure, the capacitor 600 illustrated in FIG. 19 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used as, for example, the transistor M6, the transistor M6b, or the like described in the above embodiments. Note that FIG. 19 illustrates a structure in which a gate of the transistor 300 is electrically connected to one of a source and a drain of the transistor 500 through a pair of electrodes of the capacitor 600; however, depending on the structure of the semiconductor device of one embodiment of the present invention, it is possible to employ a structure in which one of a source and a drain of the transistor 300 is electrically connected to one of the source and the drain of the transistor 500 through one of the pair of electrodes of the capacitor 600, a structure in which one of the source and the drain of the transistor 300 is electrically connected to a gate of the transistor 500 through one of the pair of electrodes of the capacitor 600, or a structure in which each terminal of the transistor 300 is not electrically connected to each terminal of the transistor 500 or each terminal of the capacitor 600.

A semiconductor substrate (e.g., a single crystal substrate or a silicon substrate) is preferably used as the substrate 310.

In the transistor 300, a top surface and a side surface in the channel width direction of the semiconductor region 313 are covered with the conductor 316 with the insulator 315 therebetween, as illustrated in FIG. 20C. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure using silicon whose effective mass is controlled by applying stress to the crystal lattice and changing the lattice spacing may be employed. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 21:
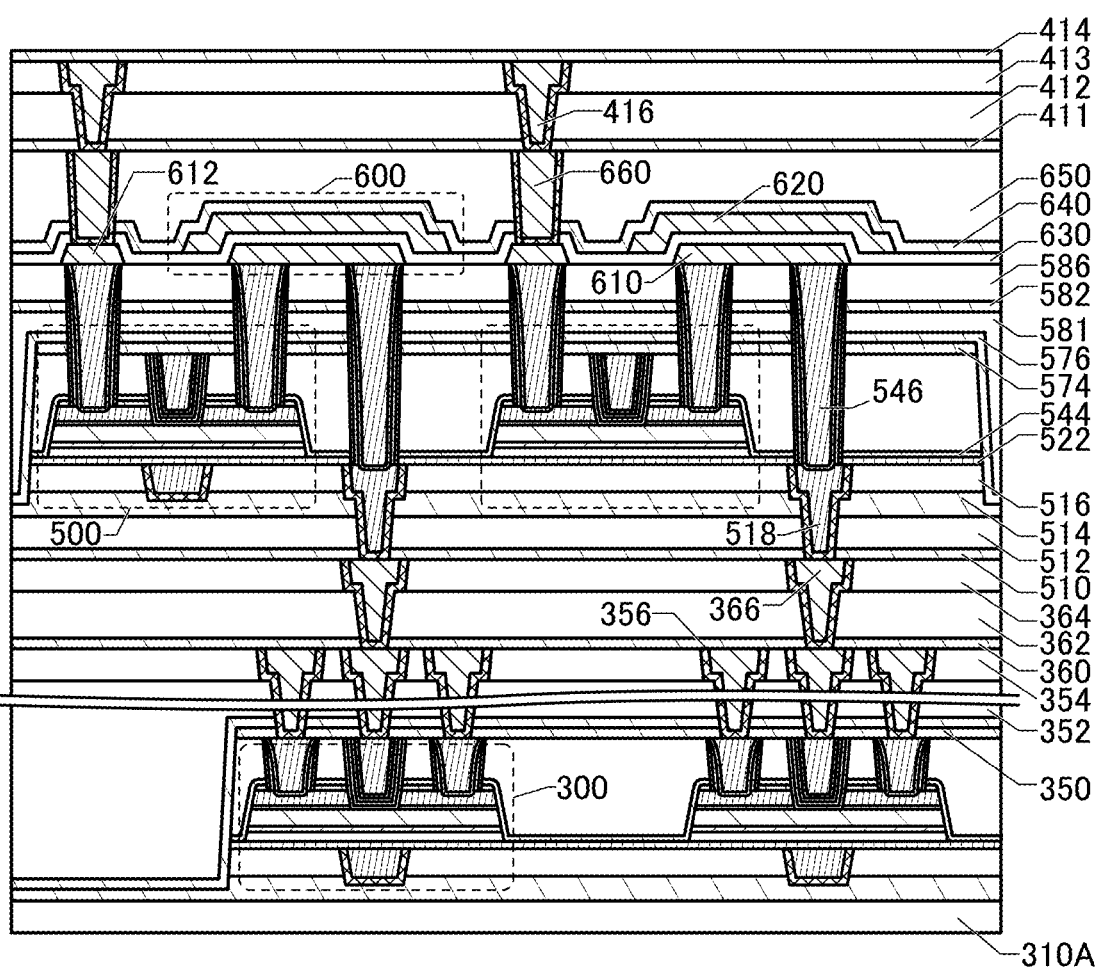
FIG. 21 is a schematic cross-sectional view illustrating a structure example of a semiconductor device.

Note that the transistor 300 illustrated in FIG. 19 is an example and the structure is not limited thereto; an appropriate transistor is used in accordance with a circuit structure, a driving method, or the like. For example, the transistor 300 may have a planar structure instead of a FIN-type structure illustrated in FIG. 20C. For example, when a semiconductor device is configured as a single-polarity circuit using only OS transistors, the transistor 300 can have a structure similar to that of the transistor 500 using an oxide semiconductor, as illustrated in FIG. 21. Note that the details of the transistor 500 will be described later. In this specification and the like, a single-polarity circuit refers to a circuit including only either n-channel transistors or p-channel transistors.

Note that in FIG. 21, the transistor 300 is provided over a substrate 310A; in this case, a semiconductor substrate may be used as the substrate 310A, as in the case of the substrate 310 in the semiconductor device in FIG. 19. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 illustrated in FIG. 19, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320 and the insulator 322. For example, the top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for the interlayer film, the parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material of each of plugs and wirings (e.g., the conductor 328 and the conductor 330), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 19, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. The insulator 352 and the insulator 354 are preferably formed using an insulator having a relatively low dielectric constant to reduce the parasitic capacitance generated between wirings, like the insulator 326. Furthermore, the conductor 356 preferably contains a conductor having a barrier property against impurities such as hydrogen and water. In particular, the conductor having a barrier property against hydrogen is formed in an opening portion included in the insulator 350 having a barrier property against hydrogen. With this structure, the transistor 300 and the transistor 500 can be separated by the barrier layer, so that diffusion of hydrogen from the transistor 300 into the transistor 500 can be inhibited.

For the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. Like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An opening portion is formed in regions of the insulator 360, the insulator 362, and the insulator 364 that overlap with part of the conductor 356, and a conductor 366 is provided to fill the opening portion. The conductor 366 is also formed over the insulator 362. The conductor 366 has a function of a plug or a wiring connected to the transistor 300, for example. Note that the conductor 366 can be provided using a material similar to those for the conductor 328 and the conductor 330.

An insulator 510, an insulator 512, an insulator 514, and an insulator 516 are stacked in this order over the insulator 364 and the conductor 366. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 310, a region where the transistor 300 is provided, or the like into the region where the transistor 500 is provided. Thus, a material similar to that for the insulator 324 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the fabrication process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

A conductor 518, a conductor included in the transistor 500 (e.g., a conductor 503 illustrated in FIG. 20A and FIG. 20B), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, a region of the conductor 518 that is in contact with the insulator 510 and the insulator 514 is preferably a conductor having a barrier property against oxygen, hydrogen, and water. With this structure, the transistor 300 and the transistor 500 can be separated by the layer having a barrier property against oxygen, hydrogen, and water, so that diffusion of hydrogen from the transistor 300 into the transistor 500 can be inhibited.

The transistor 500 is provided above the insulator 516.

As illustrated in FIG. 20A and FIG. 20B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is over the insulator 554 and overlaps with part of the oxide 530b, and an insulator 544 provided over the insulator 522, the insulator 524, the oxide 530a, the oxide 530b, the conductor 542a, the conductor 542b, the insulator 571a, and insulator 571b. Here, as illustrated in FIG. 20A and FIG. 20B, the insulator 552 is in contact with the top surface of the insulator 522, the side surface of the insulator 524, the side surface of the oxide 530a, the side surface and the top surface of the oxide 530b, the side surface of the conductor 542 (the conductor 542a and the conductor 542b), the side surface of the insulator 571 (the insulator 571a and the insulator 571b), the side surface of the insulator 544, the side surface of an insulator 580, and the bottom surface of the insulator 550. The top surface of the conductor 560 is placed to be substantially level with the upper portion of the insulator 554, the upper portion of the insulator 550, the upper portion of the insulator 552, and the top surface of the insulator 580. An insulator 574 is in contact with part of at least one of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with the side surface of the conductor 560 and a region in contact with the bottom surface of the conductor 560.

The oxide 530 preferably includes the oxide 530a provided over the insulator 524 and the oxide 530b provided over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as a top gate) electrode, and the conductor 503 functions as a second gate (also referred to as a back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 22A:
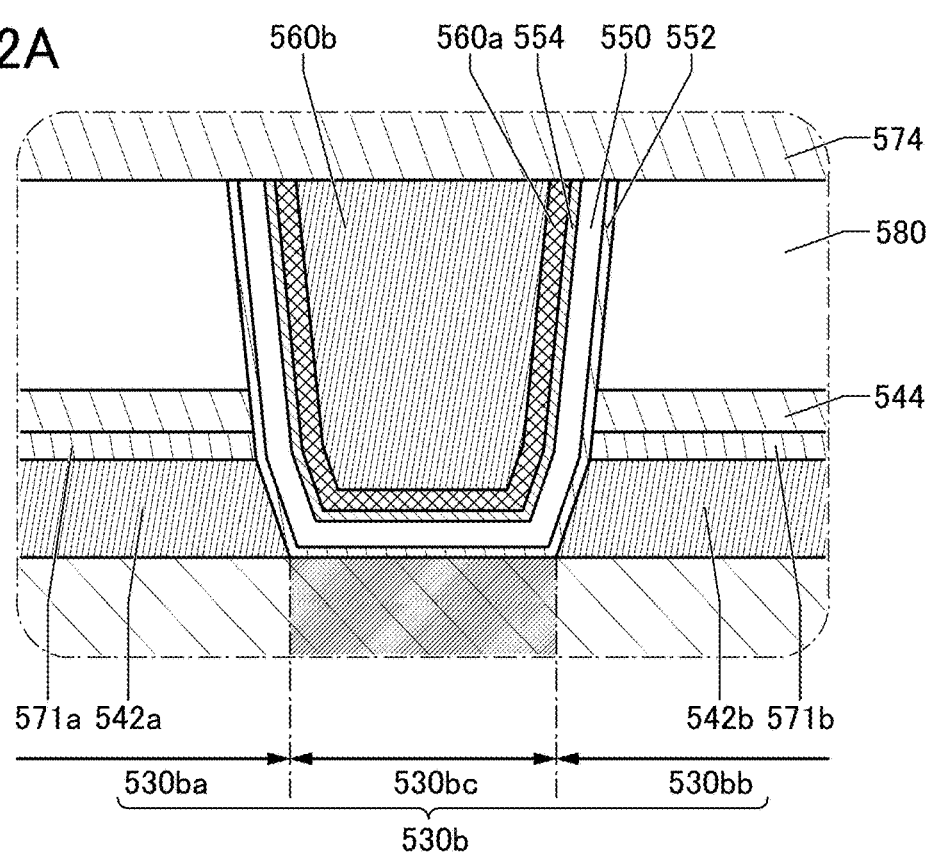
FIG. 22A and FIG. 22B are schematic cross-sectional views illustrating structure examples of a transistor.

Here, FIG. 22A is an enlarged view of the vicinity of the channel formation region in FIG. 20A. Supply of oxygen to the oxide 530b forms the channel formation region in a region between the conductor 542a and the conductor 542b. As illustrated in FIG. 22A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter, sometimes referred to as $V_OH$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_OH$ are preferably reduced as much as possible in the region of the oxide semiconductor where a channel is formed.

The region 530ba and the region 530bb functioning as the source region and the drain region are each a low-resistance region with an increased carrier concentration because they include a large amount of oxygen vacancies ($V_O$) or have a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 530bc functioning as the channel formation region is not particularly limited and can be, for example, $1 \times 10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 22A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of a metal oxide having such a wide band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a.

The oxide 530a is provided under the oxide 530b in the above manner, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies ($V_O$)). In particular, after the formation of a metal oxide, heat treatment is performed at a temperature at which the metal oxide does not become a polycrystal (e.g., 400° C. to 600° C., inclusive), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter, sometimes referred to as $V_O H$), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and $V_O H$ are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and $V_O H$. However, supply of an excess amount of oxygen to the source region or the drain region might cause a decrease in the on-state current or field-effect mobility of the transistor 500. Furthermore, a variation of the amount of oxygen supplied to the source region or the drain region in the substrate plane leads to a variation in characteristics of the semiconductor device including the transistor.

Therefore, the region 530*bc* functioning as the channel formation region in the oxide semiconductor is preferably an i-type or substantially i-type region with a reduced carrier concentration, whereas the region 530*ba* and the region 530*bb* functioning as the source region and the drain region are preferably n-type regions with high carrier concentrations. That is, it is preferable that oxygen vacancies and $V_O H$ in the region 530*bc* of the oxide semiconductor be reduced and the region 530*ba* and the region 530*bb* not be supplied with an excess amount of oxygen.

Thus, in this embodiment, microwave treatment is performed in an oxygen-containing atmosphere in a state where the conductor 542*a* and the conductor 542*b* are provided over the oxide 530*b* so that oxygen vacancies and $V_O H$ in the region 530*bc* can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530*bc* can be irradiated with the high-frequency wave such as a microwave or RF. By the effect of the plasma, a microwave, or the like, $V_O H$ in the region 530*bc* can be cut; thus, hydrogen H can be removed from the region 530*bc* and an oxygen vacancy $V_O$ can be filled with oxygen. That is, the reaction "$V_O H \rightarrow H + V_O$" occurs in the region 530*bc*, so that the hydrogen concentration in the region 530*bc* can be reduced. As a result, oxygen vacancies and $V_O H$ in the region 530*bc* can be reduced to lower the carrier concentration.

In the microwave treatment in an oxygen-containing atmosphere, the high-frequency wave such as the microwave or RF, the oxygen plasma, or the like is blocked by the conductor 542*a* and the conductor 542*b* and does not affect the region 530*ba* nor the region 530*bb*. In addition, the effect of the oxygen plasma can be reduced by the insulator 571 and the insulator 580 that are provided to cover the oxide 530*b* and the conductor 542. Hence, a reduction in $V_O H$ and supply of an excess amount of oxygen do not occur in the region 530*ba* and the region 530*bb* in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530*bc*. In addition, the insulator 552 is provided to be in contact with the side surface of the conductor 542 and the surface of the region 530*bc*, thereby preventing oxygen more than necessary from being supplied to the region 530*bc* and preventing the side surface of the conductor 542 from being oxidized. Furthermore, the side surface of the conductor 542 can be inhibited from being oxidized when an insulating film to be the insulator 550 is formed.

The oxygen supplied into the region 530*bc* has any of a variety of forms such as an oxygen atom, an oxygen molecule, and an oxygen radical (also referred to as an O radical, an atom or a molecule having an unpaired electron, or an ion). Note that the oxygen supplied into the region 530*bc* preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_O H$ can be selectively removed from the region 530*bc* in the oxide semiconductor, whereby the region 530*bc* can be an i-type or substantially i-type region. Furthermore, supply of an excess amount of oxygen to the region 530*ba* and the region 530*bb* functioning as the source region and the drain region can be inhibited and the conductivity can be maintained. As a result, a change in the electrical characteristics of the transistor 500 can be inhibited, and thus a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 20B, a curved surface may be provided between the side surface of the oxide 530*b* and the top surface of the oxide 530b in a cross-sectional view of the transistor 500 in the channel width direction. In other words, an end portion of the side surface and an end portion of the top surface may be curved (hereinafter, also referred to as rounded).

The radius of curvature of the curved surface is preferably greater than 0 nm and less than the thickness of the oxide 530b in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. Moreover, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 20A or the like, the insulator 552 formed using aluminum oxide or the like is provided in contact with the top and side surfaces of the oxide 530, whereby indium contained in the oxide 530 is unevenly distributed, in some cases, at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating film, which inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used as the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In this case, impurities such as water and hydrogen can be inhibited from diffusing to the transistor 500 side from the substrate side through the insulator 512 and the insulator 514. Impurities such as water and hydrogen can be inhibited from diffusing to the transistor 500 side from an interlayer insulating film and the like which are provided outside the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device, which have favorable characteristics and high reliability, can be fabricated.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1\times10^{13}$ $\Omega$cm, the insulator 512, the insulator 544, and the insulator 576 can sometimes reduce charge up of the conductor 503, the conductor 542, the conductor 560, or the like in treatment using plasma or the like in the fabrication process of a semiconductor device. The resistivities of the insulator 512, the insulator 544, and the insulator 576 are preferably higher than or equal to $1\times10^{10}$ $\Omega$cm and lower than or equal to $1\times10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, a single layer or a stacked layer of the above conductive material is used as the conductor 503a. For example, titanium nitride is used for the conductor 503a.

Moreover, the conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage ($V_{th}$) of the transistor 500 can be controlled. In particular, $V_{th}$ of the transistor 500 can be higher in the case where a negative potential is applied to the conductor 503, and the off-state current can be reduced. Thus, drain current at the time when a potential applied to the conductor 560 is 0 V can be lower in the case where a negative potential is applied to the conductor 503 than in the case where the negative potential is not applied to the conductor 503.

In the case where the oxide 530 is a highly purified intrinsic oxide and as many impurities as possible are eliminated from the oxide 530, the transistor 500 can be expected to become normally-off (the threshold voltage of the transistor 500 can be expected to higher than 0 V) in some cases with no potential application to the conductor 503 and/or the conductor 560. In that case, it is suitable to connect the conductor 560 and the conductor 503 to each other such that the same potential is supplied.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 20B, it is particularly preferable that the conductor 503 extend to a region outside end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 500 becomes normally-off and has the above-described S-Channel structure, the channel formation region can be electrically surrounded. Accordingly, the transistor 500 can be regarded as having a GAA (Gate All Around) structure or an LGAA (Lateral Gate All Around) structure. When the transistor 500 has the S-Channel structure, the GAA structure, or the LGAA structure, the channel formation region that is formed at the interface between the oxide 530 and the gate insulating film or in the vicinity of the interface can be formed in the entire bulk of the oxide 530. In other words, the transistor 500 having the S-Channel structure, the GAA structure, or the LGAA structure can be what is called a Bulk-Flow type, in which a carrier path is used as the entire bulk. A transistor structure with a Bulk-Flow type can improve the density of current flowing in the transistor and thus can be expected to improve the on-state current of the transistor or increase the field-effect mobility of the transistor.

Furthermore, as illustrated in FIG. 20B, the conductor 503 is extended to function as a wiring as well. However, without limitation to this structure, a structure in which a conductor functioning as a wiring is provided below the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Moreover, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As scaling down and high integration of transistors progress, a problem such as leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 522.

Silicon oxide or silicon oxynitride, for example, can be used as appropriate for the insulator 524 that is in contact with the oxide 530.

In a fabrication process of the transistor 500, heat treatment is preferably performed with a surface of the oxide 530 exposed. For example, the heat treatment is performed at a temperature higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. For another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and the top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with the top surface of the conductor 542a, and the insulator 571b is provided in contact with the top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon such as silicon nitride may be used for the insulator 571. The insulator 571 preferably has a function of capturing impurities such as hydrogen. In that case, for the insulator 571, a metal oxide having an amorphous structure, for example, an insulator such as aluminum oxide or magnesium oxide, may be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device, which have favorable characteristics and high reliability, can be fabricated.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and the insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above may be used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 20B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_O$H formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 20A, the insulator 552 is provided in contact with the side surfaces of the conductor 542, the insulator 544, the insulator 571, and the insulator 580. This can inhibit formation of an oxide film on the side surface of the conductor 542 by oxidization of the side surface. Accordingly, a reduction in on-state current or field-effect mobility of the transistor 500 can be inhibited.

Furthermore, the insulator 552 needs to be provided in an opening formed in the insulator 580 and the like, together with the insulator 554, the insulator 550, and the conductor 560. The thickness of the insulator 552 is preferably small for scaling down the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. An ALD method is a method in which deposition is performed by introducing a first source gas (also referred to as a precursor or a metal precursor) and a second source gas (also referred to as a reactant, an oxidizer, or a nonmetallic precursor) for reaction alternately into a chamber, and repeating the introduction of these source gases. As an ALD method, a thermal ALD method, in which a precursor and a reactant react with each other only by a thermal energy, a PEALD (Plasma Enhanced ALD) method, in which a reactant excited by plasma is used, and the like can be used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photo-electron spectroscopy (XPS).

The insulator 550 functions as part of the gate insulator. The insulator 550 is preferably provided in contact with the top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15 nm or less than or equal to 20 nm. Note that the above-described lower limits and upper limits can be combined with each other. In that case, at least part of the insulator 550 includes a region having the above-described thickness.

Although FIG. 20A, FIG. 20B, and the like illustrate a single-layer structure of the insulator 550, the present invention is not limited to this structure, and a stacked-layer structure of two or more layers may be employed. For example, as illustrated in FIG. 22B, the insulator 550 may have a stacked-layer structure including two layers of an insulator 550a and an insulator 550b over the insulator 550a.

Figure 22B:
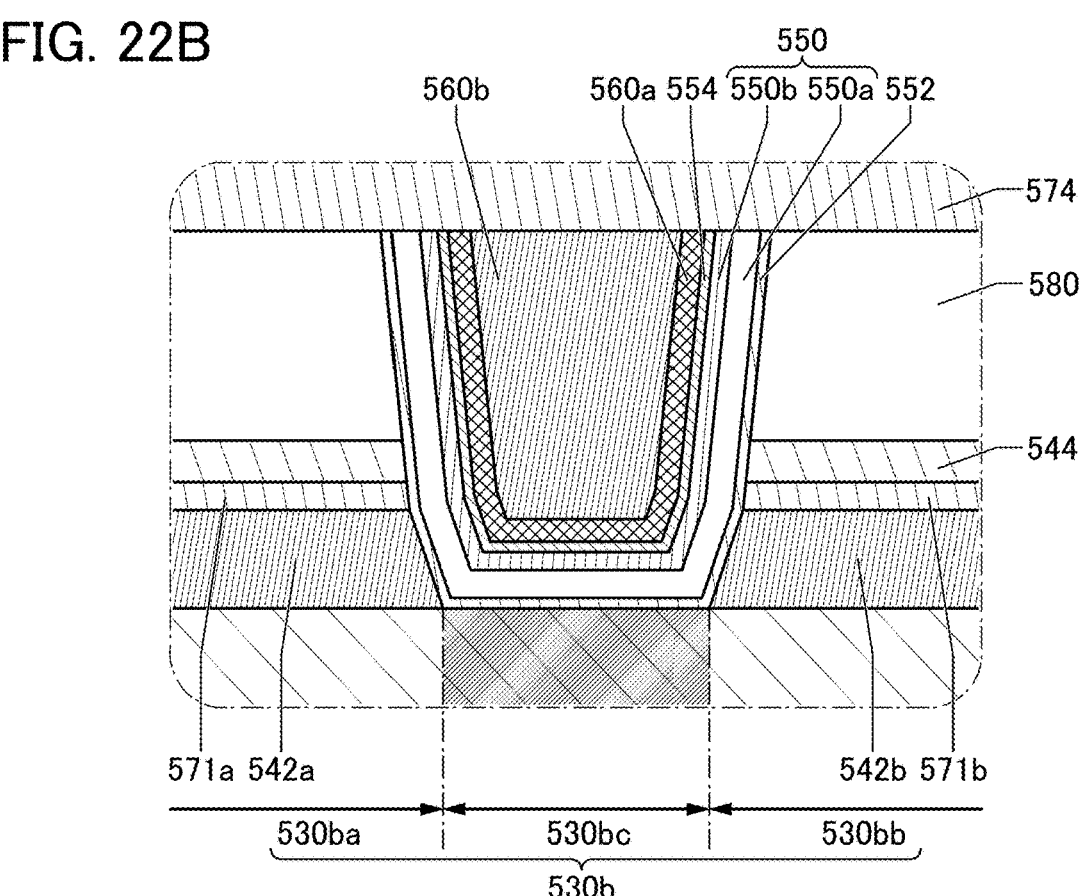

In the case where the insulator 550 has a stacked-layer structure of two layers as illustrated in FIG. 22B, it is preferable that the insulator 550a in a lower layer be formed using an insulator that is likely to transmit oxygen and the insulator 550b in an upper layer be formed using an insulator having a function of inhibiting oxygen diffusion. With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during the operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of a gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above may be used. For example, silicon nitride deposited by a PEALD method may be used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

Furthermore, the insulator 554 needs to be provided in an opening formed in the insulator 580 and the like, together with the insulator 552, the insulator 550, and the conductor 560. The thickness of the insulator 554 is preferably small for scaling down the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover the bottom surface and the side surface of the conductor 560b. As illustrated in FIG. 20A and FIG. 20B, the upper portion of the conductor 560 is substantially level with the upper portion of the insulator 550. Note that although the conductor 560 has a two-layer structure of the conductor 560a and the conductor 560b in FIG. 20A and FIG. 20B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

Furthermore, the conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 20B, in the channel width direction of the transistor 500, with reference to the bottom surface of the insulator 522, the level of the bottom surface of the conductor 560 in a region where the conductor 560 and the oxide 530b do not overlap with each other is preferably lower than the level of the bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for an interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device, which have favorable characteristics and high reliability, can be fabricated.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon such as silicon nitride or silicon nitride oxide. For example, silicon nitride deposited by a sputtering method may be used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductor 540a and the conductor 540b are collectively referred to as a conductor 540.

The conductor 540a is provided in a region overlapping with the conductor 542a, for example. Specifically, an opening portion is formed in the insulator 571, the insulator 544, the insulator 580, the insulator 574, the insulator 576, and the insulator 581 illustrated in FIG. 20A and in an insulator 582 and an insulator 586 illustrated in FIG. 19 in the region overlapping with the conductor 542a, and the conductor 540a is provided inside the opening portion. The conductor 540b is provided in a region overlapping with the conductor 542b, for example. Specifically, an opening portion is formed in the insulator 571, the insulator 544, the insulator 580, the insulator 574, the insulator 576, and the insulator 581 illustrated in FIG. 20A and in the insulator 582 and the insulator 586 illustrated in FIG. 19 in the region overlapping with the conductor 542b, and the conductor 540b is provided inside the opening portion. Note that the insulator 582 and the insulator 586 will be described later.

As illustrated in FIG. 20A, an insulator 541a as an insulator having an impurity barrier property may be provided between the conductor 540a and the side surface of the opening portion in the region overlapping with the conductor 542a. Similarly, an insulator 541b as an insulator having an impurity barrier property may be provided between the conductor 540b and the side surface of the opening portion in the region overlapping with the conductor 542b. Note that in this specification and the like, the insulator 541a and the insulator 541b are collectively referred to as an insulator 541.

For the conductor 540a and the conductor 540b, a conductive material containing tungsten, copper, or aluminum as its main component is preferably used. The conductor 540a and the conductor 540b may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540a and the conductor 540b.

For the insulator 541a and the insulator 541b, a barrier insulating film that can be used for the insulator 544 or the like may be used. For the insulator 541a and the insulator 541b, for example, an insulator such as silicon nitride, aluminum oxide, or silicon nitride oxide may be used. Since the insulator 541a and the insulator 541b are provided in contact with the insulator 574, the insulator 576, and the insulator 571, impurities such as water and hydrogen contained in the insulator 580 or the like can be inhibited from entering the oxide 530 through the conductor 540a and the conductor 540b. In particular, silicon nitride is suitable because of its high blocking property against hydrogen. Furthermore, oxygen contained in the insulator 580 can be prevented from being absorbed by the conductor 540a and the conductor 540b.

When the insulator 541a and the insulator 541b each have a stacked-layer structure as illustrated in FIG. 20A, a first insulator in contact with an inner wall of the opening in the insulator 580 and the like and a second insulator inside the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 540 can be inhibited, and hydrogen can be inhibited from entering the conductor 540.

Although the first insulator of the insulator 541 and the second conductor of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 19, a conductor 610, a conductor 612, and the like serving as wirings may be provided in contact with the upper portion of the conductor 540a and the upper portion of the conductor 540b. For the conductor 610 and the conductor 612, a conductive material containing tungsten, copper, or aluminum as its main component is preferably used. The conductors can each have a stacked-layer structure. Specifically, the conductors may each be a stack of titanium or titanium nitride and any of the above conductive materials, for example. Note that the conductors may each be formed to be embedded in an opening provided in an insulator.

The structure of the transistor included in the semiconductor device of one embodiment of the present invention is not limited to that of the transistor 500 illustrated in FIG. 19, FIG. 20A, FIG. 20B, and FIG. 21. The structure of the transistor included in the semiconductor device of one embodiment of the present invention may be changed in accordance with circumstances.

Figure 23:
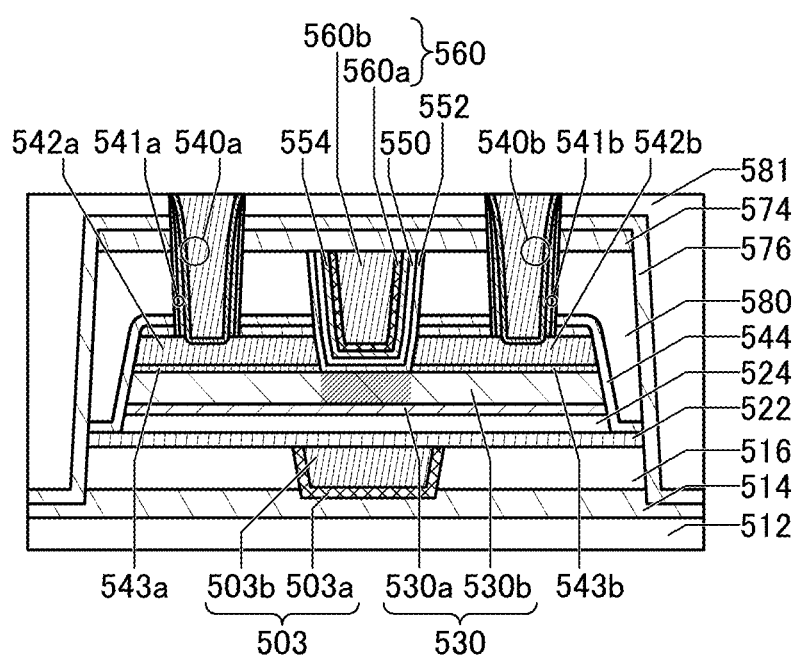
FIG. 23 is a schematic cross-sectional view illustrating a structure example of a transistor.

For example, the transistor 500 illustrated in FIG. 19, FIG. 20A, FIG. 20B, and FIG. 21 may have a structure illustrated in FIG. 23. The transistor in FIG. 23 is different from the transistor 500 illustrated in FIG. 19, FIG. 20A, FIG. 20B, and FIG. 21 in including an oxide 543*a* and an oxide 543*b*. Note that in this specification and the like, the oxide 543*a* and the oxide 543*b* are collectively referred to as an oxide 543. The cross section in the channel width direction of the transistor in FIG. 23 can have a structure similar to the cross section of the transistor 500 illustrated in FIG. 20B.

The oxide 543*a* is provided between the oxide 530*b* and the conductor 542*a*, and the oxide 543*b* is provided between the oxide 530*b* and the conductor 542*b*. Here, the oxide 543*a* is preferably in contact with the top surface of the oxide 530*b* and the bottom surface of the conductor 542*a*. The oxide 543*b* is preferably in contact with the top surface of the oxide 530*b* and the bottom surface of the conductor 542*b*.

The oxide 543 preferably has a function of inhibiting passage of oxygen. The oxide 543 having a function of inhibiting passage of oxygen is preferably provided between the oxide 530*b* and the conductor 542 functioning as the source electrode or the drain electrode, in which case the electric resistance between the conductor 542 and the oxide 530*b* can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530*b*. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530*b*. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against oxygen and hydrogen is preferably used for the insulator 582. Thus, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 19 and FIG. 21 will be described. Note that the capacitor 600 and the wiring and/or the plug are provided above the transistor 500 illustrated in FIG. 19 and FIG. 21.

The capacitor 600 includes the conductor 610, a conductor 620, and an insulator 630, for example.

The conductor 610 is provided over one of the conductor 540*a* and the conductor 540*b*, a conductor 546, and the insulator 586. The conductor 610 has a function of one of a pair of electrodes of the capacitor 600.

The conductor 612 is provided over the other of the conductor 540*a* and the conductor 540*b* and the insulator 586. The conductor 612 has a function of a plug, a wiring, a terminal, or the like that electrically connects the transistor 500 to a circuit element, a wiring, and the like provided above the transistor 500.

Note that the conductor 612 and the conductor 610 may be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 19; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

For another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high-permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As scaling down and high integration of semiconductor devices progress, a problem such as leakage current from a transistor, a capacitor, and the like might arise because of a thinner gate insulator and a thinner dielectric used in the capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

In particular, by using a material that can have ferroelectricity for the insulator 630, for example, the capacitor 600 can be used as a ferroelectric capacitor.

The conductor 620 is provided to overlap with the conductor 610 with the insulator 630 therebetween. The conductor 610 has a function of one of the pair of electrodes of the capacitor 600.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. For example, the conductor 620 can be formed using a material that can be used for the conductor 610. The conductor 620 may have a stacked-layer structure of two or more layers instead of a single-layer structure.

An insulator 640 is provided over the conductor 620 and the insulator 630. The insulator 640 is preferably formed using a film having a barrier property that prevents hydrogen, impurities, or the like from diffusing into the region where the transistor 500 is provided, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials that can be used for the insulator 324, for example.

Although the capacitor 600 illustrated in FIG. 19 and FIG. 21 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 19, an insulator 411, an insulator 412, an insulator 413, and an insulator 414 are provided in this order above the insulator 650. In addition, a conductor 416 serving as a plug or a wiring is provided in the insulator 411, the insulator 412, and the insulator 413. The conductor 416 can be provided, for example, in a region overlapping with a conductor 660 to be described later.

In addition, in the insulator 630, the insulator 640, and the insulator 650, an opening portion is provided in a region overlapping with the conductor 612, and the conductor 660 is provided to fill the opening portion. The conductor 660 serves as a plug or a wiring that is electrically connected to the conductor 416 included in the above-described wiring layer.

Like the insulator 324 or the like, the insulator 411 and the insulator 414 are each preferably formed using an insulator having a barrier property against impurities such as water and hydrogen, for example. Thus, the insulator 411 and the insulator 414 can be formed using any of the materials that can be used for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330, for example.

Structure Example 2 of Semiconductor Device

Next, a structure example of the above-described semiconductor device including an FTJ element will be described.

Figure 24:
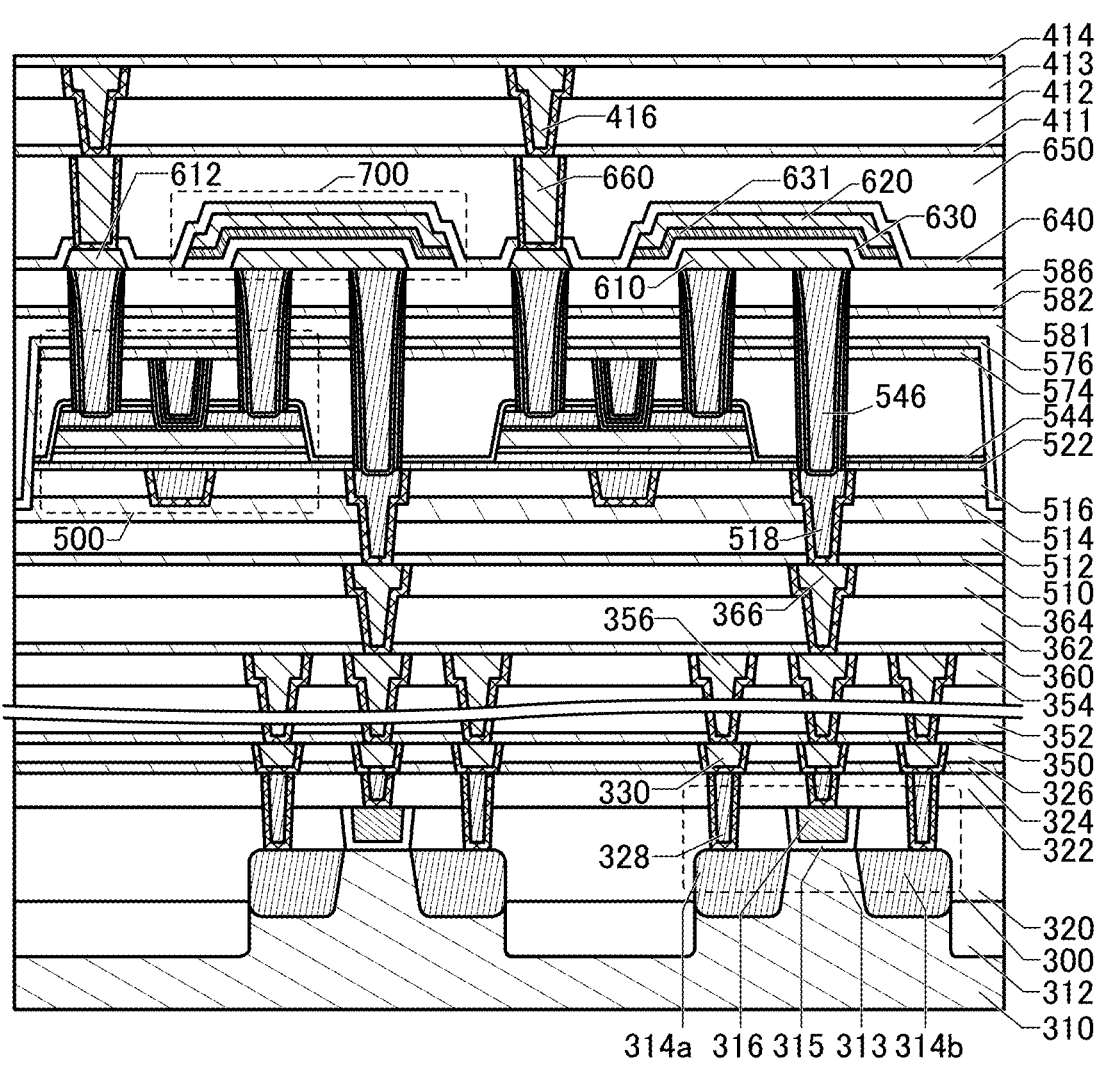
FIG. 24 is a schematic cross-sectional view illustrating a structure example of a semiconductor device.

FIG. 24 illustrates an example in which the capacitor 600 positioned on the top surfaces of the insulator 582 and the conductor 546 in the semiconductor device illustrated in FIG. 19 is changed into an FTJ element 700.

Specifically, the FTJ element 700 includes the conductor 610 functioning as a lower electrode, the conductor 620 functioning as an upper electrode, the insulator 630, and an insulator 631, for example. In particular, a material that can have ferroelectricity can be used for the insulator 631.

Examples of the material that can have ferroelectricity include hafnium oxide, zirconium oxide, zirconium hafnium oxide, a material in which an element J1 (the element J1 here is zirconium (Zr), silicon (Si), aluminum (Al), gadolinium (Gd), yttrium (Y), lanthanum (La), strontium (Sr), or the like) is added to hafnium oxide, and a material in which an element J2 (the element J2 here is hafnium (Hf), silicon (Si), aluminum (Al), gadolinium (Gd), yttrium (Y), lanthanum (La), strontium (Sr), or the like) is added to zirconium oxide. Alternatively, as the material that can have ferroelectricity, a piezoelectric ceramic having a perovskite structure, such as $PbTiO_x$, barium strontium titanate (BST), strontium titanate, lead zirconate titanate (PZT), strontium bismuth tantalate (SBT), bismuth ferrite (BFO), or barium titanate, may be used. Alternatively, the material that can have ferroelectricity can be a mixture or a compound containing a material selected from the above-listed materials, for example. Alternatively, the material that can have ferroelectricity can have a stacked-layer structure of a plurality of materials selected from the above-listed materials. Since hafnium oxide, zirconium oxide, zirconium hafnium oxide, the material in which the element J1 is added to hafnium oxide, or the like may change its crystal structure (characteristics) according to a variety of processes and the like as well as deposition conditions, the above-described material is referred to not only as a ferroelectric but also as a material that can have ferroelectricity in this specification and the like.

A material containing hafnium oxide or a material containing hafnium oxide and zirconium oxide is especially preferable as the material that can have ferroelectricity because of being able to have ferroelectricity even when processed into a several-nanometer-thick thin film. Here, the thickness of the insulator 631 can be less than or equal to 100 nm, preferably less than or equal to 50 nm, further preferably less than or equal to 20 nm, still further preferably less than or equal to 10 nm. The use of a thinned ferroelectric layer enables a ferroelectric capacitor to form a semiconductor device in combination with the scaled-down transistor 500.

In FIG. 24, the conductor 610 and the conductor 612 can be formed using materials similar to those for the conductor 610 and the conductor 612 in FIG. 19. In FIG. 24, the conductor 610 and the conductor 612 can be formed by methods similar to those for the conductor 610 and the conductor 612 in FIG. 19.

In FIG. 24, the insulator 630 is provided on a top surface of the conductor 610 and a top surface of part of a region of the insulator 586. The insulator 631 is provided on a top surface of the insulator 630, and the conductor 620 is provided on a top surface of the insulator 631.

The insulator 630 functions as a tunnel insulating film in the FTJ element 700. For the insulator 630, silicon oxide, silicon nitride, or a stack of silicon oxide and silicon nitride can be used, for example.

In FIG. 24, the insulator 640 is provided on top surfaces of a region of the insulator 630 including an end portion, a region of the insulator 631 including an end portion, the conductor 620, and part of a region of the insulator 586.

For the insulator 640, any of the materials usable for the insulator 640 in FIG. 19 can be used, for example.

By employing the structure of the FTJ element 700 as illustrated in FIG. 24, the FTJ element can be provided in the semiconductor device illustrated in FIG. 19.

The FTJ element 700 illustrated in FIG. 24 can be, for example, the FTJ element FJAb described in the above embodiments. Note that the FTJ element 700 can be the FTJ element FJA by changing the stacking order of the insulator 630 functioning as a tunnel insulating film and the insulator 631 containing a material that can have ferroelectricity.

Figure 25:
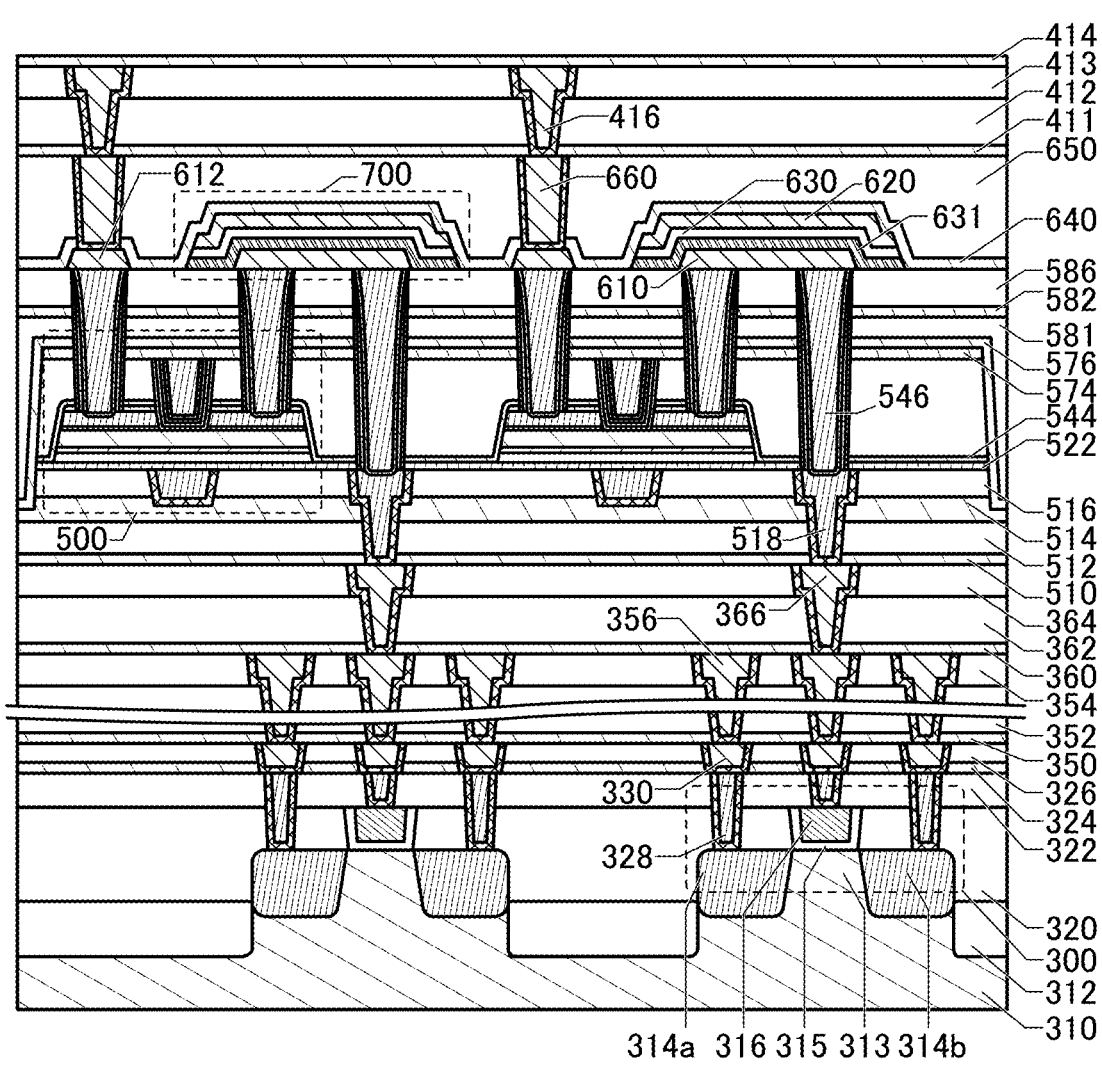
FIG. 25 is a schematic cross-sectional view illustrating a structure example of a transistor.

As an example, FIG. 25 illustrates a structure in which the stacking order of the insulator 630 functioning as a tunnel insulating film and the insulator 631 containing a material that can have ferroelectricity, which are illustrated in FIG. 23, is reversed. The FTJ element 700 illustrated in FIG. 25 can be, for example, the FTJ element FJA described in the above embodiments.

Next, a structure example of a semiconductor device including an FTJ element different from that in FIG. 24 will be described.

Figure 26:
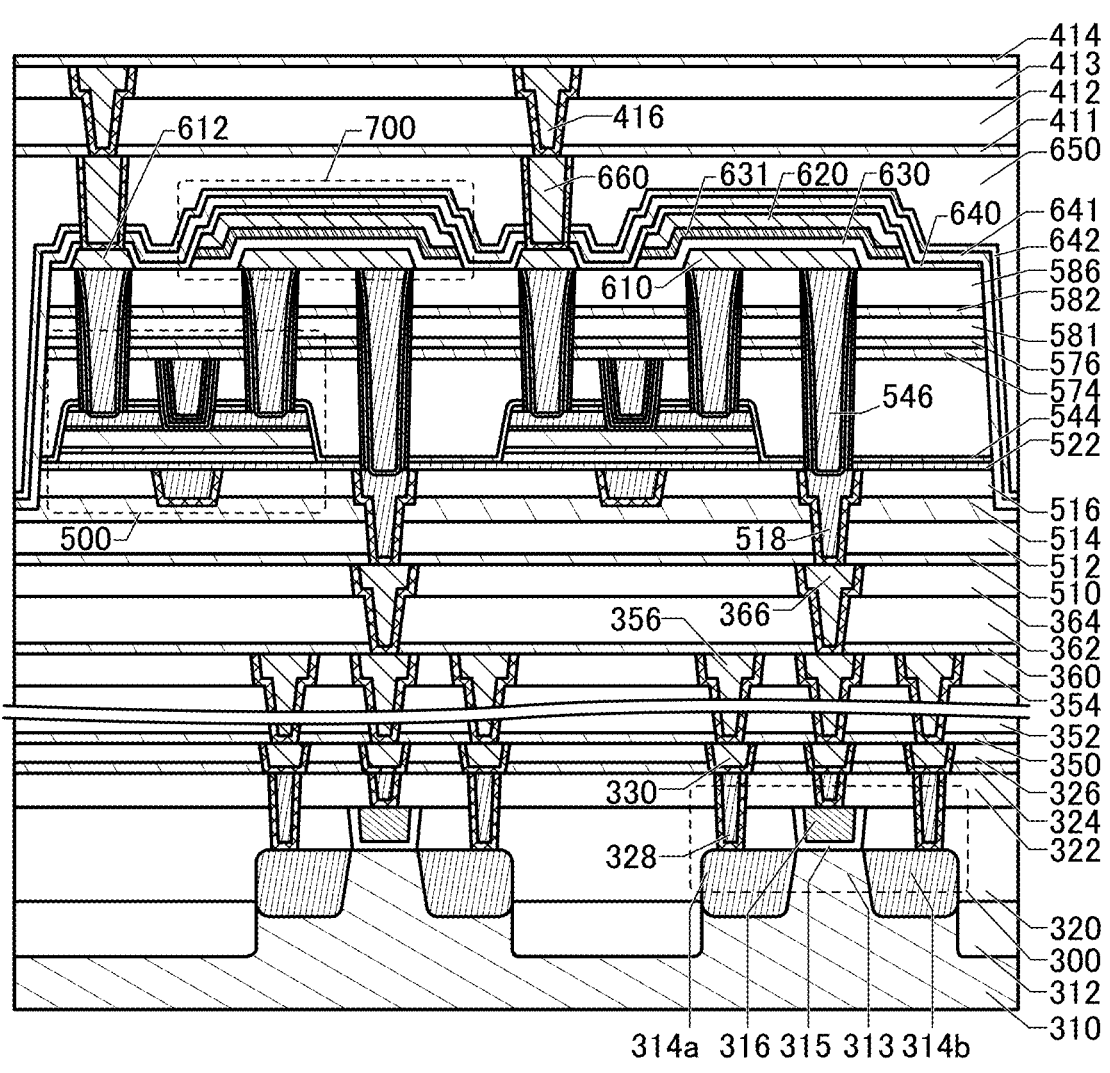
FIG. 26 is a schematic cross-sectional view illustrating a structure example of a semiconductor device.

A semiconductor device illustrated in FIG. 26 is a variation example of the semiconductor device in FIG. 24 and has a structure in which the transistor 500 and the FTJ element 700 are surrounded by the insulator 571, the insulator 544, the insulator 574, the insulator 576, the insulator 581, an insulator 641, an insulator 642, and the like.

In the semiconductor devices in FIG. 19 and FIG. 24, an opening portion reaching the insulator 514 is formed after the components from the substrate 310 to the insulator 574 are sequentially provided; whereas in the semiconductor device in FIG. 26, an opening portion reaching the insulator 514 is formed after the components from the substrate 310 to the insulator 640 are sequentially provided.

In the semiconductor device in FIG. 26, the insulator 641, the insulator 642, and the insulator 650 are provided in this order on a bottom portion of the opening portion and a top surface of the insulator 640.

The insulator 641 and the insulator 642 preferably function as barrier insulating films that inhibit diffusion of impurities such as water and hydrogen into the transistor 500 and the capacitor 600 from above the transistor 500 and the capacitor 600, for example.

As a method for depositing the insulator 641, for example, a sputtering method can be used. For example, silicon nitride deposited by a sputtering method can be used as the insulator 641. Since a sputtering method does not need to use a molecule containing hydrogen as a deposition gas, the hydrogen concentration in the insulator 641 can be reduced. The hydrogen concentration in the insulator 641, which is in contact with the conductor 610, the conductor 612, and the insulator 586, is reduced in the above manner; hence, diffusion of hydrogen into the conductor 610, the conductor 612, and the insulator 586 from the insulator 641 can be suppressed.

The insulator 642 is preferably deposited by, for example, an ALD method, particularly a PEALD method. For example, silicon nitride deposited by a PEALD method can be used as the insulator 642. Accordingly, the insulator 642 can be formed with good coverage; thus, even when a pinhole, disconnection, or the like is caused in the insulator 641 because of unevenness of a base, covering such a defect with the insulator 642 can inhibit diffusion of hydrogen into the conductor 610, the conductor 612, and the insulator 586.

Employing the structure illustrated in FIG. 26 can prevent impurities such as water and hydrogen from diffusing to the transistor 500 side and the FTJ element 700 side through the insulator 512, the insulator 514, the insulator 641, the insulator 642, and the like. Moreover, oxygen contained in the insulator 580 and the like can be prevented from diffusing to the outside through the insulator 574, the insulator 641, the insulator 642, and the like.

When a semiconductor device using a transistor including an oxide semiconductor has the structure described in this embodiment, a change in electrical characteristics of the transistor can be inhibited and the reliability can be improved.

Furthermore, in the semiconductor device using the transistor including the oxide semiconductor, employing a stacked-layer structure and achieving scaling down and higher integration, for example, can reduce the area of circuits constituting the semiconductor device. In particular, the use of a ferroelectric capacitor as the capacitor included in the semiconductor device can increase an electrostatic capacitance value of the capacitor; thus, the capacitor can be scaled down. This can reduce the area of the circuit including the capacitor. In addition, as described in this embodiment, stacking the transistor and the capacitor makes it possible to increase the circuit scale while the increase in the circuit area in the semiconductor device is suppressed.

Note that this embodiment can be combined with any of the other embodiments described in this specification as appropriate.

Embodiment 6

Described in this embodiment is a metal oxide (hereinafter, also referred to as an oxide semiconductor) that can be used in the OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of the crystal structures of an oxide semiconductor will be described with reference to FIG. 27A. FIG. 27A is a diagram showing the classification of crystal structures of an oxide semiconductor, typically IGZO (a metal oxide containing In, Ga, and Zn).

As shown in FIG. 27A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite) (excluding single crystal and poly crystal). Note that the term "Crystalline" excludes single crystal, poly crystal, and completely amorphous. The term "Crystal" includes single crystal and poly crystal.

Note that the structures in the thick frame in FIG. 27A are in an intermediate state between "Amorphous" and "Crystal", and belong to a new crystalline phase. That is, these structures are completely different from "Amorphous", which is energetically unstable, and "Crystal".

Note that a crystal structure of a film or a substrate can be evaluated with an X-ray diffraction (XRD) spectrum. FIG. 27B shows an XRD spectrum, which is obtained by GIXD (Grazing-Incidence XRD) measurement, of a CAAC-IGZO film classified into "Crystalline" (the vertical axis represents intensity in arbitrary unit (a.u.)). Note that a GIXD method is also referred to as a thin film method or a Seemann-Bohlin method. The XRD spectrum that is shown in FIG. 27B and obtained by GIXD measurement may be hereinafter simply referred to as an XRD spectrum. The CAAC-IGZO film in FIG. 27B has a composition in the neighborhood of In:Ga: Zn=4:2:3 [atomic ratio]. The CAAC-IGZO film in FIG. 27B has a thickness of 500 nm.

As shown in FIG. 27B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 27B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 27C shows a diffraction pattern of the CAAC-IGZO film. FIG. 27C shows a diffraction pattern obtained by the NBED method in which an electron beam is incident in the direction parallel to the substrate. The composition of the CAAC-IGZO film in FIG. 27C is In:Ga:Zn=4:2:3 [atomic ratio] or the neighborhood thereof. In the nanobeam electron diffraction method, electron diffraction is performed with a probe diameter of 1 nm.

As shown in FIG. 27C, a plurality of spots indicating c-axis alignment are observed in the diffraction pattern of the CAAC-IGZO film.

<<Structure of Oxide Semiconductor>>

Oxide semiconductors might be classified in a manner different from one shown in FIG. 27A when classified in terms of the crystal structure. Oxide semiconductors are classified into a single crystal oxide semiconductor and a non-single-crystal oxide semiconductor, for example.

Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, and the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS and an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., 1 nm or larger and 30 nm or smaller).

[a-like OS]

The a-like OS is an oxide semiconductor having a structure between those of the nc-OS and the amorphous oxide semiconductor. The a-like OS contains a void or a low-density region. That is, the a-like OS has low crystallinity as compared with the nc-OS and the CAAC-OS. Moreover, the a-like OS has a higher hydrogen concentration in the film than the nc-OS and the CAAC-OS.

<<Structure of Oxide Semiconductor>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus also has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^{3}$, preferably lower than or equal to $2\times10^{17}$ atoms/cm$^{3}$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is lower than or equal to $1\times10^{18}$ atoms/cm$^{3}$, preferably lower than or equal to $2\times10^{16}$ atoms/cm$^{3}$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^{3}$, preferably lower than or equal to $5\times10^{18}$ atoms/cm$^{3}$, further preferably lower than or equal to $1\times10^{18}$ atoms/cm$^{3}$, still further preferably lower than or equal to $5\times10^{17}$ atoms/cm$^{3}$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^{3}$, preferably lower than $1\times10^{19}$ atoms/cm$^{3}$, further preferably lower than $5\times10^{18}$ atoms/cm$^{3}$, still further preferably lower than $1\times10^{18}$ atoms/cm$^{3}$.

When an oxide semiconductor with sufficiently reduced impurities is used for the channel formation region of the transistor, stable electrical characteristics can be given.

Note that this embodiment can be combined with any of the other embodiments described in this specification as appropriate.

Embodiment 7

In this embodiment, examples of a semiconductor wafer where the memory device or the like described in the above embodiment is formed and electronic components incorporating the memory device will be described.

<Semiconductor Wafer>

First, an example of a semiconductor wafer where a memory device or the like is formed is described with reference to FIG. 28A.

Figures 28A, 28B, 28C, 28D:
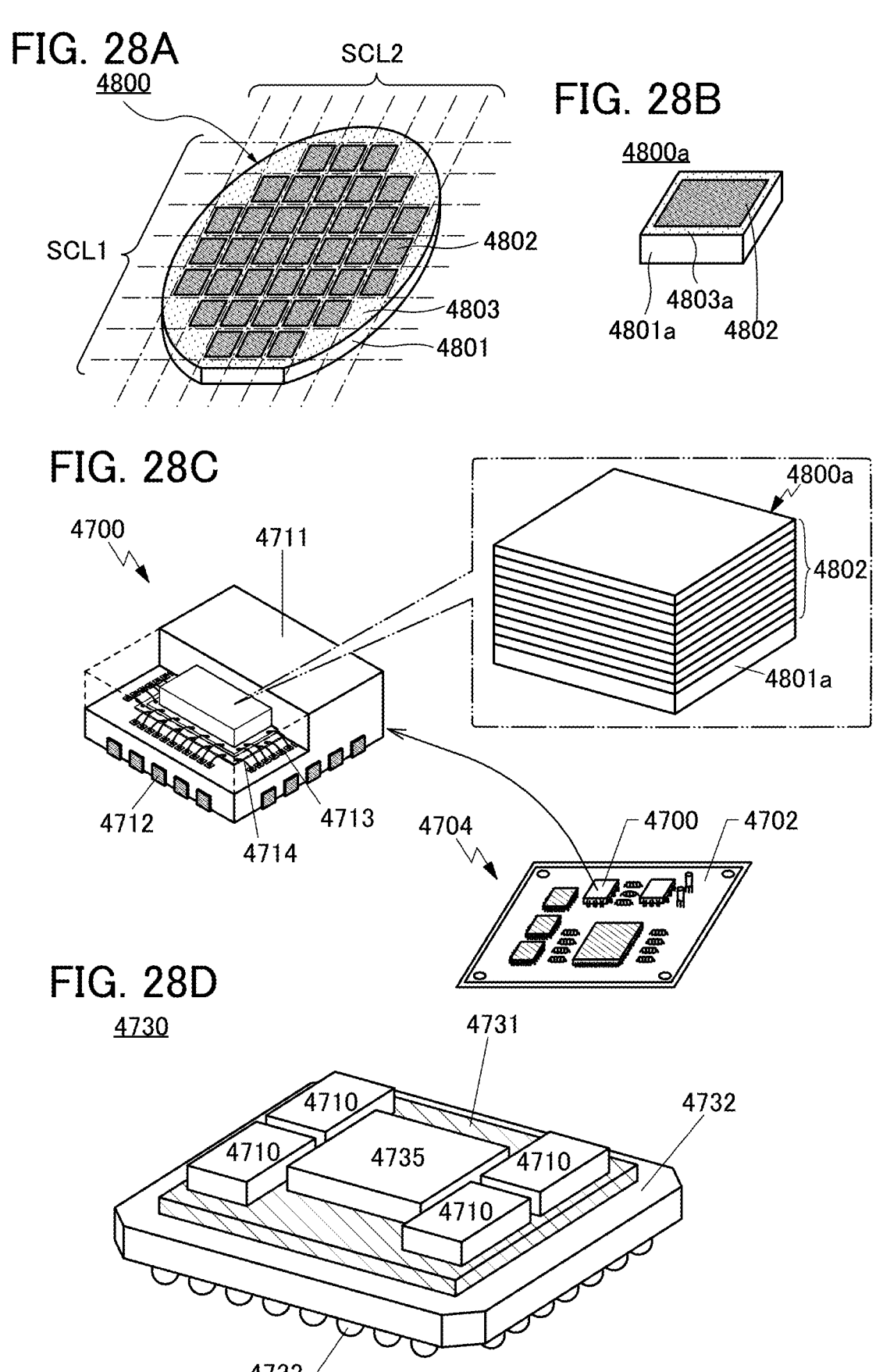
FIG. 28A is a perspective view illustrating an example of a semiconductor wafer.
FIG. 28B is a perspective view illustrating an example of a chip.
FIG. 28C and FIG. 28D are perspective views illustrating examples of electronic components.

A semiconductor wafer 4800 illustrated in FIG. 28A includes a wafer 4801 and a plurality of circuit portions 4802 provided on the top surface of the wafer 4801. A portion without the circuit portions 4802 on the top surface of the wafer 4801 is a spacing 4803 that is a region for dicing.

The semiconductor wafer 4800 can be formed by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

Next, a dicing step is performed. The dicing is performed along scribe lines SCL1 and scribe lines SCL2 (referred to as dicing lines or cutting lines in some cases) indicated by dashed-dotted lines. To perform the dicing step easily, the spacing 4803 is preferably provided such that a plurality of scribe lines SCL1 are parallel to each other, a plurality of scribe lines SCL2 are parallel to each other, and the scribe lines SCL1 and the scribe lines SCL2 intersect each other perpendicularly.

With the dicing step, a chip 4800*a* as illustrated in FIG. 28B can be cut out from the semiconductor wafer 4800. The chip 4800*a* includes a wafer 4801*a*, the circuit portion 4802, and a spacing 4803*a*. Note that it is preferable to make the spacing 4803*a* as small as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 28A. The element substrate may be a rectangular semiconductor wafer, for example. The shape of the element substrate can be changed as appropriate, depending on a fabrication process of an element and an apparatus for fabricating the element.

<Electronic Component>

FIG. 28C is a perspective view of an electronic component 4700 and a substrate (a mounting board 4704) on which the electronic component 4700 is mounted. The electronic component 4700 illustrated in FIG. 28C includes the chip 4800*a* in a mold 4711. Note that the chip 4800*a* illustrated in FIG. 28C is shown to have a structure in which the circuit portions 4802 are stacked. That is, the memory device described in the above embodiment can be used for the circuit portion 4802. To illustrate the inside of the electronic component 4700, some portions are omitted in FIG. 28C. The electronic component 4700 includes a land 4712 outside the mold 4711. The land 4712 is electrically connected to an electrode pad 4713, and the electrode pad 4713 is electrically connected to the chip 4800*a* via a wire 4714. The electronic component 4700 is mounted on a printed circuit board 4702, for example. A plurality of such electronic components are combined and electrically connected to each other on the printed circuit board 4702; thus, the mounting board 4704 is completed.

FIG. 28D is a perspective view of an electronic component 4730. The electronic component 4730 is an example of a SiP (System in package) or an MCM (Multi Chip Module). In the electronic component 4730, an interposer 4731 is provided over a package substrate 4732 (a printed circuit board), and a semiconductor device 4735 and a plurality of semiconductor devices 4710 are provided over the interposer 4731.

The electronic component 4730 includes the semiconductor devices 4710. Examples of the semiconductor device 4710 include the memory device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a layered structure. The interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". A through electrode is provided in the interposer 4731 and the through electrode is used to electrically connect the integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be fabricated at lower cost than an integrated circuit because the silicon interposer need not to be provided with an active element. Meanwhile, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, minute wirings are required to be formed densely on an interposer on which an HBM is mounted. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, the surface of a silicon interposer has high planarity, so that a poor connection between the silicon interposer and an integrated circuit provided on the silicon interposer is less likely to occur. It is particularly preferable to use a silicon interposer for a 2.5D package (2.5D mounting) in which a plurality of integrated circuits are arranged side by side on the interposer.

A heat sink (radiator plate) may be provided to overlap with the electronic component 4730. When a heat sink is provided, the heights of integrated circuits provided on the interposer 4731 are preferably the same. For example, in the electronic component 4730 described in this embodiment, the heights of the semiconductor devices 4710 and the semiconductor device 4735 are preferably the same.

An electrode 4733 may be provided on the bottom portion of the package substrate 4732 to mount the electronic component 4730 on another substrate. FIG. 28D illustrates an example in which the electrode 4733 is formed of a solder ball. Solder balls are provided in a matrix on the bottom portion of the package substrate 4732, whereby BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by any of various mounting methods other than BGA and PGA. For example, an SPGA (Staggered Pin Grid Array), an LGA (Land Grid Array), a QFP (Quad Flat Package), a QFJ (Quad Flat J-leaded package), or a QFN (Quad Flat Non-leaded package) can be employed.

Note that this embodiment can be combined with any of the other embodiments described in this specification as appropriate.

Embodiment 8

In this embodiment, a CPU that can include the memory device of the above embodiment will be described.

Figure 29:
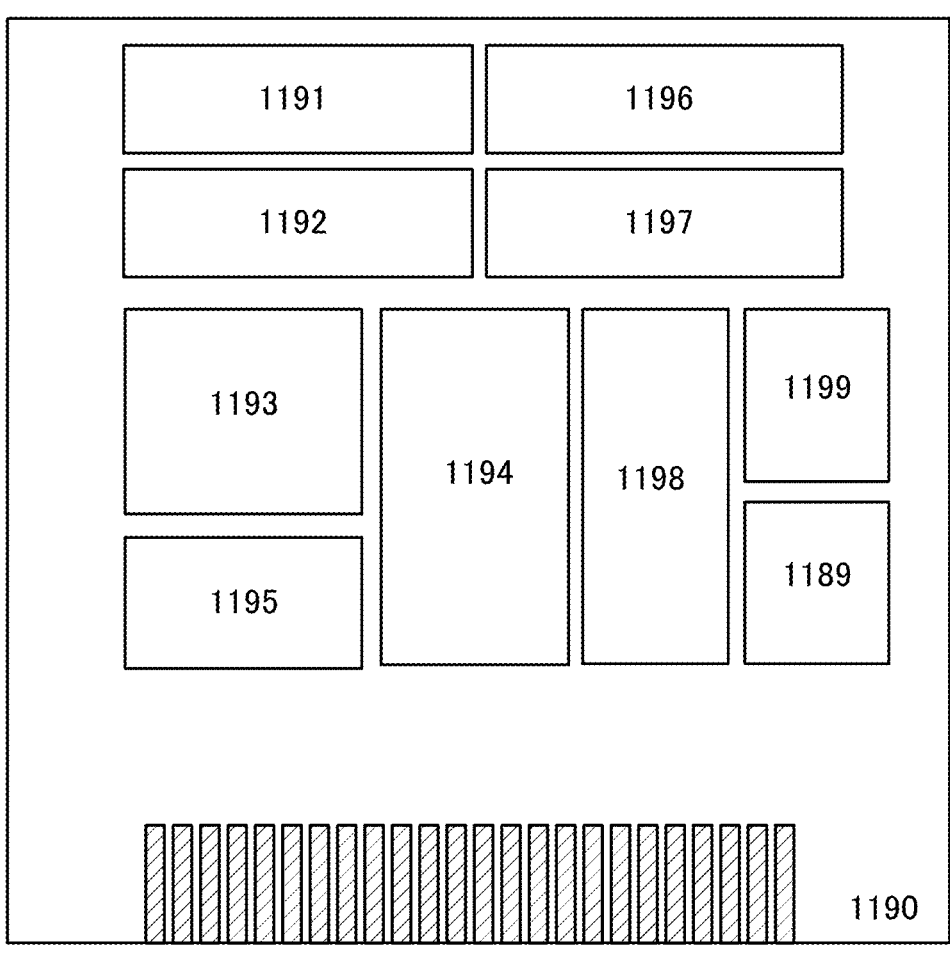
FIG. 29 is a block diagram illustrating a CPU.

FIG. 29 is a block diagram illustrating a structure example of a CPU in part of which the memory device described in the above embodiment is used.

The CPU illustrated in FIG. 29 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, a glass substrate, or the like is used as the substrate 1190. The ROM 1199 and the ROM interface 1189 may be provided over separate chips. Needless to say, the CPU illustrated in FIG. 29 is just an example of a simplified structure, and an actual CPU may have a variety of structures depending on the usage. For example, the CPU may have a structure in which a plurality of cores each including the CPU illustrated in FIG. 29 or an arithmetic circuit are included and operate in parallel, i.e., a GPU-like structure. The number of bits that the CPU can process in an internal arithmetic circuit or a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device, a peripheral circuit, or the like on the basis of its priority or a mask state, and processes the request. The register controller 1197 generates an address of the register 1196, and reads or writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above various circuits.

In the CPU illustrated in FIG. 29, a memory cell is provided in the register 1196. The register 1196 may include the memory device described in the above embodiment, for example.

In the CPU illustrated in FIG. 29, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. When data retention by the flip-flop is selected, power supply voltage is supplied to the memory cell in the register 1196. When data retention by the capacitor is selected, the data is rewritten into the capacitor, and supply of power supply voltage to the memory cell in the register 1196 can be stopped.

Note that this embodiment can be combined with any of the other embodiments described in this specification as appropriate.

Embodiment 9

In this embodiment, examples of electronic devices each including the memory device described in the above embodiment will be described. FIG. 30A to FIG. 30I illustrate electronic devices each of which includes the electronic component 4700 including the memory device.

[Mobile Phone]

Figures 30A, 30B, 30C, 30D, 30E, 30F, 30G, 30H, 30I:
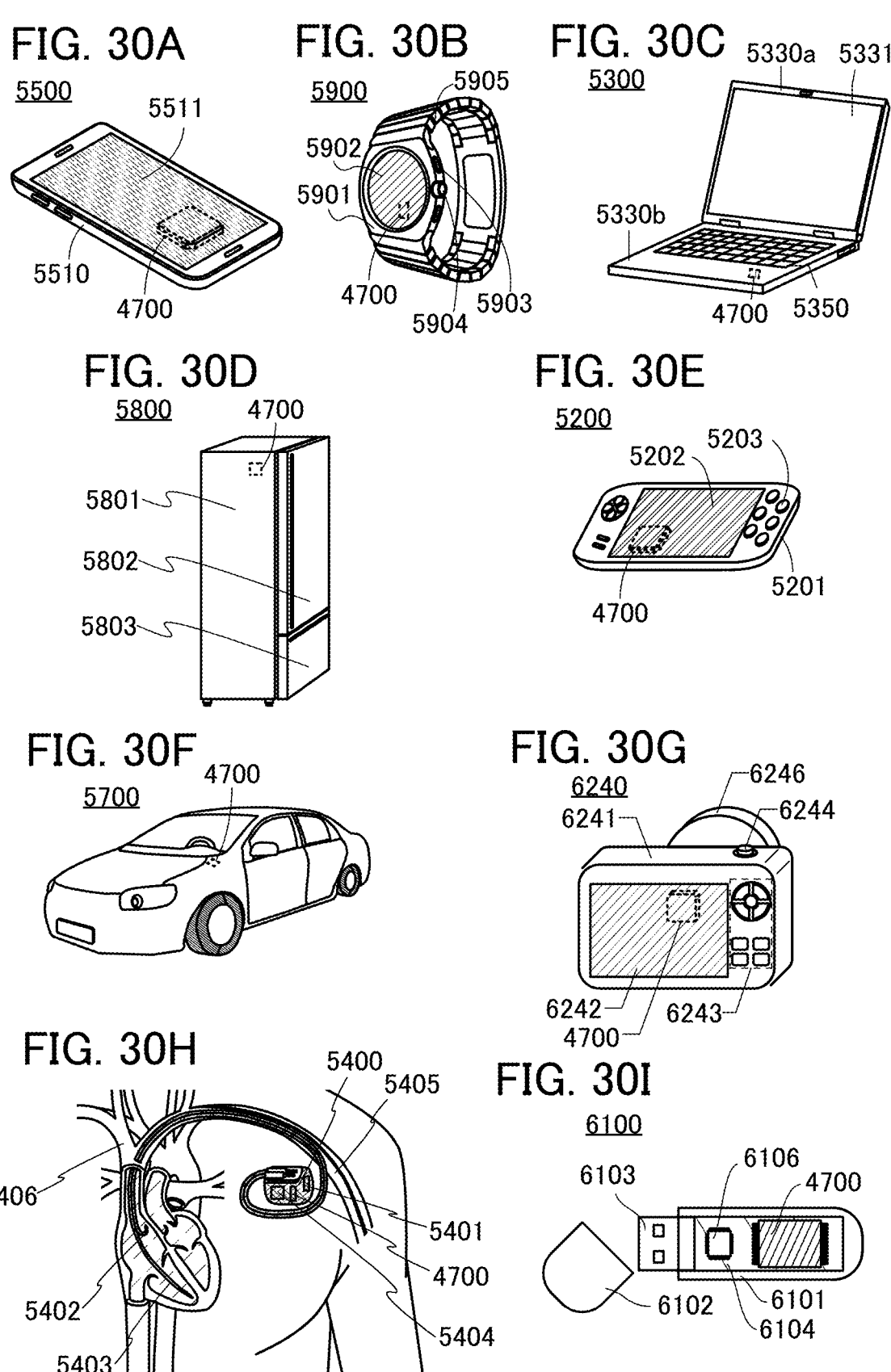
FIG. 30A to FIG. 30I are perspective views and schematic views illustrating examples of products.

An information terminal 5500 illustrated in FIG. 30A is a mobile phone (a smartphone), which is a type of information terminal. The information terminal 5500 includes a housing 5510 and a display portion 5511. As input interfaces, a touch panel and a button are provided in the display portion 5511 and the housing 5510, respectively.

By using the memory device described in the above embodiment, the information terminal 5500 can retain a temporary file generated at the time of executing an application (e.g., a web browser's cache).

[Wearable Terminal]

FIG. 30B illustrates an information terminal 5900 as an example of a wearable terminal. The information terminal 5900 includes a housing 5901, a display portion 5902, an operation button 5903, a crown 5904, a band 5905, and the like.

Like the information terminal 5500 described above, the wearable terminal can retain a temporary file generated at the time of executing an application by using the memory device described in the above embodiment.

[Information Terminal]

FIG. 30C illustrates a notebook information terminal 5300. The notebook information terminal 5300 illustrated in FIG. 30C includes, for example, a display portion 5331 in a housing 5330*a* and a keyboard portion 5350 in a housing 5330*b*.

Like the information terminal 5500 described above, the notebook information terminal 5300 can retain a temporary file generated at the time of executing an application by using the memory device described in the above embodiment.

Note that although FIG. 30A to FIG. 30C illustrate a smartphone, a wearable terminal, and a notebook information terminal as examples of the electronic device, one embodiment of the present invention can also be applied to information terminals other than a smartphone, a wearable terminal, and a notebook information terminal. Examples of information terminals other than a smartphone, a wearable terminal, and a notebook information terminal include a PDA (Personal Digital Assistant), a desktop information terminal, and a workstation.

[Household Appliance]

FIG. 30D illustrates an electric refrigerator-freezer 5800 as an example of a household appliance. The electric refrigerator-freezer 5800 includes a housing 5801, a refrigerator door 5802, a freezer door 5803, and the like.

When the memory device described in the above embodiment is used in the electric refrigerator-freezer 5800, the electric refrigerator-freezer 5800 can be used for IoT (Internet of Things), for example. When used for IoT, the electric refrigerator-freezer 5800 can send and receive information on food stored in the electric refrigerator-freezer 5800 and food expiration dates, for example, to/from the above-described information terminal and the like via the Internet. When sending the information, the electric refrigerator-freezer 5800 can retain the information as a temporary file in the memory device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machine]

FIG. 30E illustrates a portable game machine 5200 as an example of a game machine. The portable game machine 5200 includes a housing 5201, a display portion 5202, a button 5203, and the like.

Videos displayed on the portable game machine 5200 can be output with a display device such as a television device, a personal computer display, a game display, and a head-mounted display.

When the memory device described in the above embodiment is used in the portable game machine 5200, the portable game machine 5200 with low power consumption can be achieved. Furthermore, heat generation from a circuit can be reduced owing to low power consumption; thus, the influence of heat generation on the circuit itself, a peripheral circuit, and a module can be reduced.

Moreover, with the use of the memory device described in the above embodiment, the portable game machine 5200 can retain a temporary file or the like necessary for an arithmetic operation that occurs during game play.

Although FIG. 30E illustrates the portable game machine as an example of a game machine, the electronic device of one embodiment of the present invention is not limited thereto. Examples of the electronic device of one embodiment of the present invention include a stationary game machine, an arcade game machine installed in entertainment facilities (e.g., a game center and an amusement park), and a throwing machine for batting practice installed in sports facilities.

[Moving Vehicle]

The memory device described in the above embodiment can be used for an automobile, which is a moving vehicle, and around the driver's seat in an automobile.

FIG. 30F illustrates an automobile 5700 as an example of a moving vehicle.

An instrument panel that provides various kinds of information by displaying a speedometer, a tachometer, a mileage, a fuel meter, a gearshift indicator, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety.

The memory device described in the above embodiment can temporarily retain information; thus, the memory device can be used to retain temporary information necessary in an automatic driving system for the automobile 5700 and a system for navigation and risk prediction, for example. The display device may be configured to display temporary information regarding navigation, risk prediction, or the like. Moreover, the memory device may be configured to retain a video of a driving recorder provided in the automobile 5700.

Although an automobile is described above as an example of the moving vehicle, the moving vehicle is not limited to an automobile. Examples of moving vehicles include a train, a monorail train, a ship, and a flying object (a helicopter, an unmanned aircraft (a drone), an airplane, and a rocket).

[Camera]

The memory device described in the above embodiment can be employed for a camera.

FIG. 30G illustrates a digital camera 6240 as an example of an imaging device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 can be additionally equipped with a stroboscope, a viewfinder, or the like.

When the memory device described in the above embodiment is employed for the digital camera 6240, the digital camera 6240 with low power consumption can be achieved. Furthermore, heat generation from a circuit can be reduced owing to low power consumption; thus, the influence of heat generation on the circuit itself, a peripheral circuit, and a module can be reduced.

[ICD]

The memory device described in the above embodiment can be employed for an implantable cardioverter-defibrillator (ICD).

FIG. 30H is a schematic cross-sectional view illustrating an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with the end of one of the wires placed in the right ventricle and the end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 4700.

The antenna 5404 can receive electric power, and the battery 5401 is charged with the electric power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The memory device described in the above embodiment can be employed for a calculator such as a PC (Personal Computer) and an expansion device for an information terminal.

FIG. 30I illustrates, as an example of the expansion device, a portable expansion device 6100 that is externally attached to a PC and includes a chip capable of storing information. When the expansion device 6100 is connected to a PC with a USB (Universal Serial Bus), for example, information can be stored in the chip. FIG. 30I illustrates the portable expansion device 6100; however, the expansion device of one embodiment of the present invention is not limited to this and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device or the like described in the above embodiment. For example, the substrate 6104 is provided with the electronic component 4700 and a controller chip 6106. The USB connector 6103 functions as an interface for connection to an external device.

Although not illustrated, the memory device described in the above embodiment can be used in, for example, a calculator such as a PC (Personal Computer), and an SD card and an SSD (Solid State Drive) that can be attached to an expansion device for an information terminal.

The semiconductor device or the memory device described in Embodiment 1 or Embodiment 2 is used for memory devices included in the above electronic devices, whereby novel electronic devices can be provided.

Note that this embodiment can be combined with any of the other embodiments described in this specification as appropriate.

Example 1

In this example, the measurement results of the current density of tunnel current of an FTJ element will be described.

The following table shows the current density of the tunnel current flowing through the FTJ element that was measured by the present applicant and the current density of tunnel current flowing through an FTJ element disclosed in a document (M. Kobayashi, et al., IEEE J-EDS, vol. 7, pp. 134-139, (2018)). The unit of the values on the left is A/cm$^2$ and the unit of the values on the right is A/μm$^2$ in the table.

TABLE 5

| | | |
|---|---|---|
| Measurement by present applicant | $1 \times 10^{-8}$ A/cm$^2$ | $1 \times 10^{-16}$ A/μm$^2$ |
| Value in document | $1 \times 10^{-5}$ A/cm$^2$ | $1 \times 10^{-13}$ A/μm$^2$ |

As shown in the above table, the current density of the tunnel current flowing through the FTJ element is low in both the measurement by the present applicant and the document.

Thus, for example, reading data on the basis of the amount of tunnel current flowing through the FTJ element FJC in the memory device 200 described in Embodiment 4 requires the memory device 200 having a circuit structure that can accommodate the current densities shown in the above table.

For example, as described in Embodiment 4, enlarging the area of the electrodes of the FTJ element FJC in the memory device 200 can increase the amount of tunnel current flowing through the FTJ element FJC. This enables data to be read on the basis of the amount of tunnel current even when a Si transistor with a high off-state current is used as the transistor M1*d*, the transistor M10, or the like, for example.

In addition, as described in Embodiment 4, for example, with the use of an OS transistor as the transistor M1*d*, the transistor M10, or the like in the memory device 200, data can be read on the basis of the amount of tunnel current when the amount of tunnel current is within the range of the amount of current flowing in the subthreshold region in the OS transistor.

Example 2

In this example, the measurement results of the current density-voltage characteristics of the fabricated FTJ element will be described.

The FTJ element has a structure in which a lower electrode, a tunnel insulating film, a material that can have ferroelectricity, and an upper electrode are deposited in this order from the bottom.

The lower electrode has a stacked-layer structure of tungsten and titanium nitride. Specifically, 30-nm-thick tungsten is formed by a sputtering method, and 10-nm-thick titanium nitride is formed over the tungsten by a CVD method.

Silicon nitride is used as the tunnel insulating film. Specifically, 0.5-nm-thick silicon nitride is formed by an ALD method.

An oxide containing hafnium and zirconium is used as the material that can have ferroelectricity. Specifically, a 10-nm-thick oxide containing hafnium and zirconium is formed by an ALD method.

The upper electrode has a stacked-layer structure of titanium nitride and tungsten. Specifically, 10-nm-thick titanium nitride is formed by a sputtering method, and 20-nm-thick tungsten is formed over the titanium nitride by a sputtering method.

Figure 31:
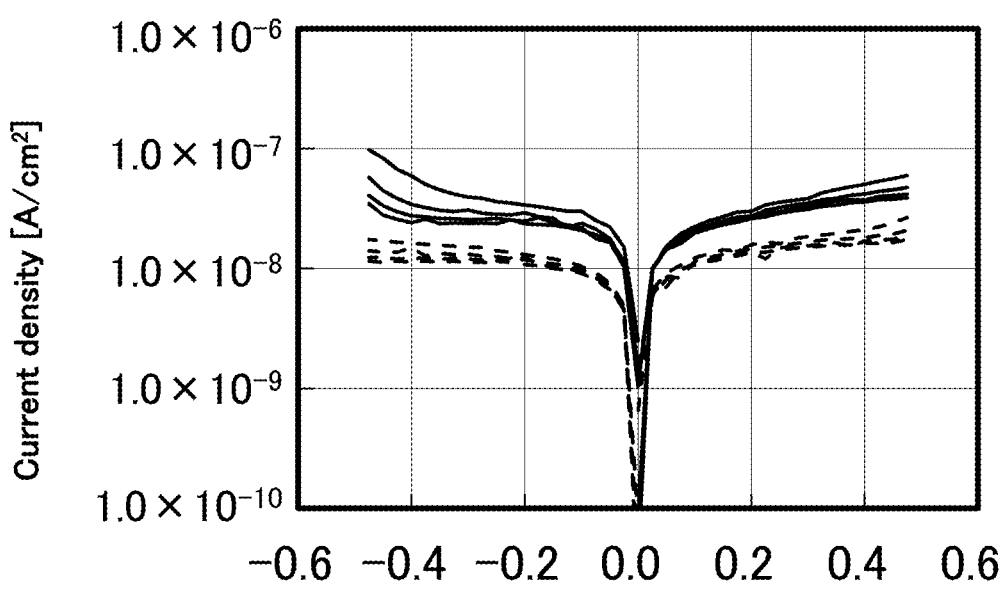
FIG. 31 is a diagram showing the current density-voltage characteristics of an FTJ element.

FIG. 31 shows the measurement results of the current density-voltage characteristics of the FTJ element described above. FIG. 31 shows the current density-voltage characteristics of the FTJ element measured when a hysteresis loop of polarization in the material that can have ferroelectricity is made 100 times. In FIG. 31, solid lines represent the conditions where polarization is caused in the negative direction in the material that can have ferroelectricity, and broken lines represent the conditions where polarization is caused in the positive direction in the material that can have ferroelectricity. In each condition, current values in the range of 0 V to –0.5 V in 0.025 V steps and current values in the range of 0 V to 0.5 V in 0.025 V steps were measured for four cycles. As shown in FIG. 31, by voltage application between the lower electrode and the upper electrode of the FTJ element, a difference is observed in the amount of current flowing between the lower electrode and the upper electrode of the FTJ element in accordance with the direction of polarization in the material that can have ferroelectricity.

REFERENCE NUMERALS

MCA: memory cell array, MC: memory cell, MC[1,1]: memory cell, MC[m,1]: memory cell, MC[1,*n*]: memory cell, MC[m,n]: memory cell, WDD: circuit, RDD: circuit, WRWD: circuit, FECD: circuit, BUF: buffer circuit, M1: transistor, M1*b*: transistor, M1*d*: transistor, M6: transistor, M6*b*: transistor, M7: transistor, M8: transistor, M9: transistor, M10: transistor, CS: capacitor, ND: node, FJA: FTJ element, FJAb: FTJ element, FJC: FTJ element, FEA: ferroelectric capacitor, FEAb: ferroelectric capacitor, ANA: circuit element, ANAb: circuit element, WRDL: wiring, WRDL[1]: wiring, WRDL[n]: wiring, WRDLb: wiring, WRDLb[1]: wiring, WRDLb[n]: wiring, WRWL: wiring, WRWL[1]: wiring, WRWL[m]: wiring, FCA: wiring, FCA [1]: wiring, FCA[m]: wiring, FCB: wiring, FCB[1]: wiring, FCB[m]: wiring, FCL: wiring, RWLA: wiring, RDL: wiring, RWL: wiring, WCL: wiring, VCE: wiring, BSL: wiring, OL: wiring, VDL: wiring, VCEr: wiring, M1r: transistor, M1br: transistor, M6r: transistor, M6br: transistor, M7b: transistor, M7r: transistor, M8b: transistor, M8r: transistor, M8m: transistor, M8mr: transistor, RDLb: wiring, RDLr: wiring, RWLAa: wiring, RWLAb: wiring, WRDLr: wiring, WRDLbr: wiring, RWDA: circuit, WWD: circuit, MP: circuit, MPr: circuit, FJAr: FTJ element, FJAbr: FTJ element, 100: memory device, 100A: memory device, 110: arithmetic circuit, 200: memory device, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 518: conductor, 522: insulator, 524: insulator, 530: oxide, 530a: oxide, 530b: oxide, 530ba: region, 530bb: region, 530bc: region, 540: conductor, 540a: conductor, 540b: conductor, 541: insulator, 541a: insulator, 541b: insulator, 542: conductor, 542a: conductor, 542b: conductor, 543: oxide, 543a: oxide, 543b: oxide, 544: insulator, 546: conductor, 550: insulator, 550a: insulator, 550b: insulator, 552: insulator, 554: insulator, 560: conductor, 560a: conductor, 560b: conductor, 571: insulator, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 631: insulator, 640: insulator, 641: insulator, 642: insulator, 650: insulator, 660: conductor, 700: FTJ element, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: notebook information terminal, 5330a: housing, 5330b: housing, 5331: display portion, 5350: keyboard portion, 5400: ICD main unit, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: crown, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens

The invention claimed is:

1. A semiconductor device comprising:
a first transistor, a second transistor, a third transistor, a fourth transistor, a fifth transistor, a sixth transistor, a seventh transistor, a first FTJ element, a second FTJ element, and a capacitor,
wherein one of a source and a drain of the first transistor is electrically connected to a first wiring,
wherein the other of the source and the drain of the first transistor is electrically connected to a gate of the fourth transistor,
wherein a gate of the first transistor is electrically connected to a gate of the second transistor,
wherein one of a source and a drain of the second transistor is electrically connected to a second wiring,
wherein the other of the source and the drain of the second transistor is electrically connected to a gate of the third transistor and a first electrode of the capacitor,
wherein one of a source and a drain of the third transistor is electrically connected to the gate of the fourth transistor,
wherein the other of the source and the drain of the third transistor is electrically connected to a third wiring,
wherein one of a source and a drain of the fourth transistor is electrically connected to the gate of the third transistor and the first electrode of the capacitor,
wherein the other of the source and the drain of the fourth transistor is electrically connected to the third wiring,
wherein one of a source and a drain of the fifth transistor is electrically connected to one of a source and a drain of the sixth transistor,
wherein the other of the source and the drain of the fifth transistor is electrically connected to a fourth wiring,
wherein a gate of the fifth transistor is electrically connected to a second electrode of the capacitor,
wherein the other of the source and the drain of the sixth transistor is electrically connected to a fifth wiring,
wherein one of a source and a drain of the seventh transistor is electrically connected to the gate of the fifth transistor and the second electrode of the capacitor,
wherein an input terminal of the first FTJ element is electrically connected to an input terminal of the second FTJ element,
wherein an output terminal of the first FTJ element is electrically connected to the gate of the fourth transistor, and
wherein an output terminal of the second FTJ element is electrically connected to the gate of the third transistor and the first electrode of the capacitor.

2. An electronic device comprising the semiconductor device according to claim 1 and a housing.

* * * * *